(12) United States Patent
Yamamoto

(10) Patent No.: US 8,633,486 B2
(45) Date of Patent: *Jan. 21, 2014

(54) TRANSISTOR STRUCTURE AND LIGHT EMITTING APPARATUS

(75) Inventor: Kazuto Yamamoto, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 129 days.

This patent is subject to a terminal disclaimer.

(21) Appl. No.: 13/179,015

(22) Filed: Jul. 8, 2011

(65) Prior Publication Data

US 2012/0007093 A1    Jan. 12, 2012

(30) Foreign Application Priority Data

Jul. 9, 2010    (JP) .................................. 2010-156331
Jul. 9, 2010    (JP) .................................. 2010-156338

(51) Int. Cl.
    *H01L 29/04*    (2006.01)
(52) U.S. Cl.
    USPC .............. 257/59; 257/E27.132; 257/E29.294; 438/158
(58) Field of Classification Search
    USPC .......... 438/158; 257/59, 66, 72, 79, E27.132, 257/E29.294
    See application file for complete search history.

(56) References Cited

U.S. PATENT DOCUMENTS

| 7,352,005 | B2 | 4/2008 | Yamasaki |
| 7,824,952 | B2 | 11/2010 | Choi et al. |
| 2004/0115857 | A1 | 6/2004 | Possin et al. |
| 2007/0120143 | A1 | 5/2007 | Huh et al. |
| 2008/0116457 | A1 | 5/2008 | Park et al. |
| 2009/0002590 | A1 | 1/2009 | Kimura |
| 2009/0039351 | A1 | 2/2009 | Kobayashi et al. |
| 2010/0019996 | A1 | 1/2010 | You et al. |
| 2010/0133541 | A1 | 6/2010 | Uchida et al. |
| 2010/0193785 | A1 | 8/2010 | Kimura |
| 2012/0061675 | A1* | 3/2012 | Yamamoto ...................... 257/59 |

FOREIGN PATENT DOCUMENTS

| JP | 09-90403 A | 4/1997 |
| JP | 2005-301286 A | 10/2005 |
| JP | 2007-256926 A | 10/2007 |
| JP | 2009-033145 A | 2/2009 |
| JP | 2009-212219 A | 9/2009 |
| JP | 2010-135384 A | 6/2010 |

OTHER PUBLICATIONS

Korean Office Action dated Sep. 27, 2012 (and English translation thereof) in counterpart Korean Application No. 10-2011-0067623.
Related U.S. Appl. No. 13/232,119, filed on Sep. 14, 2011.
Japanese Office Action dated Oct. 22, 2013 (and English translation thereof) in counterpart Japanese Application No. 2010-156331.
Japanese Office Action dated Oct. 22, 2013 (and English translation thereof) in counterpart Japanese Application No. 2010-156338.

* cited by examiner

*Primary Examiner* — David Vu
(74) *Attorney, Agent, or Firm* — Holtz, Holtz, Goodman & Chick, PC

(57) ABSTRACT

Disclosed is a transistor structure including: a first thin film transistor including, a first gate electrode; a first insulating film which covers the first gate electrode; and a first semiconductor film formed on the first insulating film in a position corresponding to the first gate electrode; and a second thin film transistor including, a second semiconductor film formed on the first insulating film; a second insulating film which covers the second semiconductor film; and a second gate electrode formed in a position corresponding to a channel portion of the second semiconductor film on the second insulating film, wherein the first semiconductor film and the second semiconductor film include a first portion on the first insulating film side and a second portion on the opposite surface side, and one of the first portion or the second portion has a higher degree of crystallization of silicon compared to the other.

22 Claims, 60 Drawing Sheets

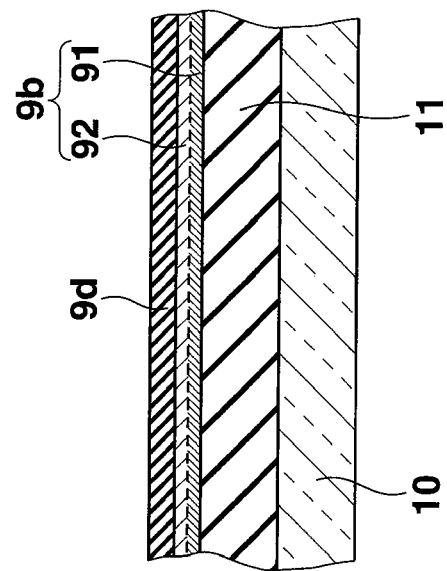
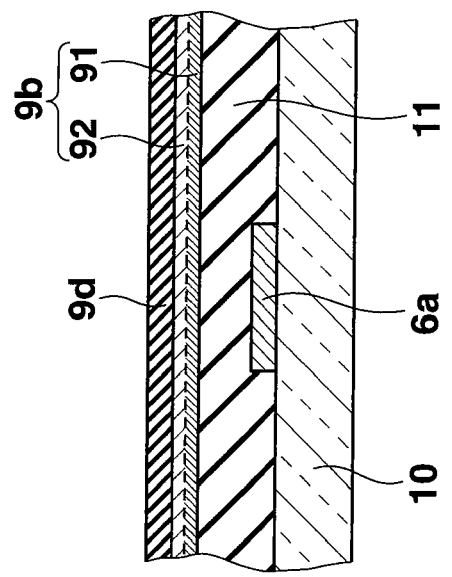
FIG.8B
FIG.8A

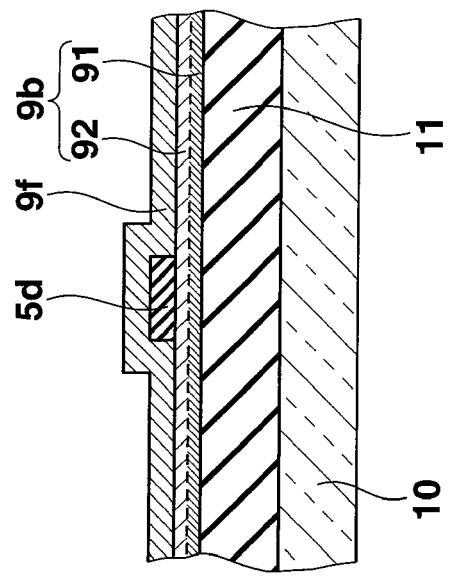
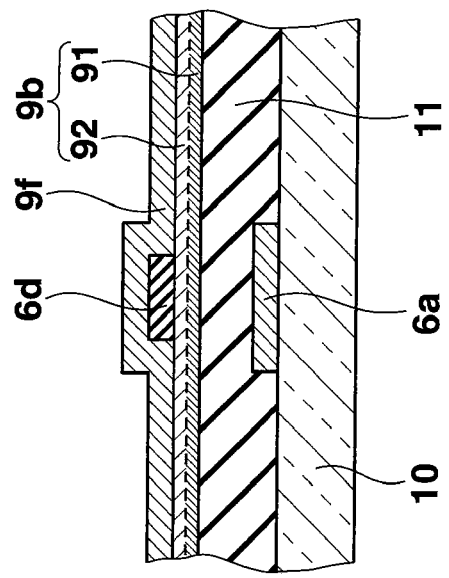
FIG. 10A
FIG. 10B

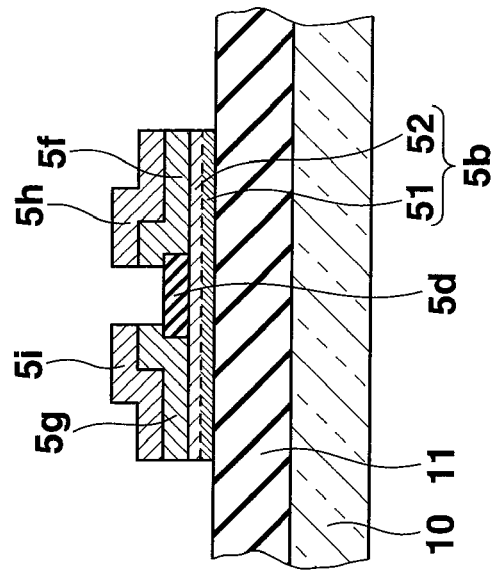
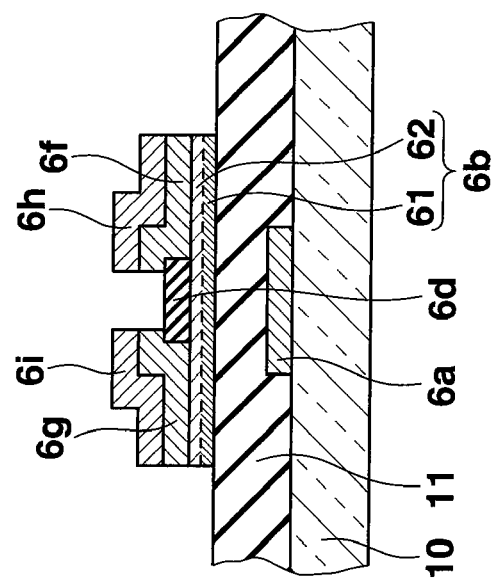
FIG.13A
FIG.13B

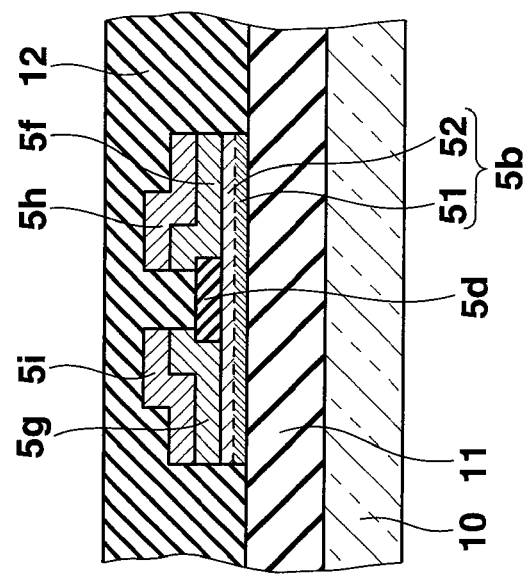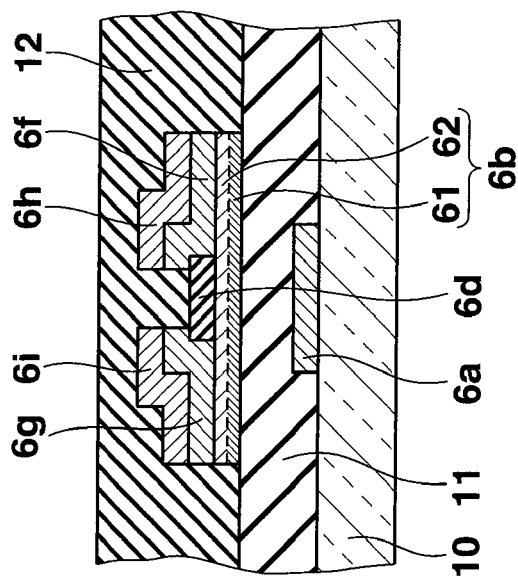
FIG.14B
FIG.14A

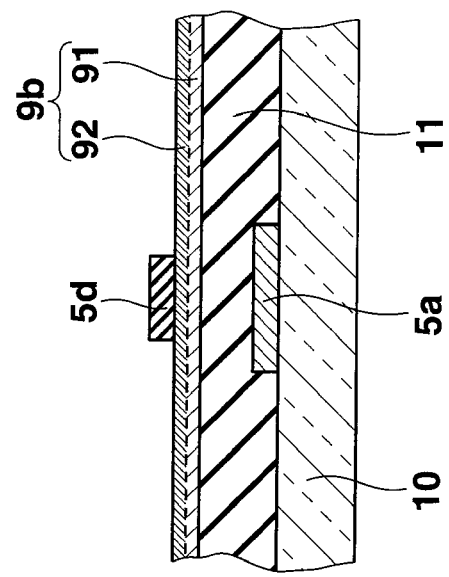
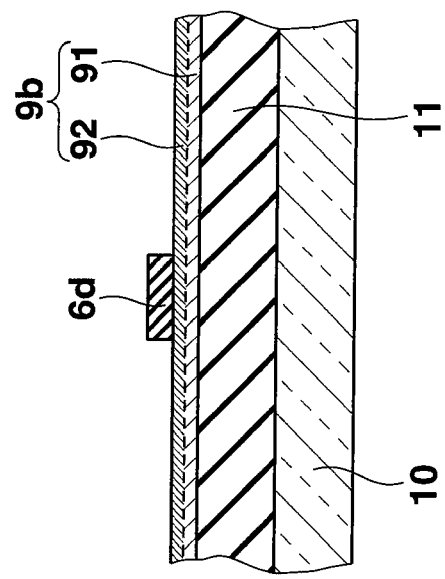
FIG.23B
FIG.23A

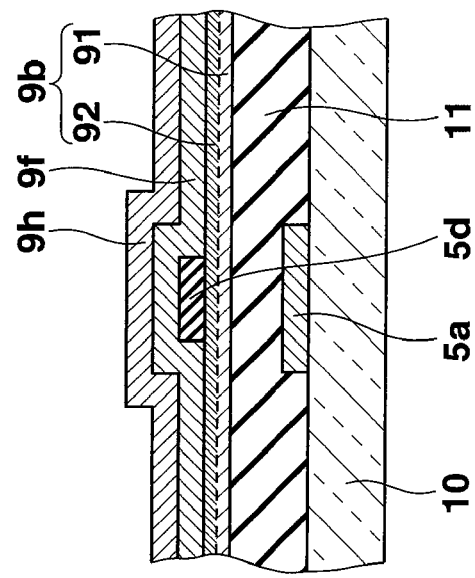
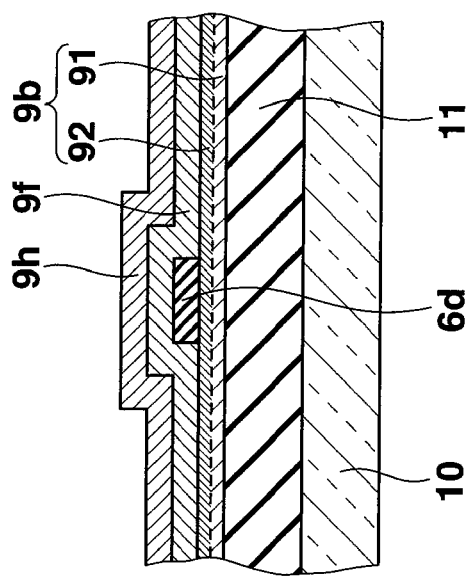

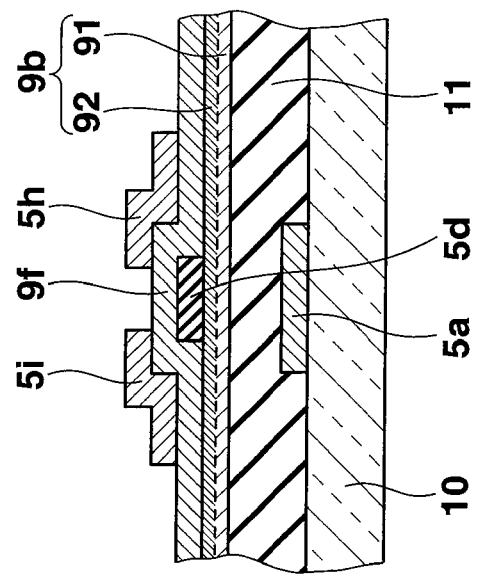
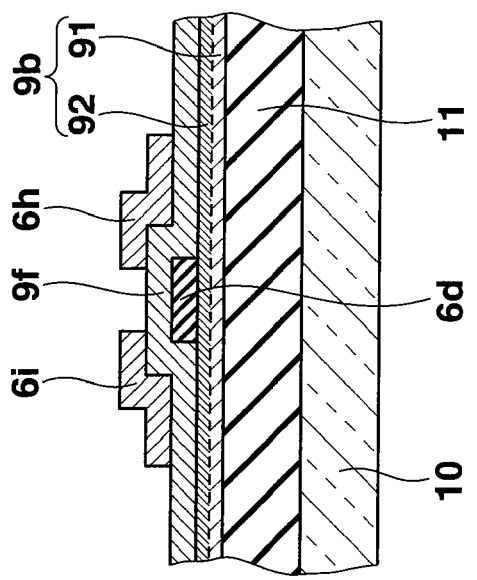

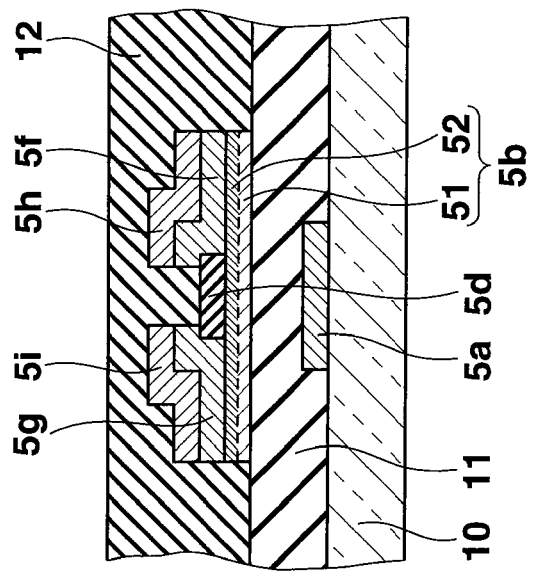
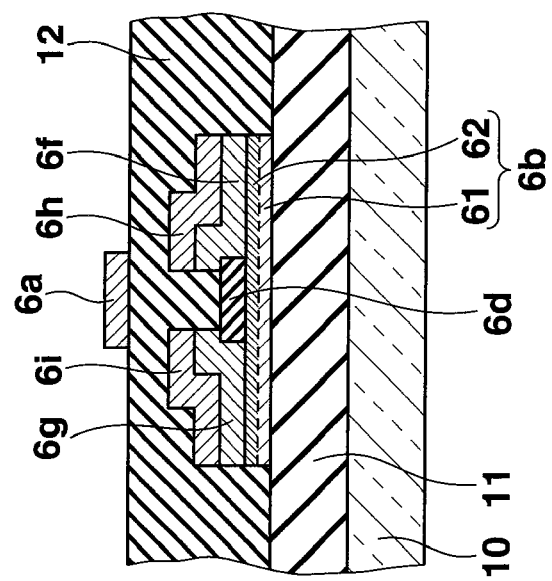
FIG.30B
FIG.30A

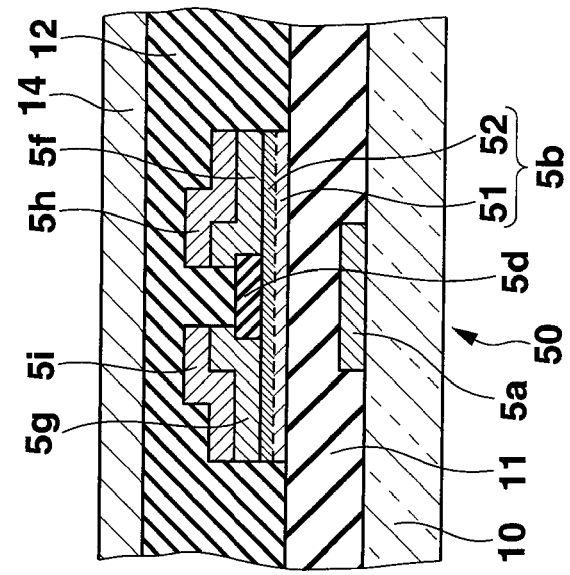
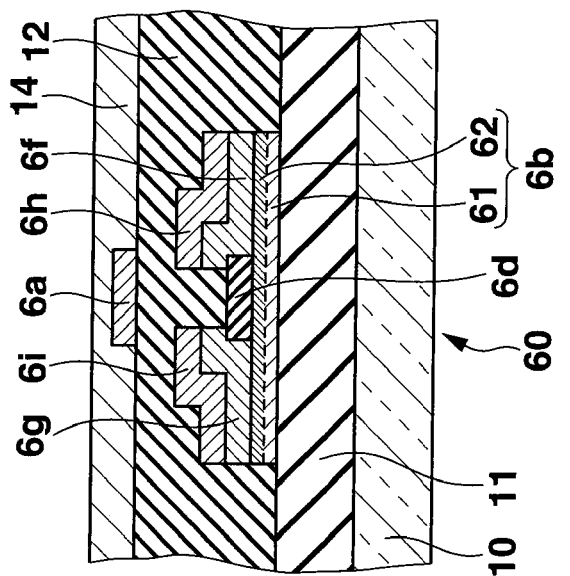

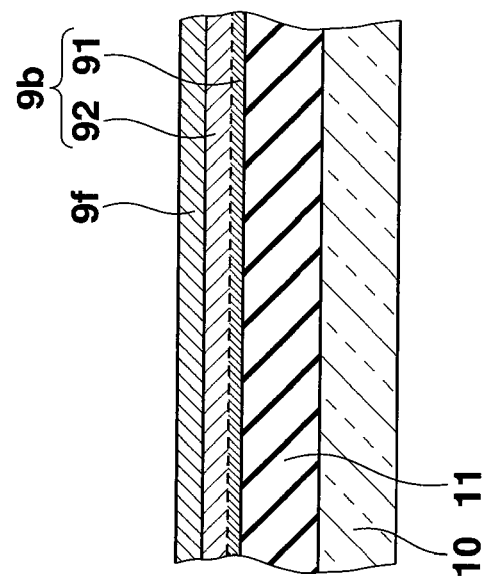
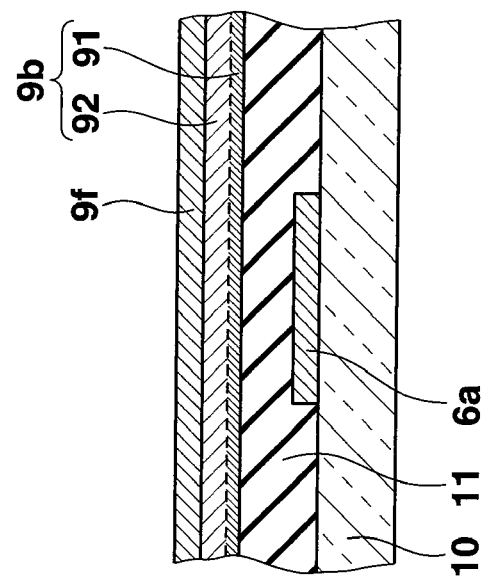
FIG.35A
FIG.35B

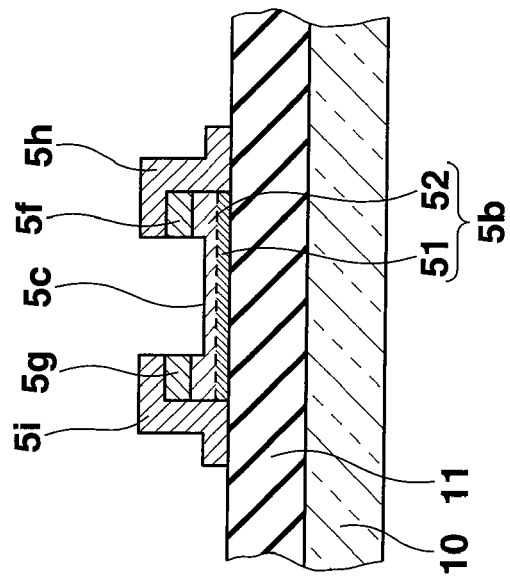
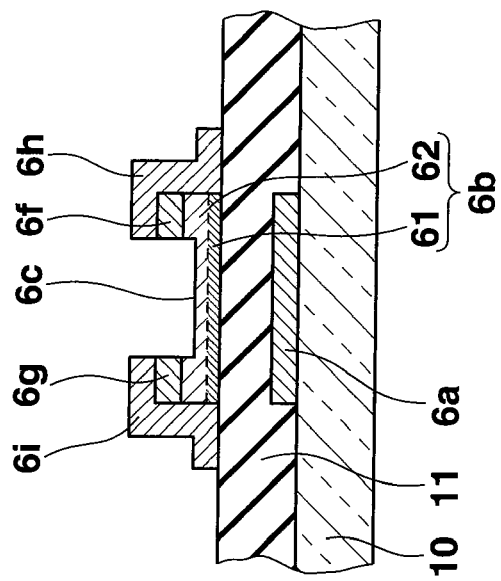

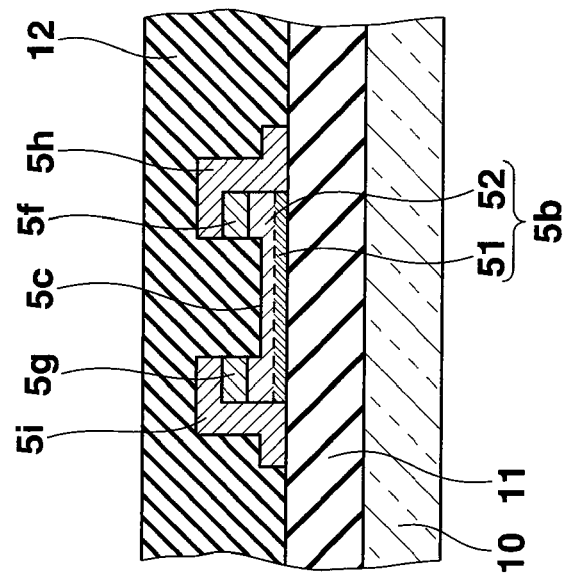
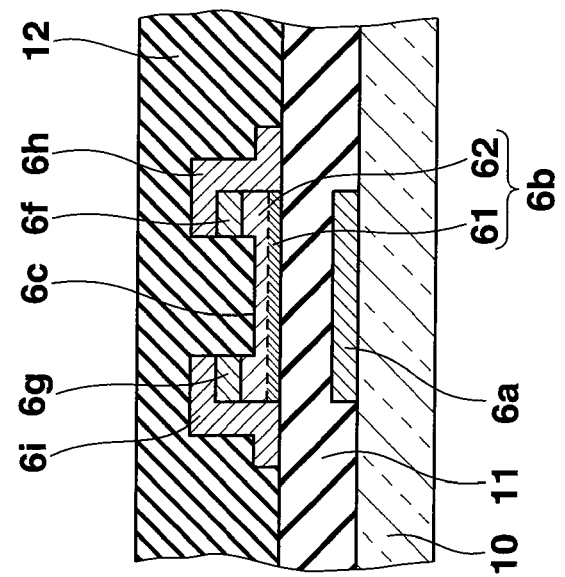
FIG. 40B
FIG. 40A

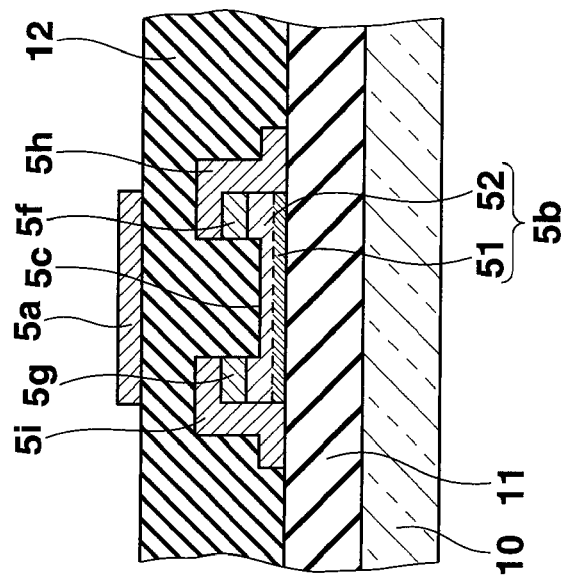
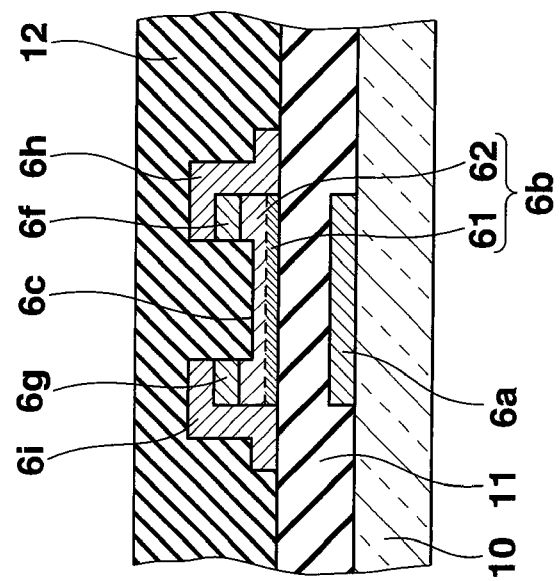

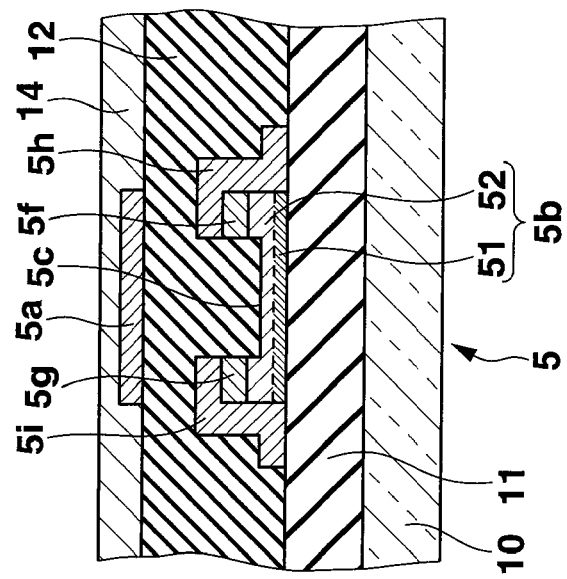
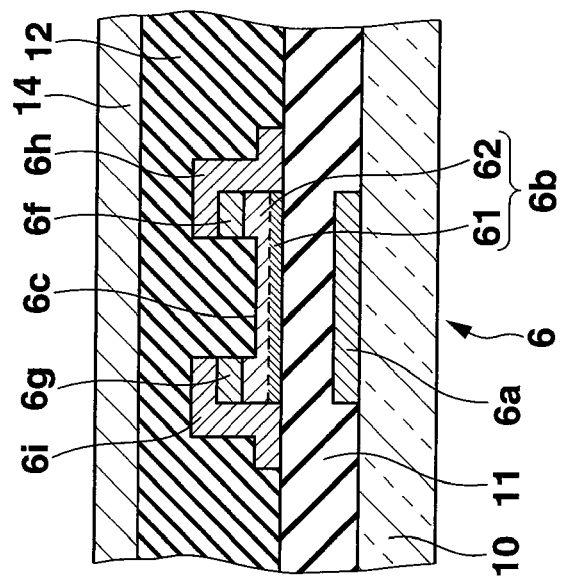
FIG.43B
FIG.43A

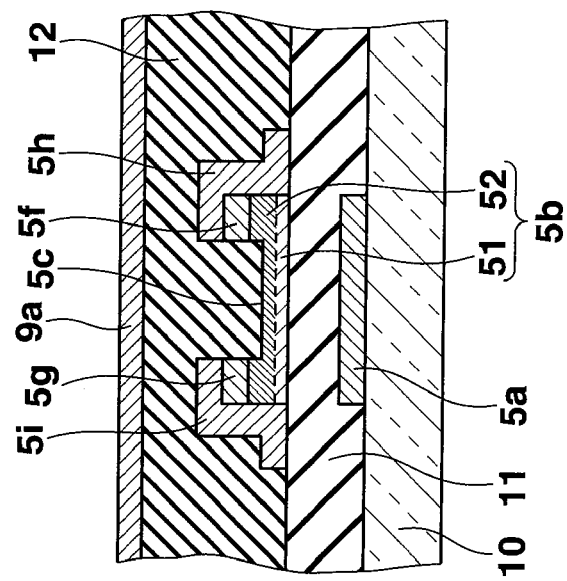
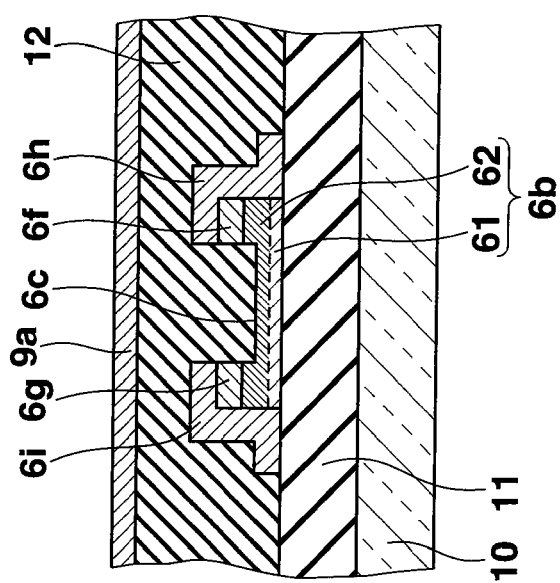
FIG.53B
FIG.53A

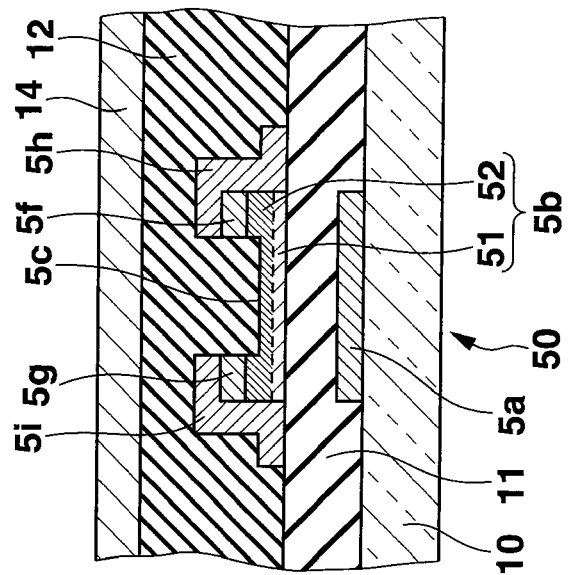
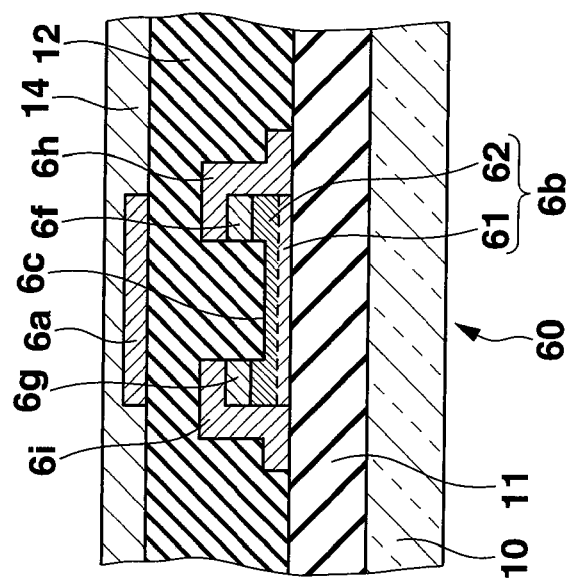
FIG.55B
FIG.55A

TRANSISTOR STRUCTURE AND LIGHT EMITTING APPARATUS

BACKGROUND OF THE INVENTION

1. Field of the Invention

The present invention relates to a transistor structure and a light emitting apparatus.

2. Description of the Related Art

Conventionally, there is known an Electro Luminescent (EL) light emitting display apparatus using an EL element. In the EL light emitting display apparatus, each pixel includes an EL element, and since the EL light emitting display apparatus is driven by an active matrix circuit, a thin film transistor to control the electric current supplied to each EL element is provided in each pixel.

The EL light emitting display apparatus of the active matrix format includes, for example, a switch transistor connected to a signal line (data line) which controls a data signal and a driving transistor which flows electric current to the EL element according to the data signal transmitted from the switch transistor.

It is required that the switch transistor and the driving transistor each have different characteristics so that the EL light emitting display apparatus realizes better light emitting display characteristics.

For example, Japanese Patent Application Laid-Open Publication No. 2007-256926 discloses a technique of a light emitting display apparatus in which a thin film transistor provided with a semiconductor film including crystalline silicon functions as a driving transistor and a thin film transistor provided with a semiconductor film including amorphous silicon functions as a switch transistor.

However, according to the above conventional technique, since one thin film transistor is formed and then the other thin film transistor is formed, film forming of an insulating film, semiconductor film and metallic film and patterning of the formed film is repeated for each thin film transistor. Moreover, since each step for each thin film transistor is repeated, about twice as many steps than the normal process is necessary, and there is a problem that the increase in the number of steps results in an increase of manufacturing cost.

SUMMARY OF THE INVENTION

The present invention has been made in consideration of the above situation, and one of the main objects is to provide a transistor structure and a light emitting apparatus in which thin film transistors in different forms can be efficiently made.

In order to achieve any one of the above advantages, according to an aspect of the present invention, there is provided a transistor structure including:

a first thin film transistor including,
a first gate electrode;
a first insulating film which covers the first gate electrode; and
a first semiconductor film which is formed on the first insulating film in a position corresponding to the first gate electrode; and
a second thin film transistor including,
a second semiconductor film which is formed on the first insulating film;
a second insulating film which covers the second semiconductor film; and
a second gate electrode which is formed in a position corresponding to a channel portion of the second semiconductor film on the second insulating film,
wherein the first semiconductor film and the second semiconductor film each include a first portion on the first insulating film side and a second portion on the opposite surface side, and either one of the first portion or the second portion has a higher degree of crystallization of silicon compared to the other of the first portion or the second portion.

According to another aspect of the present invention, there is provided a manufacturing method of a transistor structure including a first thin film transistor and a second thin film transistor, the method including:

forming a first gate electrode of the first thin film transistor;
forming a first insulating film on the first gate electrode;
forming a first semiconductor film including a crystalline silicon on the first insulating film in a position corresponding to the first gate electrode together with forming a second semiconductor film including crystalline silicon on the first insulating film in a position where the second thin film transistor is to be;
forming a second insulating film above the second semiconductor film; and
forming a second gate electrode of the second thin film transistor on the second insulating film,
wherein the first semiconductor film and the second semiconductor film each include a first portion on the first insulating film side and a second portion on the opposite surface side, and either one of the first portion or the second portion has a higher degree of crystallization of silicon compared to the other of the first portion or the second portion.

According to another aspect of the present invention, there is provided a light emitting apparatus including:

a first thin film transistor including,
a first gate electrode;
a first insulating film which covers the first gate electrode; and
a first semiconductor film which is formed on the first insulating film in a position corresponding to the first gate electrode;
a second thin film transistor including,
a second semiconductor film which is formed on the first insulating film;
a second insulating film which covers the second semiconductor film; and
a second gate electrode which is formed in a position corresponding to a channel portion of the second semiconductor film on the second insulating film; and
a light emitting element which emits light according to control by the first thin film transistor and the second thin film transistor,
wherein the first semiconductor film and the second semiconductor film each include a first portion on the first insulating film side and a second portion on the opposite surface side, and either one of the first portion or the second portion has a higher degree of crystallization of silicon compared to the other of the first portion or the second portion.

According to another aspect of the present invention, there is provided a transistor structure including:

a first thin film transistor including,
a first gate electrode;
a first insulating film which covers the first gate electrode; and
a first semiconductor film which is formed on the first insulating film and which includes a depressed section corresponding to at least a part of the first gate electrode; and
a second thin film transistor including,
a second semiconductor film which is provided on the first insulating film;

a second insulating film which covers the second semiconductor film; and a second gate electrode which is provided above an upper section of the second semiconductor film through the second insulating film, wherein the second semiconductor film includes a depressed section corresponding to at least a part of the second gate electrode, wherein the first semiconductor film and the second semiconductor film each include a first portion on the first insulating film side and a second portion on the opposite surface side formed with the depressed section, and either one of the first portion or the second portion has a higher degree of crystallization of silicon compared to the other of the first portion or the second portion.

According to another aspect of the present invention, there is provided a manufacturing method of a transistor structure including a first thin film transistor and a second thin film transistor, the method including:

forming a first gate electrode of the first thin film transistor;

forming a first insulating film which covers the first gate electrode;

forming a first semiconductor film on the first insulating film together with forming a second semiconductor film on the first insulating film in a position where the second thin film transistor is to be formed;

forming a depressed section corresponding to at least a part of the first gate electrode together with forming a depressed section corresponding to at least a part of the second gate electrode;

forming a second insulating film above the second semiconductor film; and forming a second gate electrode of the second thin film transistor in a portion on the second insulating film including an upper section of the depressed section of the second semiconductor film, wherein the first semiconductor film and the second semiconductor film are formed so that the first semiconductor film and the second semiconductor film each include a first portion on the first insulating film side and a second portion on the opposite surface side, and either one of the first portion or the second portion has a higher degree of crystallization of silicon compared to the other of the first portion or the second portion.

According to another aspect of the present invention, there is provided a light emitting apparatus including:

a first thin film transistor including, a first gate electrode;

a first insulating film which covers the first gate electrode; and a first semiconductor film which is formed on the first insulating film and which includes a depressed section corresponding to at least a part of the first gate electrode; and a second thin film transistor including, a second semiconductor film which is provided on the first insulating film;

a second insulating film which covers the second semiconductor film; and a second gate electrode which is provided above an upper section of the second semiconductor film through the second insulating film, wherein the second semiconductor film includes a depressed section corresponding to at least a part of the second gate electrode; and a light emitting element which emits light according to control by the first thin film transistor and the second thin film transistor, wherein the first semiconductor film and the second semiconductor film each include a first portion on the first insulating film side and a second portion on the opposite surface side formed with the depressed section, and either one of the first portion or the second portion has a higher degree of crystallization of silicon compared to the other of the first portion or the second portion.

According to the present invention, thin film transistors in different forms can be efficiently made.

BRIEF DESCRIPTION OF THE DRAWINGS

The present invention and the above-described objects, features and advantages thereof will become more fully understood from the following detailed description with the accompanying drawings and wherein;

FIG. 8A is an explanatory diagram showing a manufacturing step of a thin film transistor of embodiment 1;

FIG. 8B is an explanatory diagram showing a manufacturing step of a thin film transistor of embodiment 1;

FIG. 10A is an explanatory diagram showing a manufacturing step of a thin film transistor of embodiment 1;

FIG. 10B is an explanatory diagram showing a manufacturing step of a thin film transistor of embodiment 1;

FIG. 13A is an explanatory diagram showing a manufacturing step of a thin film transistor of embodiment 1;

FIG. 13B is an explanatory diagram showing a manufacturing step of a thin film transistor of embodiment 1;

FIG. 14A is an explanatory diagram showing a manufacturing step of a thin film transistor of embodiment 1;

FIG. 14B is an explanatory diagram showing a manufacturing step of a thin film transistor of embodiment 1;

FIG. 23A is an explanatory diagram showing a manufacturing step of a thin film transistor of embodiment 2;

FIG. 23B is an explanatory diagram showing a manufacturing step of a thin film transistor of embodiment 2;

FIG. 25A is an explanatory diagram showing a manufacturing step of a thin film transistor of embodiment 2;

FIG. 25B is an explanatory diagram showing a manufacturing step of a thin film transistor of embodiment 2;

FIG. 26A is an explanatory diagram showing a manufacturing step of a thin film transistor of embodiment 2;

FIG. 26B is an explanatory diagram showing a manufacturing step of a thin film transistor of embodiment 2;

FIG. 30A is an explanatory diagram showing a manufacturing step of a thin film transistor of embodiment 2;

FIG. 30B is an explanatory diagram showing a manufacturing step of a thin film transistor of embodiment 2;

FIG. 31A is an explanatory diagram showing a manufacturing step of a thin film transistor of embodiment 2;

FIG. 31B is an explanatory diagram showing a manufacturing step of a thin film transistor of embodiment 2;

FIG. 35A is an explanatory diagram showing a manufacturing step of a thin film transistor of embodiment 3;

FIG. 35B is an explanatory diagram showing a manufacturing step of a thin film transistor of embodiment 3;

FIG. 39A is an explanatory diagram showing a manufacturing step of a thin film transistor of embodiment 3;

FIG. 39B is an explanatory diagram showing a manufacturing step of a thin film transistor of embodiment 3;

FIG. 40A is an explanatory diagram showing a manufacturing step of a thin film transistor of embodiment 3;

FIG. 40B is an explanatory diagram showing a manufacturing step of a thin film transistor of embodiment 3;

FIG. 42A is an explanatory diagram showing a manufacturing step of a thin film transistor of embodiment 3;

FIG. 42B is an explanatory diagram showing a manufacturing step of a thin film transistor of embodiment 3;

FIG. 43A is an explanatory diagram showing a manufacturing step of a thin film transistor of embodiment 3;

FIG. 43B is an explanatory diagram showing a manufacturing step of a thin film transistor of embodiment 3;

FIG. 53A is an explanatory diagram showing a manufacturing step of a thin film transistor of embodiment 4;

FIG. 53B is an explanatory diagram showing a manufacturing step of a thin film transistor of embodiment 4;

FIG. 55A is an explanatory diagram showing a manufacturing step of a thin film transistor of embodiment 4;

FIG. 55B is an explanatory diagram showing a manufacturing step of a thin film transistor of embodiment 4;

DETAILED DESCRIPTION OF THE PREFERRED EMBODIMENTS

Preferred embodiments for carrying out the present embodiment are described in detail with reference to the attached drawings. The embodiments described below include various technically preferable limitations. However, the scope of the invention is not limited to the embodiments and the illustrated examples.

(Embodiment 1)

Figure 1:
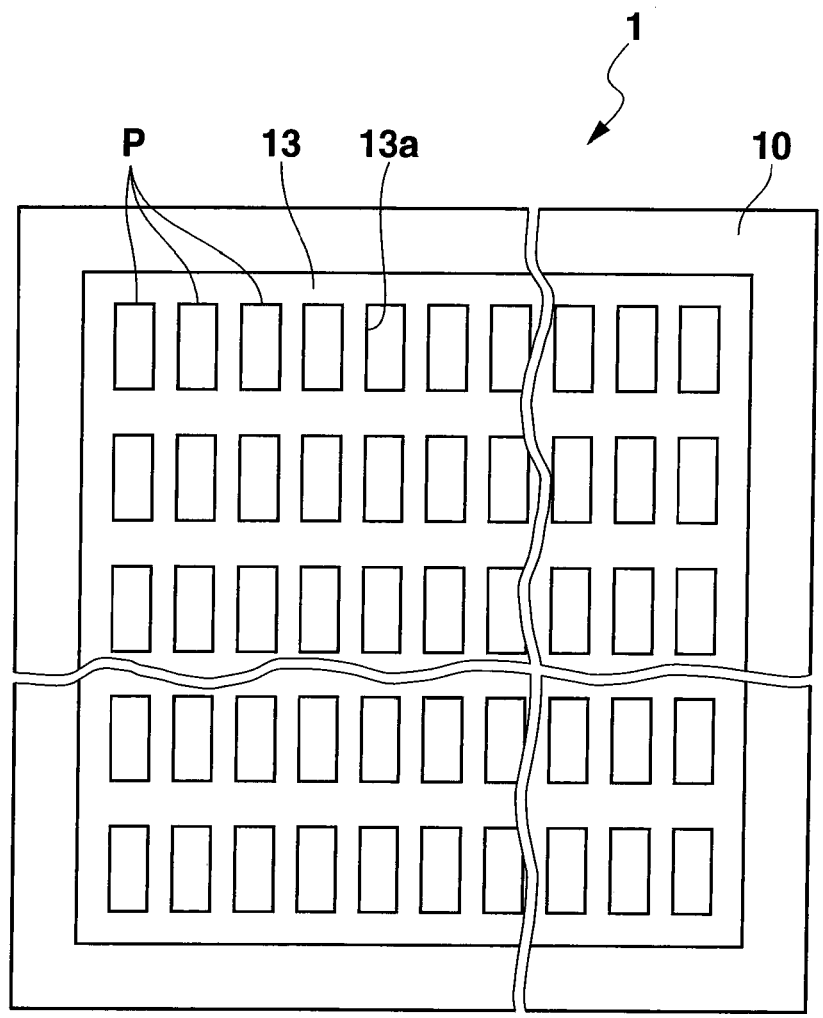
FIG. 1 is a planar view showing an arrangement structure of pixels of an EL panel.
Figure 2:
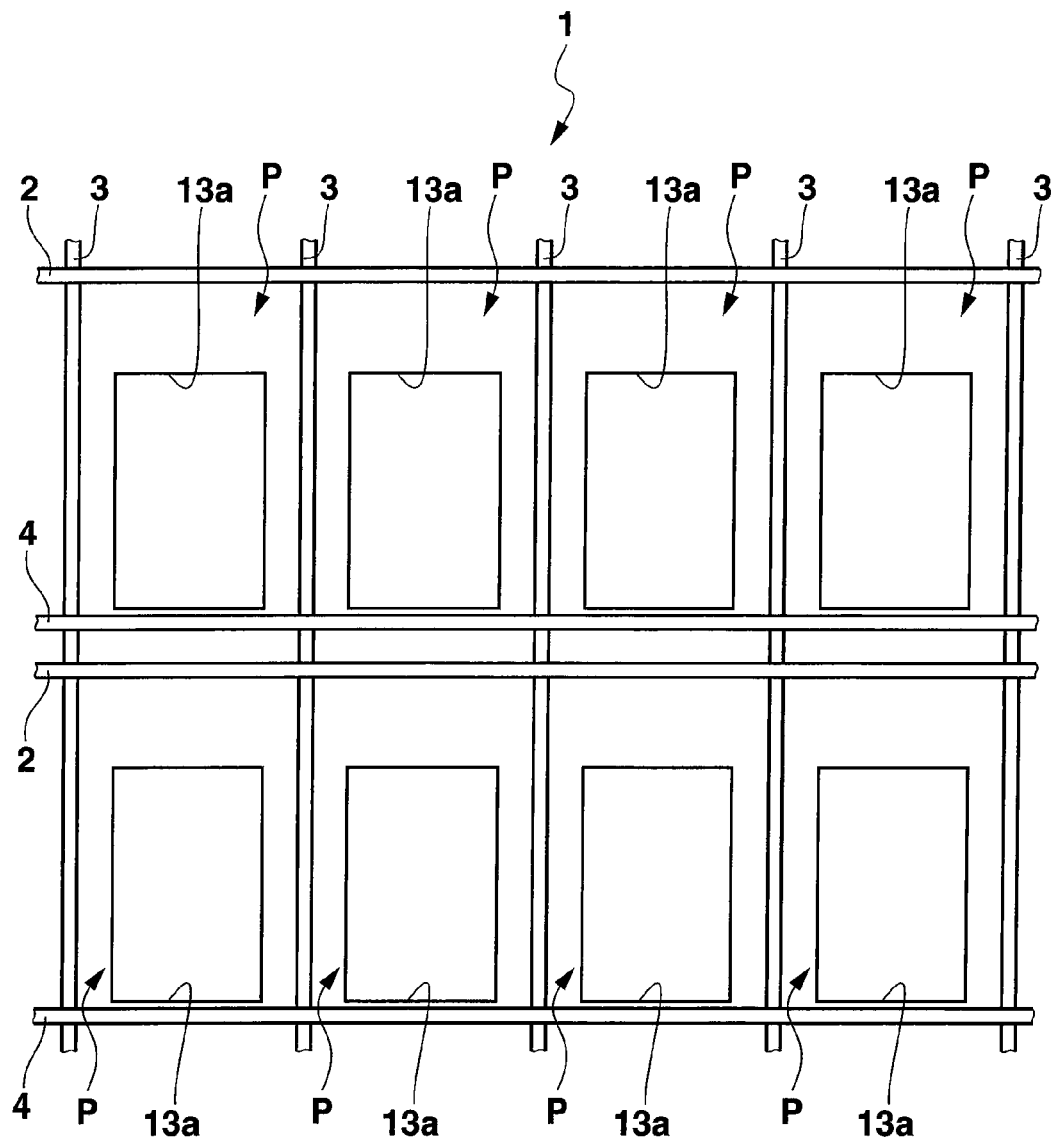
FIG. 2 is a planar view showing a schematic structure of the EL panel.

FIG. 1 is a planar view showing an arrangement structure of a plurality of pixels P in an EL panel 1 which is a light emitting apparatus. FIG. 2 is a planar view showing a schematic structure of the EL panel 1.

As shown in FIG. 1 and FIG. 2, a plurality of pixels P are arranged in a predetermined pattern in a matrix form on the EL panel 1. The plurality of pixels P include a red pixel P which emits light of R (red), green pixel P which emits light of G (green) and blue pixel P which emits light of B (blue).

On the EL panel 1, a plurality of scanning lines 2 are arranged along a row direction so as to be substantially parallel to each other, and a plurality of signal lines 3 are arranged along a column direction so as to be substantially parallel to each other and to be substantially orthogonal to the scanning lines 2 from a planar view. Voltage supplying lines 4 are provided along the scanning lines 2 in between adjacent scanning lines 2. The portion surrounded by two adjacent scanning lines 2 and two adjacent signal lines 3 correspond to pixel P.

Bank 13, which is a partition wall, is provided so as to cover above scanning lines 2, signal lines 3 and voltage supplying lines 4 on the EL panel 1. Bank 13 is provided in, for example, a grid like shape, and a plurality of opening sections 13a surrounded by the bank 13 in a substantial rectangular shape are formed for each pixel P. A predetermined carrier transporting layer (later described hole injecting layer 8b and light emitting layer 8c) is provided in the opening section 13a of the bank 13 and this is to be a light emitting portion of the pixel P. The carrier transporting layer is a layer which transports a hole or an electron by applying voltage. The bank 13 is not limited to the above, and instead of providing an opening section 13a for each pixel P, the bank 13 can cover the signal line 3 and extend along a column direction and include an opening section in a stripe shape which collectively exposes a center section of each later described pixel electrode 8a of the plurality of pixels P aligned in a column direction.

Figure 3:
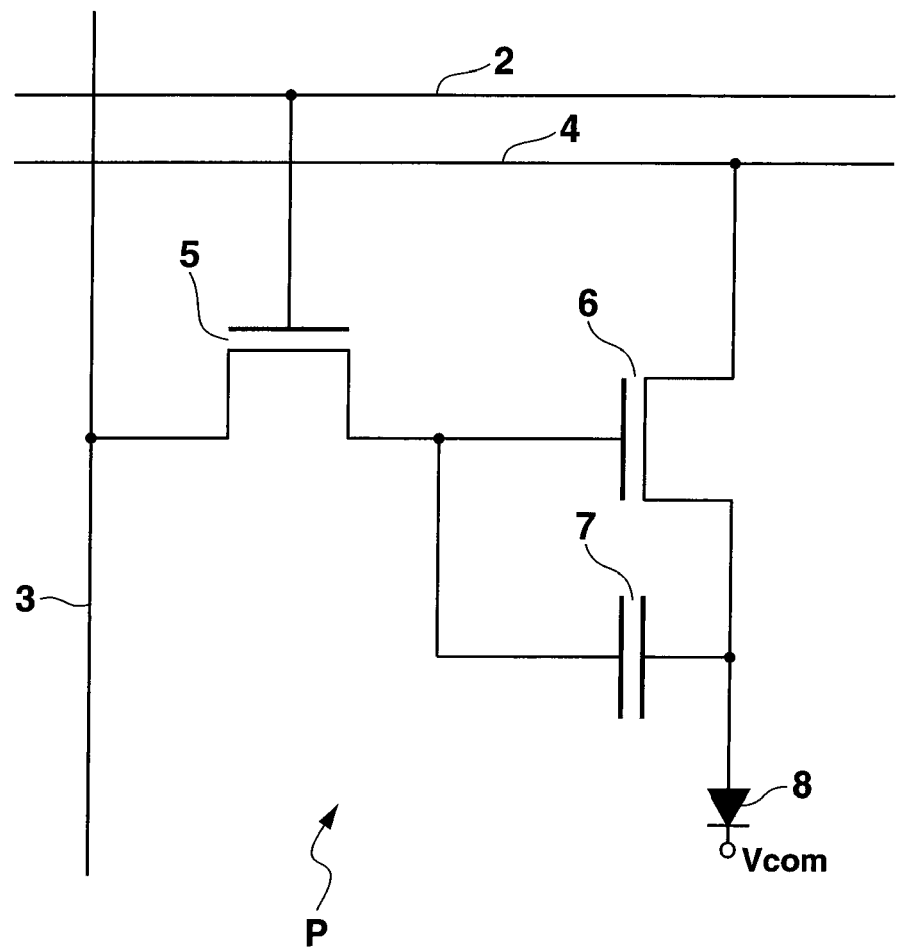
FIG. 3 is a circuit diagram showing a circuit corresponding to one pixel of the EL panel.

FIG. 3 is a circuit diagram showing an example of a circuit corresponding to one pixel of the EL panel 1 which is driven by an active matrix driving method.

As shown in FIG. 3, the EL panel 1 is provided with the scanning line 2, the signal line 3 which intersects with scanning line 2 and voltage supplying line 4 along the scanning line 2. Each pixel of the EL panel 1 is provided with a switch transistor 5 which is a second thin film transistor, a driving transistor 6 which is a first thin film transistor, a capacitor 7, and an EL element 8 which is a light emitting element. The switch transistor 5 and the driving transistor 6 function as driving elements which allow the EL element 8 to emit light.

In each pixel P, a gate of the switch transistor 5 is connected to the scanning line 2, either one of a drain or a source of the switch transistor 5 is connected to the signal line 3, the other of either of the drain or the source of the switch transistor 5 is connected to one of an electrode of the capacitor 7 and a gate of the driving transistor 6. Either one of a drain or a source of the driving transistor 6 is connected to the voltage supplying line 4 and the other of either of the drain or the source of the driving transistor 6 is connected to the other electrode of the capacitor 7 and an anode of the EL element 8. All cathodes of the EL element 8 of the pixel P are maintained at a constant voltage Vcom (for example, grounded).

Moreover, each scanning line 2 is connected to a scanning driver in a periphery of the EL panel 1, each voltage supplying line 4 is connected to a voltage source which outputs a constant voltage or a voltage driver which suitably outputs a voltage signal and each signal line 3 is connected to a data driver, and the EL panel 1 is driven by an active matrix driving method using these drivers. The constant voltage from the voltage source or the voltage signal from the voltage driver is supplied to the voltage supplying line 4.

Figure 4:
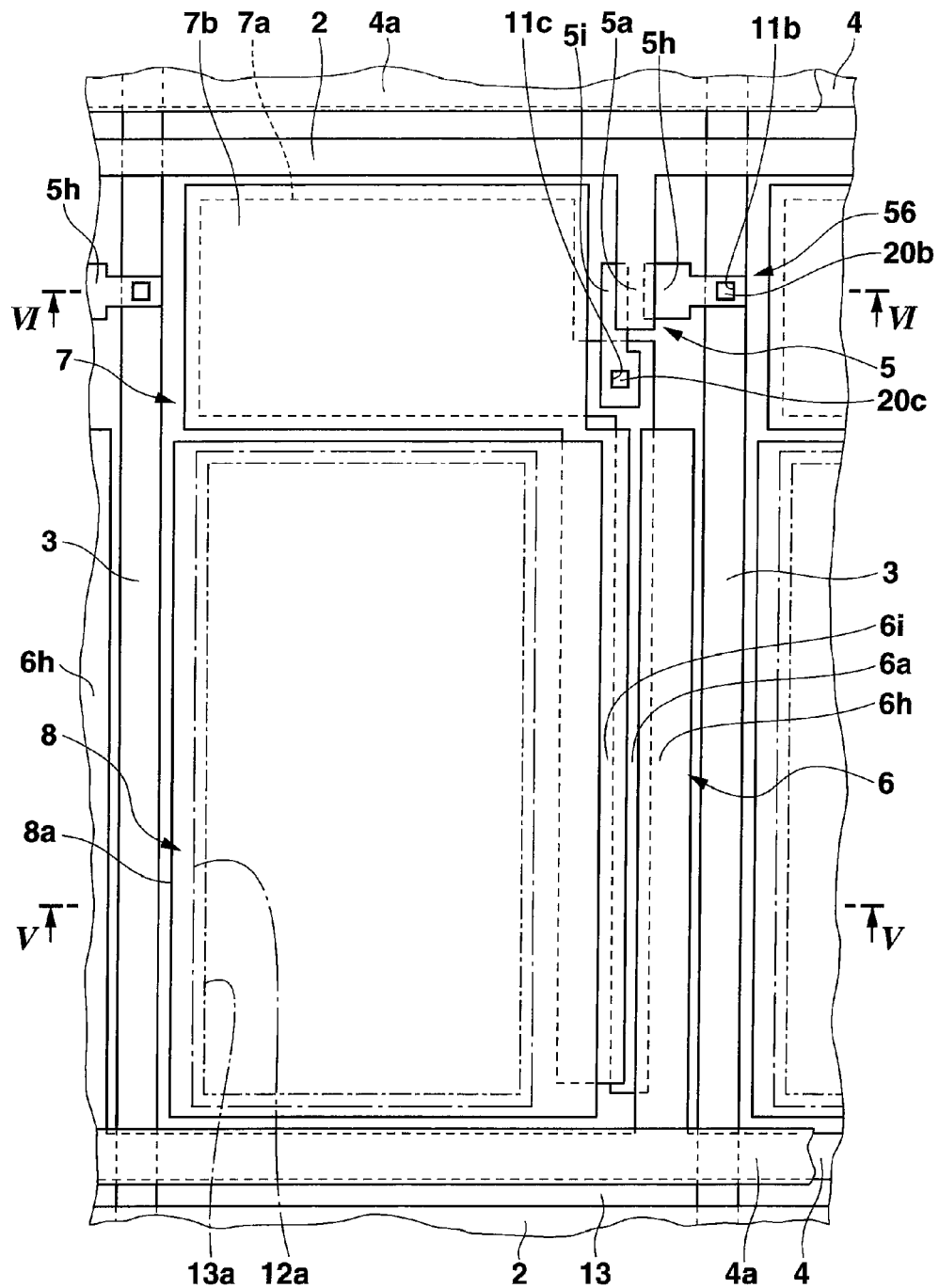
FIG. 4 is a planar view showing one pixel of the EL panel of embodiment 1.
Figure 5:
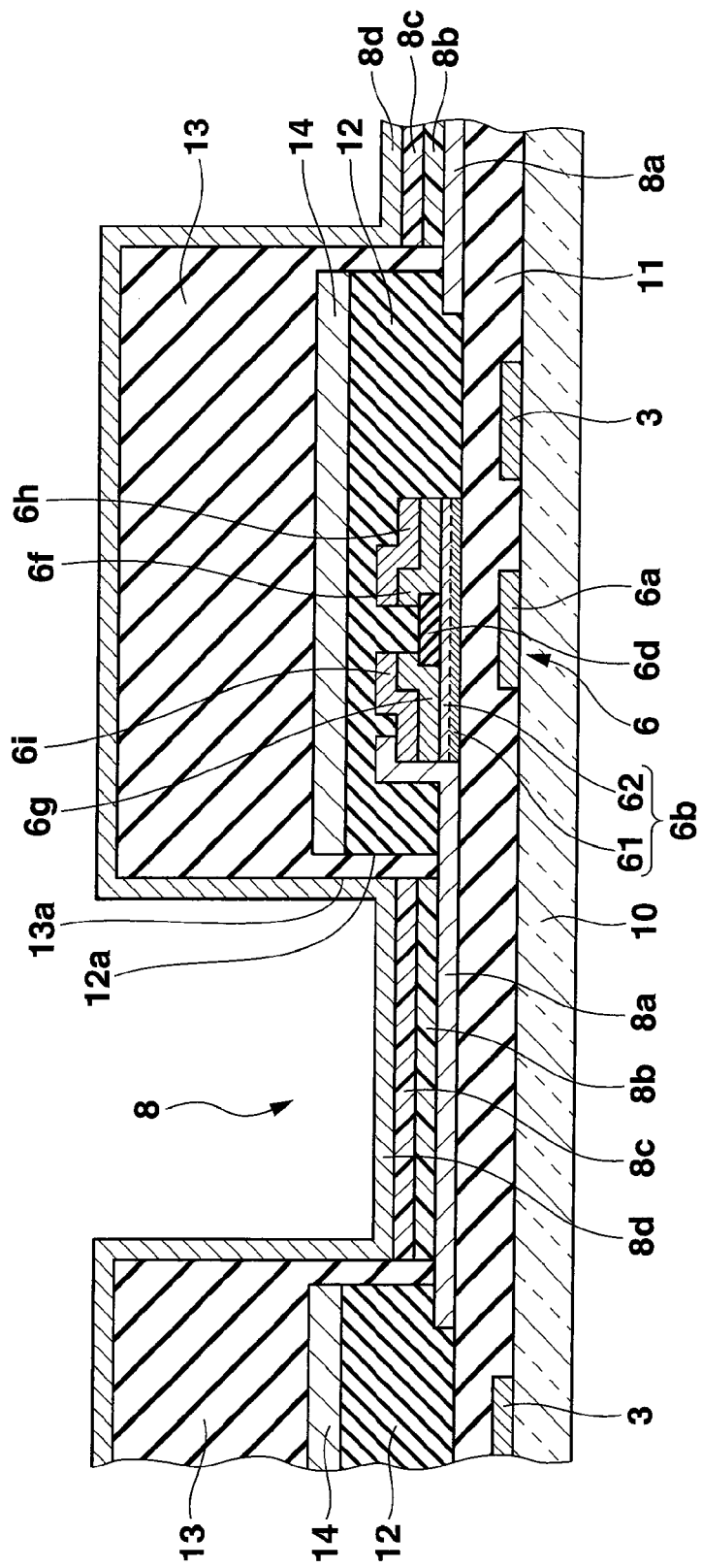
FIG. 5 is a cross sectional view of a plane along arrows V-V shown in FIG. 4.
Figure 6:
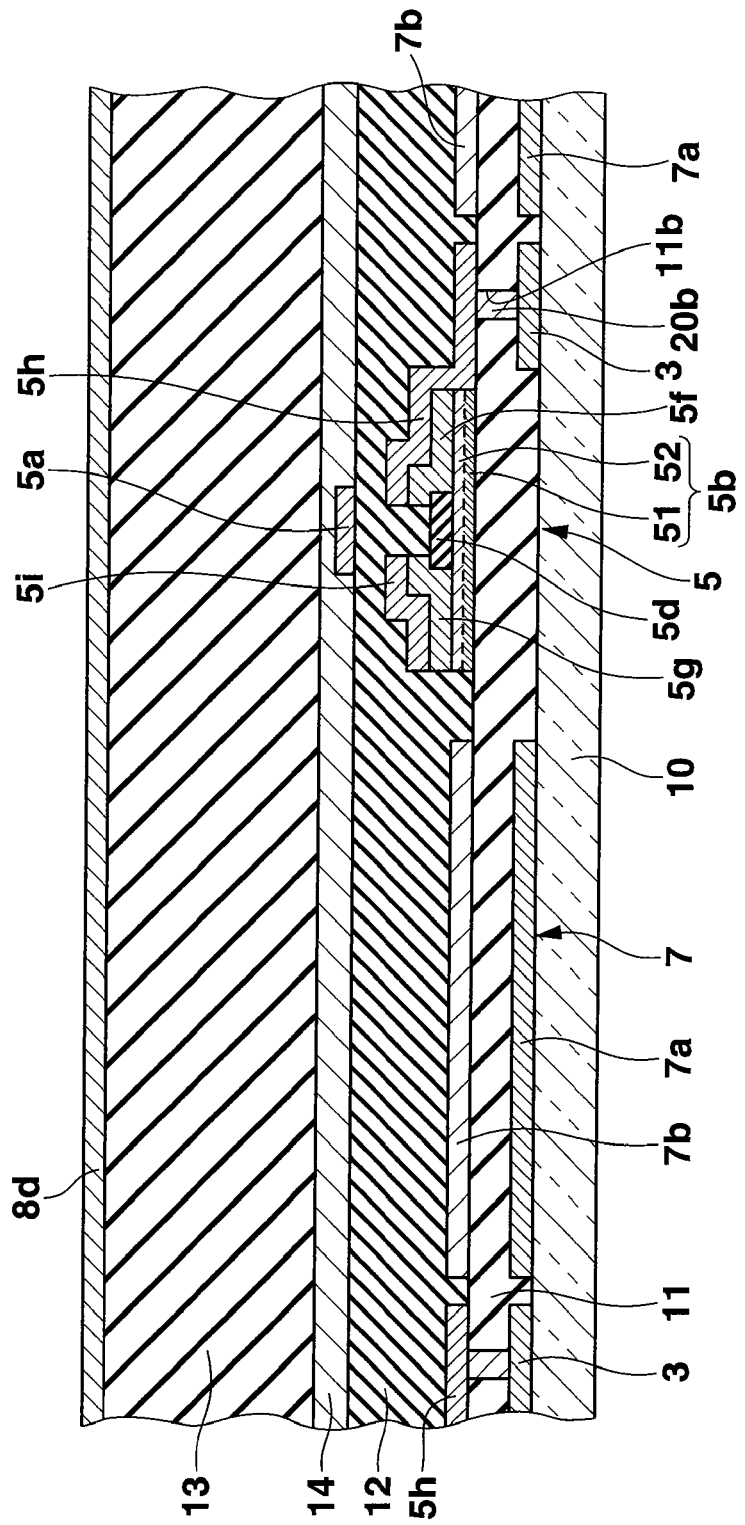
FIG. 6 is a cross sectional view of a plane along arrows VI-VI shown in FIG. 4.

Next, the circuit configuration of the EL panel 1 and the pixel P is described using FIG. 4 to FIG. 6. Here, FIG. 4 is a planar view corresponding to one pixel P of the EL panel 1, FIG. 5 is a cross sectional view of a plane along arrows V-V shown in FIG. 4 and FIG. 6 is a cross sectional view of a plane along arrows VI-VI shown in FIG. 4. FIG. 4 mainly shows electrodes and lines.

As shown in FIG. 4, the transistor structure 56 of each pixel P includes the switch transistor 5 and the driving transistor 6. The switch transistor 5 and the driving transistor 6 are arranged along the signal line 3, the capacitor 7 is positioned near the switch transistor 5 and the EL element 8 is positioned near the driving transistor 6. Moreover, in each pixel P, the switch transistor 5, the driving transistor 6, the capacitor 7 and the EL element 8 are positioned between the scanning line 2 and the voltage supplying line 4.

As shown in FIG. 4 to FIG. 6, a first gate electrode 6a is provided on the substrate 10, and a first insulating film 11 is formed on an upper surface of the substrate 10 so as to cover the first gate electrode 6a. On the first insulating film 11, a second semiconductor film 5b and a first semiconductor film 6b, a pair of impurity semiconductor films 5f, 5g, 6f and 6g, and drain electrodes 5h and 6h and source electrodes 5i and 6i are each formed on a predetermined position, and a second insulating film 12 is formed so as to cover the drain electrodes 5h and 6h and the source electrodes 5i and 6i. A second gate electrode 5a is provided on the second insulating film 12 and a passivation film 14 is formed on the upper surface of the second insulating film 12 so as to cover the second gate electrode 5a.

Moreover, the signal line 3 is formed between the substrate 10 and the first insulating film 11.

The scanning line 2 is formed between the second insulating film 12 and the passivation film 14.

The voltage supplying line 4 is formed on the first insulating film 11. A groove (not shown) is formed along the voltage supplying line 4 on the part of the second insulating film 12 on the voltage supplying line 4, and a conducting layer 4a which covers the voltage supplying line 4 is provided in the groove. By layering the conducting layer 4a so that the conducting layer 4a is in contact with the voltage supplying line 4, there is an aim to lower the resistance of the voltage supplying line 4 and to stabilize the amount of electric current supplied to the EL element 8 through the driving transistor 6.

Moreover, as shown in FIG. 4 and FIG. 6, the switch transistor 5 is a second thin film transistor with a top gate structure. The switch transistor 5 includes a second gate electrode 5a, a second semiconductor film 5b, a protective insulating film 5d, impurity semicondutor films 5f, 5g, drain electrode 5h, source electrode 5i, and the like.

The first insulating film 11 with insulating properties formed on the upper surface of the substrate 10 includes, for example, light permeability and includes silicon nitride or silicon oxide. An intrinsic second semiconductor film 5b is formed on the first insulating film 11 in a position which is to correspond with the second gate electrode 5a.

The second semiconductor film 5b includes, for example, crystalline silicon, especially microcrystalline silicon and includes a first portion 51 positioned on the first insulating film 11 side and a second portion 52 positioned on the opposite surface side (second gate electrode 5a side). Here, degree of crystallization of silicon of the first portion 51 is formed higher than the second portion 52. In other words, in the first portion 51 of the second semiconductor film 5b, the degree of crystallization of silicon is relatively higher compared to the second portion 52, and the rate of the crystalline silicon portion is higher than the second portion 52. In the second portion 52 of the second semiconductor film 5b, the rate of the amorphous silicon portion is large compared to the first portion 51, and preferably, the second portion 52 of the second semiconductor film 5b is a portion with substantially only amorphous silicon. The second semiconductor film 5b is a channel portion where a channel is formed. Moreover, a protective insulating film 5d with insulating properties is formed on a center section of the second semiconductor film 5b.

It is preferable that the protective insulating film 5d includes, for example, silicon nitride or silicon oxide.

Moreover, on one edge section of the second semiconductor film 5b, an impurity semiconductor film 5f is formed so that a part overlaps with the protective insulating film 5d, and on the other edge section of the second semiconductor film 5b, an impurity semiconductor film 5g is formed so that a part overlaps with the protective insulating film 5d. As described here, the impurity semiconductor films 5f and 5g are formed apart from each other on each edge side of the second semiconductor film 5b. The impurity semiconductor films 5f and 5g are n-type semiconductors including n-type impurity, however, it is not limited to the above, and when the switch transistor 5 is a p-type transistor, a p-type semiconductor can be used.

The drain electrode 5h is formed on the impurity semiconductor film 5f. The source electrode 5i is formed on the impurity semiconductor film 5g. It is preferable that the drain electrode 5h and the source electrode 5i are formed from material selected from, for example, a Cr film, an Al film, a Cr/Al laminated film, an AlTi alloy film, and an AlTiNd alloy film.

On the protective insulating film 5d, the drain electrode 5h and the source electrode 5i, a second insulating film 12 with insulating properties is formed, and the protective insulating film 5d, the drain electrode 5h, the source electrode 5i, etc. are covered by the second insulating film 12. The second insulating film 12 includes, for example, silicon nitride or silicon oxide.

The second gate electrode 5a is formed on the second insulating film 12 in a position corresponding to the protective insulating film 5d. It is preferable that this second gate electrode 5a is formed from material selected from, for example, a Cr film, an Al film, a Cr/Al laminated film, an AlTi alloy film or an AlTiNd alloy film. The second gate electrode 5a on the second insulating film 12 is covered by the passivation film 14. The passivation film 14 includes, for example, silicon nitride or silicon oxide.

The switch transistor 5 is covered by the passivation film 14.

In the switch transistor 5, the second insulating film 12 and the protective insulating film 5d function as a gate insulating film, and a channel (channel portion) is formed in the portion of the second semiconductor film 5b covered by the protective insulating film 5d and acted on by the electric field of the second gate electrode 5a. Specifically, a channel is formed in a second portion 52 of the second semiconductor film 5b which is the second gate electrode 5a side of the second semiconductor film 5b, and the second portion 52 is the electric current path between the source electrode 5i and the drain electrode 5h.

The second portion 52 of the second semiconductor film 5b is a semiconductor layer including more amorphous silicon and the switch transistor 5 which uses the second portion 52 as the electric current path of the channel corresponds to a thin film transistor including a semiconductor film made from amorphous silicon (or a semiconductor film including amorphous silicon as a main component). In other words, the leak current is smaller in the amorphous silicon of the second portion 52 of the switch transistor 5 compared to the crystalline silicon such as microcrystalline silicon and (electric current which flows in the semiconductor layer when on)/(electric current which flows in the semiconductor layer when off) is high. Therefore, the above suitably functions as the switch transistor which controls the on/off of the driving transistor 6.

As shown in FIG. 4 and FIG. 5, the driving transistor 6 is a first thin film transistor with a bottom gate structure. The driving transistor 6 includes a first gate electrode 6a, a first semiconductor film 6b, a protective insulating film 6d, impurity semiconductor films 6f and 6g, drain electrode 6h, source electrode 6i and the like.

The first gate electrode 6a is formed between the substrate 10 and the first insulating film 11. It is preferable that the first gate electrode 6a is formed from material selected from, for example, a Cr film, an Al film, a Cr/Al laminated film, an AlTi alloy film and an AlTiNd alloy film. The first insulating film 11 with insulating properties is formed on the first gate electrode 6a and the first gate electrode 6a is covered by the first insulating film 11. The intrinsic first semiconductor film 6b is formed in a position on the first insulating film 11 corresponding to the first gate electrode 6a. The first semiconductor film 6b faces the first gate electrode 6a with the first insulating film 11 in between.

The first semiconductor film 6b includes, for example, crystalline silicon, specifically, microcrystalline silicon and includes a first portion 61 positioned on the first insulating film 11 side (first gate electrode 6a side) and a second portion 62 positioned on the opposite surface side. Here, degree of crystallization of silicon of the first portion 61 is formed higher compared to the second portion 62. In other words, in the first portion 61 of the first semiconductor film 6b, degree of crystallization of silicon is relatively higher compared to the second portion 62, and the rate of the crystalline silicon portion is higher compared to the second portion 62. In the second portion 62 of the first semiconductor film 6b, the rate of the portion of the amorphous silicon is higher compared to the first portion 61, and preferably the second portion 62 of the first semiconductor film 6b is a portion with substantially only amorphous silicon.

The first portion 61 of the first semiconductor film 6b and the first portion 51 of the second semiconductor film 5b have the same composition and have the same thickness. The second portion 62 of the first semiconductor film 6b and the second portion 52 of the second semiconductor film 5b have the same composition and have the same thickness. Therefore, as described later, the first semiconductor film 6b and the second semiconductor film 5b can be manufactured collectively with the same process using the semiconductor layer 9 which is a layer with the same material. The first semiconductor film 6b is a channel portion where the channel is formed. Moreover, on a center section of the first semiconductor film 6b, the protective insulating film 6d with insulating properties is formed.

The protective insulating film 6d and the protective insulating film 5d are composed of the same material and have the same thickness, and preferably include, for example, silicon nitride or silicon oxide. Therefore, as described later, the protective insulating film 6d and the protective insulating film 5d can be manufactured collectively with the same process using the protective insulating layer 9d which is a layer with the same material.

Moreover, on one edge section of the first semiconductor film 6b, the impurity semiconductor film 6f is formed so that a part overlaps with the protective insulating film 6d, and on the other edge section of the first semiconductor film 6b, the impurity semiconductor film 6g is formed so that a part overlaps with the protective insulating film 6d. As described here, the impurity semiconductor films 6f and 6g are formed apart on each edge side of the first semiconductor film 6b. The impurity semiconductor films 6f and 6g are n-type semiconductors including n-type impurity, however it is not limited to the above, and when the switch transistor 5 and the driving transistor 6 are p-type transistors, a p-type semiconductor can be used. The impurity semiconductor films 6f and 6g and the impurity semiconductor films 5f and 5g are composed of the same material and have the same thickness. As described later, the impurity semiconductor films 6f and 6g and the impurity semiconductor films 5f and 5g can be manufactured collectively with the same process using the impurity semiconductor layer 9f which is a layer with the same material.

The drain electrode 6h is formed on the impurity semiconductor film 6f. The source electrode 6i is formed on the impurity semiconductor film 6g. It is preferable that the drain electrode 6h and the source electrode 6i are formed from material selected from, for example, a Cr film, an Al film, a Cr/Al laminated film, an AlTi alloy film and an AlTiNd alloy film. The drain electrode 6h, the source electrode 6i, the drain electrode 5h and the source electrode 5i are composed of the same material and have the same thickness. As described later, the drain electrode 6h, the source electrode 6i, the drain electrode 5h and the source electrode 5i can be manufactured collectively with the same process using the conducting film 9h which is a layer with the same material.

A second insulating film 12 with insulating properties is formed on the protective insulating film 6d, the drain electrode 6h and the source electrode 6i, and the protective insulating film 6d, the drain electrode 6h, the source electrode 6i, etc. are covered by the second insulating film 12. Therefore, the second insulating film 12 covers both the switch transistor 5 and the driving transistor 6. Moreover, the passivation film 14 is formed on the second insulating film 12 corresponding to the driving transistor 6, and the passivation film 14 covers both the switch transistor 5 and the driving transistor 6.

Therefore, the driving transistor 6 is covered by both the second insulating film 12 and the passivation film 14.

In the driving transistor 6, the first insulating film 11 functions as a gate insulating film, and a channel (channel portion) is formed in the portion of the first semiconductor film 6b covered by the protective insulating film 6d and acted on by the electric field of the first gate electrode 6a. Specifically, a channel is formed in a first portion 61 of the first semiconductor film 6b which is the first gate electrode 6a side of the first semiconductor film 6b, and the first portion 61 is the electric current path between the source electrode 6i and the drain electrode 6h.

The first portion 61 of the first semiconductor film 6b is a semiconductor layer including more crystalline silicon than the second portion 62. Therefore, the driving transistor 6 which uses the first portion 61 as the electric current path of the channel corresponds to a thin film transistor including a semiconductor film made from crystalline silicon (or a semiconductor film including crystalline silicon as the main component). In other words, the microcrystalline silicon in the first portion 61 of the driving transistor 6 is crystalline silicon with a grain diameter of about 50 to 100 nm. Therefore, the shift of threshold voltage by the driving of the transistor is small compared to the amorphous silicon and the deterioration of the transistor can be suppressed. Moreover, the degree of carrier mobility is high, and therefore suitably functions as a driving transistor which flows electric current in the EL element 8 by control of the switch transistor 5.

The capacitor 7 is connected between the first gate electrode 6a and the source electrode 6i of the driving transistor 6. Specifically, the electrode 7a of the capacitor 7 is connected to the first gate electrode 6a of the driving transistor 6, and the electrode 7b of the capacitor 7 is connected to the source electrode 6i of the driving transistor 6. Then, as shown in FIG. 4 and FIG. 6, one electrode 7a of the capacitor 7 is formed between the substrate 10 and the first insulating film 11, and the other electrode 7b of the capacitor 7 is formed between the first insulating film 11 and the second insulating film 12. The electrode 7a and the electrode 7b face each other with the first insulating film 11, which is a dielectric material, in between.

The signal line 3, the electrode 7a of the capacitor 7, and the first gate electrode 6a of the driving transistor 6, are collectively formed by processing the shape of a conducting film formed on an entire surface of the substrate 10 by photolithography, etching, etc.

The voltage supplying line 4, the electrode 7b of the capacitor 7, the drain electrode 5h and the source electrode 5i of the switch transistor 5, and the drain electrode 6h and the source electrode 6i of the driving transistor 6 are collectively formed by processing the shape of a conducting film formed on an entire surface of the first insulating film 11 by photolithography, etching, etc.

The scanning line 2, the second gate electrode 5a of the switch transistor 5 and the conducting layer 4a are collectively formed by processing the shape of a conducting film formed on an entire surface of the second insulating film 12 by photolithography, etching, etc.

On the first insulating film 11, a contact hole 11b is formed on a portion where the drain electrode 5h and the signal line 3 overlaps, a contact hole 11c is formed on a portion where the first gate electrode 6a and the source electrode 5i overlaps, and contact plugs 20b and 20c are implanted in the contact holes 11b and 11c. The drain electrode 5h of the switch transistor 5 and the signal line 3 are electrically conducted by the contact plug 20b. The source electrode 5i of the switch transistor 5 and the electrode 7a of the capacitor 7 as well as the source electrode 5i of the switch transistor 5 and the first gate electrode 6a of the driving transistor 6 are electrically conducted by the contact plug 20c. The drain electrode 5h can be conducted with the signal line 3 by direct contact and the source electrode 5i can be conducted with the first gate electrode 6a by direct contact without using the contact plugs 20b and 20c.

The first gate electrode 6a of the driving transistor 6 is connected as one with the electrode 7a of the capacitor 7, the drain electrode 6h of the driving transistor 6 is connected as one with the voltage supplying line 4, and the source electrode 6i of the driving transistor 6 is connected as one with the electrode 7b of the capacitor 7.

The pixel electrode 8a is provided on the substrate 10 with the first insulating film 11 in between, and a separate pixel electrode 8a is formed for each pixel P. According to a bottom emission structure which emits light of the EL element 8 from the pixel electrode 8a side, the pixel electrode 8a is a transparent electrode, and it is preferable that the pixel electrode 8a is formed from material selected from for example, tin doped indium oxide (ITO), zinc doped indium oxide, indium oxide ($In_2O_2$), tin oxide ($SnO_2$), zinc oxide (ZnO) and cadmium-tin oxide (CTO). In a top emission structure which emits light of the EL element 8 from a counter electrode 8d side, it is preferable that the pixel electrode 8a is a laminated structure including a light reflecting layer as a lower layer which is a single or alloy layer of aluminum, etc. with high light reflecting properties, and the above described transparent electrode as the upper layer. A part of the pixel electrode 8a overlaps with the source electrode 6i of the driving transistor 6, and the pixel electrode 8a and the source electrode 6i are connected to each other.

Then, as shown in FIG. 4 and FIG. 5, the second insulating film 12 and the passivation film 14 are formed so as to cover the scanning line 2, the signal line 3, the voltage supplying line 4, the switch transistor 5, the driving transistor 6, the periphery of the pixel electrode 8a, the electrode 7b of the capacitor 7 and the first insulating film 11. In other words, the opening section 12a is formed in the second insulating film 12 and the passivation film 14 so as to expose the center section of each pixel electrode 8a. Therefore, the second insulating film 12 and the passivation film 14 are formed in a grid like shape from a planar view.

As shown in FIG. 4 and FIG. 5, the EL element 8 includes the pixel electrode 8a as the first electrode which is to be the anode, the hole injecting layer 8b which is a compound film formed on the pixel electrode 8a, the light emitting layer 8c which is a compound film formed on the hole injecting layer 8b, and the counter electrode 8d as the second electrode formed on the light emitting layer 8c. The counter electrode 8d is a single electrode common to all pixels P and is formed continuously on all pixels P.

The hole injecting layer 8b is a layer including, for example PEDOT (polyethylenedioxythiophene) which is a conductive polymer and PSS (polystyrene sulfonate) which is a dopant and is a carrier injecting layer to inject a hole from the pixel electrode 8a to the light emitting layer 8c.

The light emitting layer 8c includes material which emits light of either R (red), G (green) or B (blue) in each pixel, and is a layer including light emitting material of polyfluorene series or polyphenylene vinylene series and emits light by recombination between an electron supplied from the counter electrode 8d and a hole injected from the hole injecting layer 8b. Therefore, among the pixel P which emits light of R (red), the pixel P which emits light of G (green) and the pixel P which emits light of B (blue), the light emitting material of the light emitting layer 8c are different from each other. The pixels P which are R (red), G (green) and B (blue) are aligned in a stripe pattern in which, for example, the same color pixel is aligned in the vertical direction. This alignment pattern is not limited to a stripe pattern and can be a delta sequence. In a stripe pattern, the opening section 13a of the bank 13 is provided in a grid like shape along the alignment pattern of each pixel P or in a stripe shape along a column direction so that a plurality of the center sections of the pixel electrode 8a of the pixel P are collectively exposed.

The counter electrode 8d is formed from material with a lower work function than the pixel electrode 8a, and when the counter electrode 8d is employed as the cathode, the counter electrode 8d is formed for example as a laminated body including a lower layer of a single body or alloy including at least one type of indium, magnesium, calcium, lithium, barium, or rare earth metal and an upper layer in order to reduce sheet resistance. In a top emission structure which emits light of the EL element 8 from the counter electrode 8d side, the upper layer is a transparent electrode and it is preferable that the upper layer is formed from material selected from, for example, tin doped indium oxide (ITO), zinc doped indium oxide, indium oxide ($In_2O_3$), tin oxide ($SnO_2$), zinc oxide (ZnO), and cadmium-tin oxide (CTO). In a bottom emission structure which emits light of the EL element 8 from the pixel electrode 8a side, it is preferable that the upper layer is a single or alloy layer of aluminum, etc. with high light reflecting properties.

The counter electrode 8d is an electrode common to all pixels P and covers the later described bank 13 with a compound film such as the light emitting layer 8c.

The light emitting layer 8c which is to be the light emitting part is divided with respect to each pixel P by the second insulating film 12 and the bank 13.

Then, in the opening section 13a, the hole injecting layer 8b and the light emitting layer 8c as the carrier transporting layers are layered on the pixel electrode 8a. The hole injecting layer 8b can be formed continuously to spread on a plurality of pixels P. In this case, it is preferable to use germanium oxide with hole injecting properties.

Specifically, when the hole injecting layer 8b or the light emitting layer 8c is formed in a predetermined portion surrounded by the bank 13 of the pixel P by a wet type method, the bank 13 functions as a partition wall to prevent the liquid body in which material which is to be the hole injecting layer 8b or the light emitting layer 8c is dissolved or dispersed in a solvent from flowing into the adjacent pixel P through the bank 13.

For example, as shown in FIG. 5, since the opening edge of the opening section 13a of the bank 13 provided on the second insulating film 12 and the passivation film 14 is positioned on the inner side of the opening edge of the opening section 12a of the second insulating film 12, the bank 13 covers the entire second insulating film 12. With the configuration of the second insulating film 12 being wider than the bank 13, the opening section 13a is wider than the opening section 12a, and the side face of the opening edge of the opening section 12a of the second insulating film 12 can be exposed from the opening section 13a of the bank 13.

The liquid body including the material which is to be the hole injecting layer 8b is applied on each pixel electrode 8a surrounded by each opening section 13a, and the substrate 10 is heated as a whole, to dry the liquid body to form the compound film. This compound film is to be the hole injecting layer 8b which is the first carrier transporting layer.

The liquid body including the material which is to be the light emitting layer 8c is applied on each hole injecting layer 8b surrounded by each opening section 13a, and the substrate 10 is heated as a whole, to dry the liquid body to form the compound film. This compound film is to be the light emitting layer 8c which is the second carrier transporting layer.

The counter electrode 8d is provided so as to cover the light emitting layer 8c and the bank 13.

In the EL panel 1, in a bottom emission structure, the pixel electrode 8a, the substrate 10 and the first insulating film 11 are transparent, and the light emitted from the light emitting layer 8c transmits the pixel electrode 8a, the first insulating film 11 and the substrate 10 and exits. Therefore, the rear surface of the substrate 10 is to be the display surface.

The structure can be a top emission structure in which instead of the substrate 10 side, the opposite side is to be the display surface. In this case, as described above, the counter electrode 8d is to be the transparent electrode, the pixel electrode 8a is to be the reflecting electrode and the light emitted from the light emitting layer 8c transmits the counter electrode 8d and exits.

This EL panel 1 is driven and emits light as described in the following.

In a state where a predetermined level of voltage is applied to all voltage supplying lines 4, voltage is sequentially applied to the scanning line 2 by the scanning driver, and such scanning lines 2 are sequentially selected. The switch transistor 5 of each pixel P corresponding to the selected scanning line 2 is turned on.

When the data driver applies a voltage of a level according to the tone to all signal lines 3 when each scanning line 2 is selected, since the switch transistor 5 of each pixel P corresponding to the selected scanning line 2 is turned on, the voltage of the signal line 3 is applied to the gate electrode 6a of the driving transistor 6.

According to the voltage of the level corresponding to the predetermined tone applied on the gate electrode 6a of the driving transistor 6, the potential difference between the gate electrode 6a and the source electrode 6i of the driving transistor 6 is determined, the amount of the drain-source electric current in the driving transistor 6 is determined, and the EL element 8 emits light of a brightness according to the drain-source electric current of the EL element 8. Then, when the selection of the scanning line 2 is released, the switch transistor 5 is turned off, the electronic charge based on the voltage applied to the gate electrode 6a of the driving transistor 6 is stored in the capacitor 7 and the potential difference between the gate electrode 6a and the source electrode 6i of the driving transistor 6 is maintained. Therefore, the driving transistor 6 flows the drain-source electric current with the same electric current value as the time of selection, and the brightness of the EL element 8 is maintained.

In other words, the switch transistor 5 switches the voltage applied to the gate electrode 6a of the driving transistor 6 to the voltage of the predetermined tone level applied to the signal line 3, the driving transistor 6 flows the drain-source electric current (driving electric current) of the electric current value according to the level of the voltage applied to the gate electrode 6a from the voltage supplying line 4 to the EL element 8, and the EL element 8 emits light at a predetermined tone according to the electric current value (electric current density).

As described above, the EL element 8 emits light by driving and control of the transistor structure 56 including the switch transistor 5 and the driving transistor 6, and the EL panel 1 emits light.

Next, the manufacturing method of the switch transistor 5 and the driving transistor 6 composing the transistor structure 56 in the EL panel 1 of the present invention is described using FIG. 7A and FIG. 7B to FIG. 17A and FIG. 17B showing each process.

Regarding the switch transistor 5 and the driving transistor 6 shown in the diagram explaining each step, a part of the shape and the like is different from the actual embodiment, however, to simplify explanation, each thin film transistor is shown to be the same size and the main section of each thin film transistor is schematically illustrated and explained. FIG. A of each number shows the driving transistor 6 and FIG. B of each number shows the switch transistor 5.

Figure 7A:
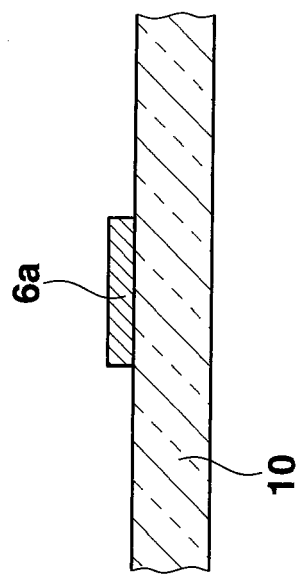
FIG. 7A is an explanatory diagram showing a manufacturing step of a thin film transistor of embodiment 1.
Figure 7B:
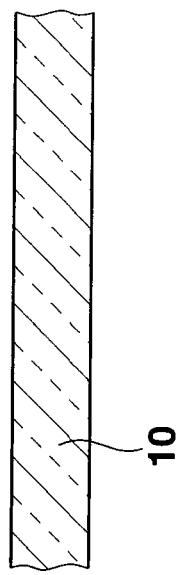
FIG. 7B is an explanatory diagram showing a manufacturing step of a thin film transistor of embodiment 1.

First, as shown in FIG. 7A and FIG. 7B, a gate metal layer including, for example, a Cr film, an Al film, a Cr/Al laminated film, an AlTi alloy film or an AlTiNd alloy film, etc. is accumulated on the substrate 10 by sputtering and patterned by photolithography, etching, etc. to form the first gate electrode 6a of the driving transistor 6. Moreover, the signal line 3 and the electrode 7a of the capacitor 7 are formed on the substrate 10 with the first gate electrode 6a (see FIG. 5 and FIG. 6).

Next, as shown in FIG. 8A and FIG. 8B, the first insulating film 11 such as silicon nitride, etc. is formed by plasma CVD (PE-CVD).

Moreover, as shown in FIG. 8A and FIG. 8B, the semiconductor layer 9b including crystalline silicon is formed on the first insulating film 11 by plasma CVD. When the semiconductor layer 9b which is to be the semiconductor film (5b, 6b) is formed, the first silicon layer 91 with a relatively high degree of crystallization of silicon is formed first, and then a second silicon layer 92 with a relatively low degree of crystallization of silicon is formed. Preferably, the second silicon layer 92 is substantially only amorphous silicon.

Specifically, the first silicon layer 91 is formed after plasma degradation of $SiH_4$ gas and $H_2$ gas, and by setting the rate of the $H_2$ gas overwhelmingly larger compared to the $SiH_4$ gas and by making the plasma power and the pressure large to raise the degree of crystallization, the first silicon layer 91 which is a microcrystalline silicon thin film can be formed. In the present embodiment, the first silicon layer 91 is formed under conditions of using argon as a carrier gas, setting the gas flow rate to $SiH_4/H_2$=50/10500 [SCCM], setting power density at 0.134 [W/cm$^2$] and setting the pressure at 300 [Pa]. Then, the rate of the $H_2$ gas compared to $SiH_4$ gas is decreased, and the plasma power and the pressure is decreased to form the second silicon layer 92 which is an amorphous silicon thin film.

The surface of the first silicon layer 91 which is the microcrystalline silicon thin film tends to be uneven. However, since the second silicon layer 92 which is the amorphous silicon thin film is layered on the first silicon layer 91, the unevenness of the surface of the first silicon layer 91 is covered and moderated by the second silicon layer 92.

Instead of forming the first silicon layer 91 by plasma CVD, the first silicon layer 91 can be formed by a method of emitting laser light to the amorphous silicon thin film to be reformed to the microcrystalline silicon thin film. In this case, after forming the amorphous silicon thin film on the first insulating film 11, the substrate is taken out of the chamber of the CVD apparatus and laser light emitting processing is performed to form the first silicon layer 91, and then the substrate is put in the chamber of the CVD apparatus again to layer the second silicon layer 92 on the first silicon layer 91.

Figure 59:
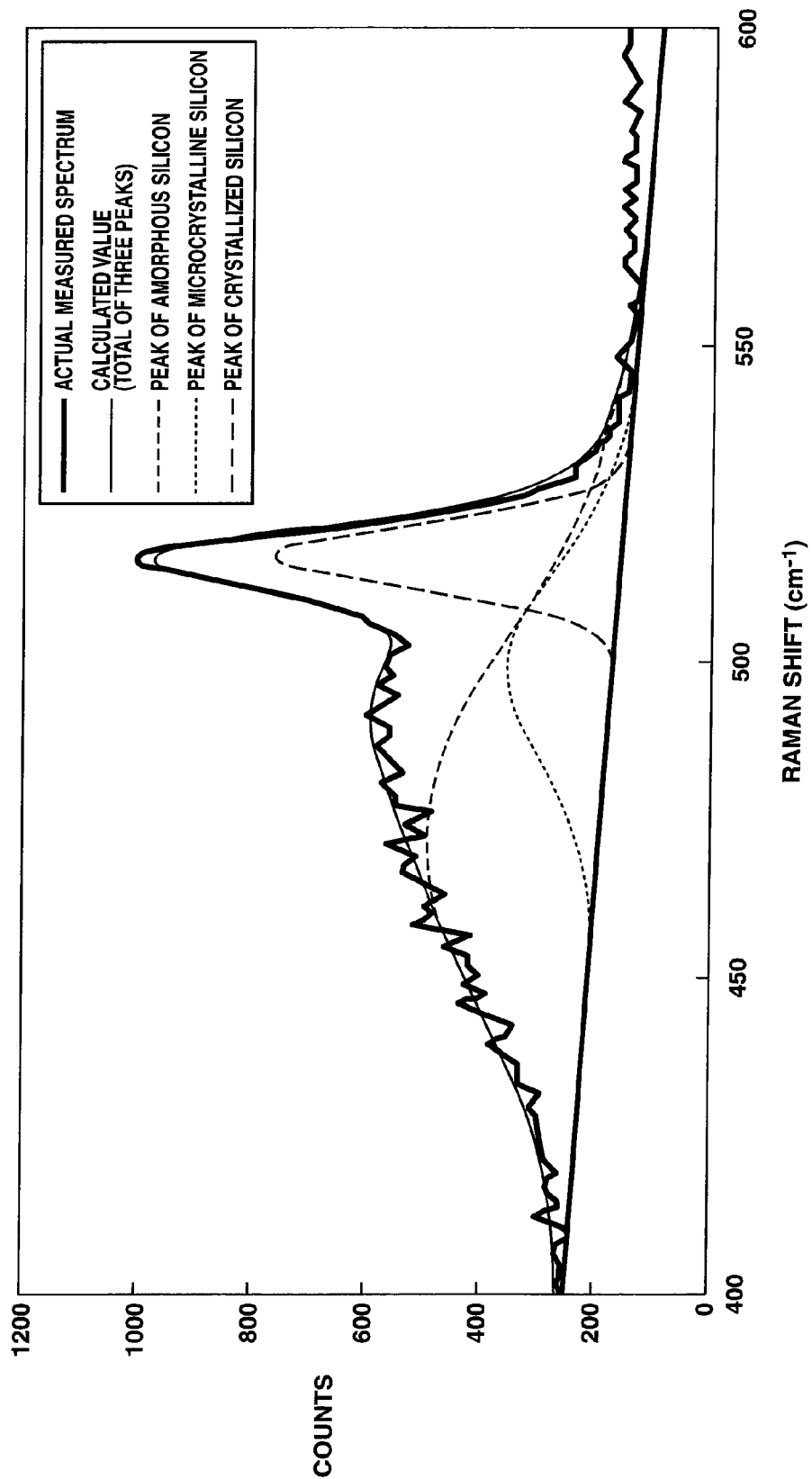
FIG. 59 is a diagram for explaining a method of measuring degree of crystallization of a semiconductor by Raman spectrometric method.

The degree of crystallization of silicon of the first silicon layer 91 and the second silicon layer 92 in the semiconductor layer 9b (the first portion and the second portion in the semiconductor film) can be determined based on the degree of crystallization calculated by, for example, raman spectrophotometry. For example, amorphous silicon provides a spectrum including a broad peak at around 480 cm$^{-1}$. The very minute crystalline silicon of the grain boundary or with a crystal diameter of 5 nm or less provides a spectrum including a broad peak at around 500 cm$^{-1}$. The crystallized silicon provides a spectrum including a relatively sharp peak at around 520 cm$^{-1}$. The spectrum of the silicon thin film of the first silicon layer 91 and the second silicon layer 92 which is the object of measurement can be represented by combining, for example, as shown in FIG. 59, each component spectrum, in other words, each spectrum of amorphous silicon, very minute crystalline silicon of the grain boundary or with a crystal diameter of 5 nm or less, and crystallized silicon, at a certain ratio. By obtaining the certain ratio by well known methods of analysis, the degree of crystallization d (%) can be obtained. The degree of crystallization d (%) can be calculated by the following formula 1 when the intensity of the component spectrum of the amorphous silicon is $I_{a-Si}$, the intensity of the component spectrum of the very minute crystalline silicon of the grain boundary or with a crystal diameter of 5 nm or less is $I_{uc-Si}$ and the intensity of the component spectrum of the crystallized silicon is $I_{c-Si}$, included in a spectrum of a silicon thin film.

$$d(\%)=(I_{c-Si}+I_{uc-Si})/(I_{c-Si}+I_{uc-Si}+I_{a-Si})\times 100 \qquad (1)$$

The higher the degree of crystallization d (%) is, the more crystallized silicon is included in the silicon thin film. When the degree of crystallization is 20% or more, it is defined to be a microcrystalline silicon thin film, and when the degree of crystallization is less than 20%, it is defined to be an amorphous silicon thin film.

Moreover, as preprocessing of forming the semiconductor layer 9b on the first insulating film 11, it is preferable to perform plasma processing on the surface of the first insulating film 11. When the plasma processing is performed on the first insulating film 11, the surface of the first insulating film 11 is reformed, and the degree of crystallization of the crystalline silicon formed on the first insulating film 11 can be raised.

The plasma processing of the present embodiment can be performed under conditions such as using N$_2$O gas, setting the gas flow rate to 2000 [SCCM], setting the power density to 0.356 [W/cm$^2$] and setting the pressure to 80 [Pa]. In the plasma processing, N$_2$O gas is used, however, instead of N$_2$O gas, oxygen gas or hydrogen gas can be used under suitable conditions.

Moreover, as shown in FIG. 8A and FIG. 8B, the protective insulating layer 9d such as silicon nitride is formed on the semiconductor layer 9b (second silicon layer 92) by the CVD method, etc.

Figure 9A:
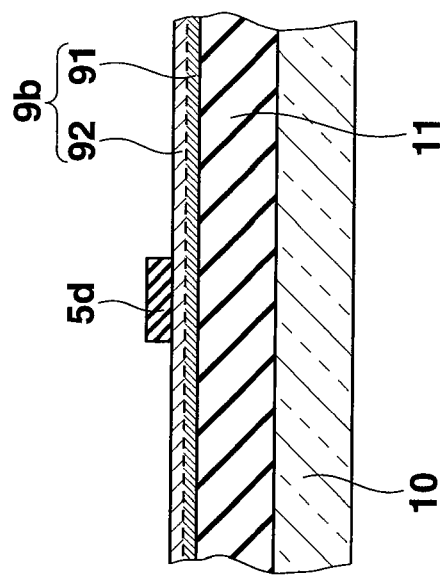
FIG. 9A is an explanatory diagram showing a manufacturing step of a thin film transistor of embodiment 1.
Figure 9B:
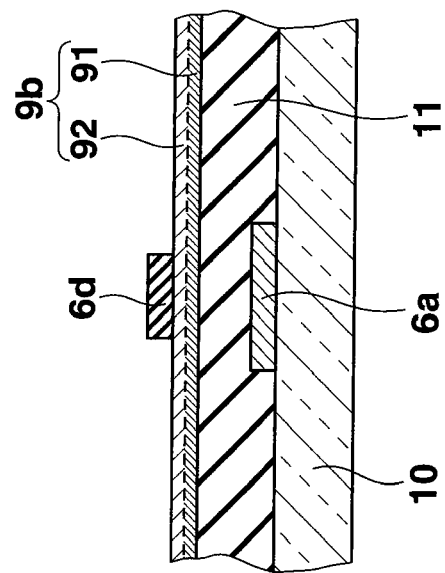
FIG. 9B is an explanatory diagram showing a manufacturing step of a thin film transistor of embodiment 1.

Next, as shown in FIG. 9A and FIG. 9B, the protective insulating layer 9d is patterned by photolithography, etching, etc. and the protective insulating film 6d of the driving transistor 6 and the protective insulating film 5d of the switch transistor 5, which cover the portion which is to be the channel on the semiconductor layer 9b, are formed.

Here, since the first silicon layer 91 is covered by the second silicon layer 92, when the protective insulating layer 9d is patterned by etching, the first silicon layer 91 is not subjected to the etching environment, and therefore, the first silicon layer 91 of the semiconductor layer 9b does not receive damage such as reduction of film.

For example, conventionally, in a structure where the semiconductor layer is a single layer of a crystalline silicon (specifically microcrystalline silicon), since there are many uneven parts on the surface of the semiconductor layer, when dry etching is performed to form the channel protective film on the channel forming portion of the semiconductor layer, the etching gas may pass the sunken part of the crystalline silicon and reach the first insulating film under the semiconductor layer, and a part of the first insulating film may be scraped. When a part of the first insulating film is scraped and the impurity semiconductor film and the source-drain electrode are layered on the semiconductor layer with crystalline silicon with many uneven parts, a thin film transistor with a normal structure cannot be formed, a defect may occur in the electric current path between the source electrode and the drain electrode and a problem such as conduction trouble may occur.

According to the semiconductor layer 9b of the present embodiment, the second silicon layer 92 of the amorphous silicon thin film is layered on the first silicon layer 91 of the microcrystalline silicon thin film, and the unevenness of the first silicon layer 91 is covered. Therefore, the semiconductor layer 9b and the first insulating film 11 are not damaged by etching and the protective insulating film 6d of the driving transistor 6 and the protective insulating film 5d of the switch transistor 5 can be favorably formed.

Next, as shown in FIG. 10A and FIG. 10B, the impurity semiconductor layer 9f which is to be the impurity semiconductor film is formed by sputtering or CVD method on the semiconductor layer 9b on which the protective insulating films 6d and 5d are formed.

The material used as the impurity semiconductor layer 9f is different according to whether the switch transistor 5 and the driving transistor 6 are p-type or n-type. In a p-type transistor (p+Si), the layer is formed by forming a film of plasma mixing an acceptor type impurity such as diborane, etc. in SiH$_4$ gas. In an n-type transistor (n+Si), the layer is formed by forming a film of plasma by mixing a donor type impurity such as arsine, phosphine, etc. in the SiH$_4$ gas.

Figure 11A:
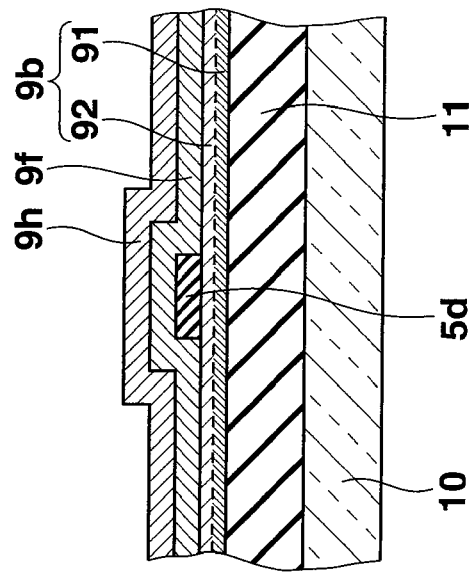
FIG. 11A is an explanatory diagram showing a manufacturing step of a thin film transistor of embodiment 1.
Figure 11B:
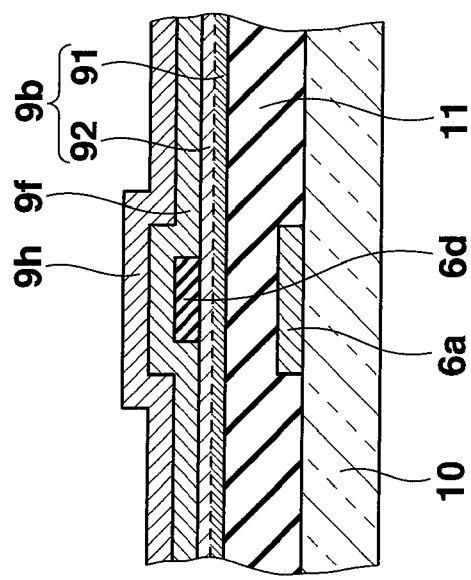
FIG. 11B is an explanatory diagram showing a manufacturing step of a thin film transistor of embodiment 1.

Next, as shown in FIG. 11A and FIG. 11B, the conducting film 9h which is to be the source electrode and the drain electrode is formed by, for example, sputtering on the impurity semiconductor layer 9f.

Figure 12A:
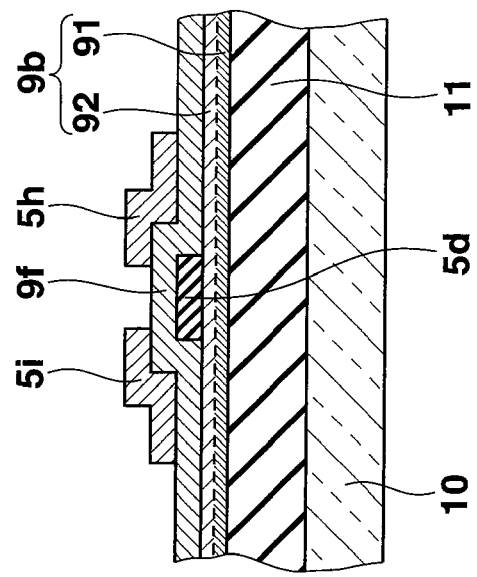
FIG. 12A is an explanatory diagram showing a manufacturing step of a thin film transistor of embodiment 1.
Figure 12B:
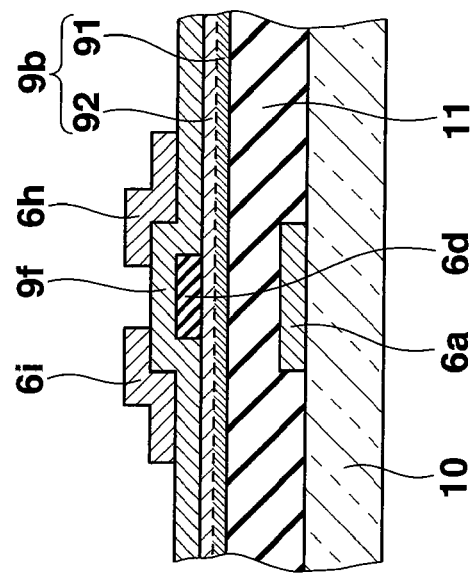
FIG. 12B is an explanatory diagram showing a manufacturing step of a thin film transistor of embodiment 1.

Next, as shown in FIG. 12A and FIG. 12B, the conducting film 9h is patterned by photolithography, etching, etc. and the source electrode 6i and the drain electrode 6h of the driving transistor 6, the source electrode 5i and the drain electrode 5h of the switch transistor 5 are formed, and moreover, the voltage supplying line 4, and the electrode 7b of the capacitor 7 are also formed. (see FIG. 4, FIG. 5 and FIG. 6).

Next, as shown in FIG. 13A and FIG. 13B, the source electrode 6i and the drain electrode 6h and the source electrode 5i and the drain electrode 5h are used as a mask and the impurity semiconductor layer 9f and the semiconductor layer 9b are patterned by dry etching and the impurity semiconductor films 6f and 6g and the first semiconductor film 6b, and the impurity semiconductor films 5f and 5g and the second semiconductor film 5b are formed. The first semiconductor film 6b includes the first portion 61 and the second portion 62 and the second semiconductor film 5b includes the first portion 51 and the second portion 52.

Next, as shown in FIG. 14A and FIG. 14B, the second insulating film 12 which covers the source electrode 6i and the drain electrode 6h of the driving transistor 6 and the source electrode 5i and the drain electrode 5h of the switch transistor 5 is formed.

Before forming the second insulating film 12, the pixel electrode 8a conducted with the source electrode 6i of the driving transistor 6 is formed (see FIG. 5). Alternatively, a contact hole can be formed in the second insulating film 12 after the second insulating film 12 is formed, and the pixel electrode 8a can be formed on the second insulating film 12 and in the contact hole so that the pixel electrode 8a is conductive with the source electrode 6i of the driving transistor 6 through the contact hole.

Figure 15B:
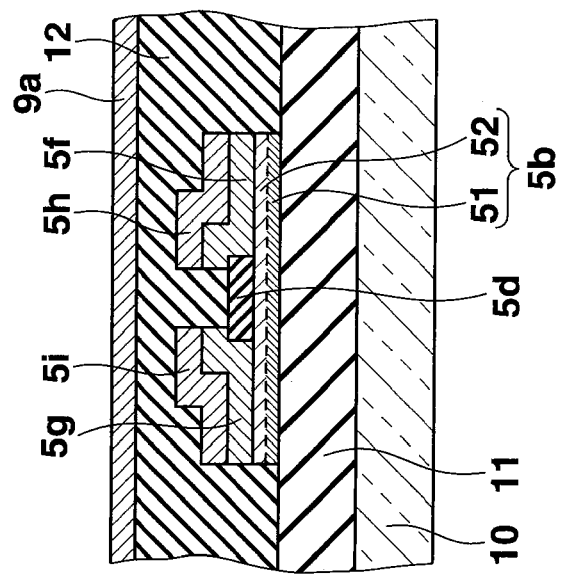
FIG. 15B is an explanatory diagram showing a manufacturing step of a thin film transistor of embodiment 1.
Figure 15A:
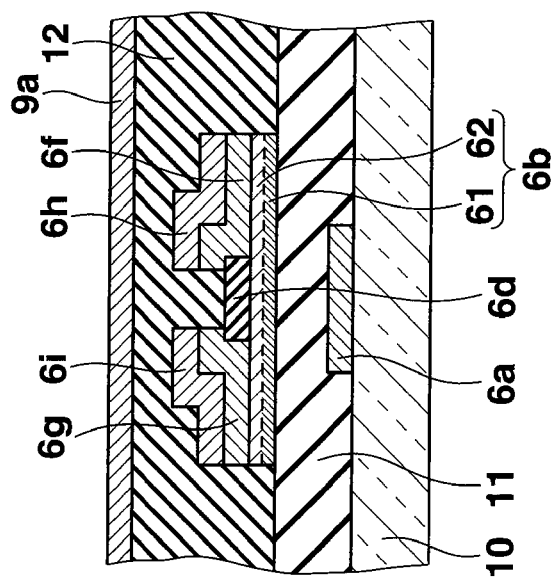
FIG. 15A is an explanatory diagram showing a manufacturing step of a thin film transistor of embodiment 1.

Next, as shown in FIG. 15A and FIG. 15B, a gate metal layer 9a of, for example, a Cr film, an Al film, a Cr/Al laminated film, an AlTi alloy film or an AlTiNd alloy film, etc. is formed by sputtering, etc. on the second insulating film 12.

Figure 16B:
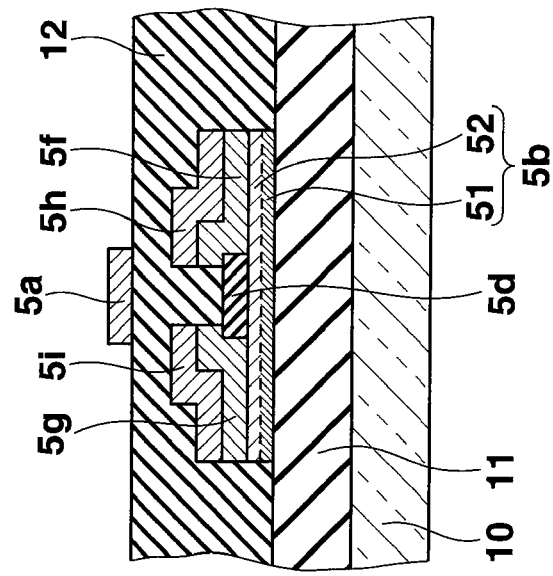
FIG. 16B is an explanatory diagram showing a manufacturing step of a thin film transistor of embodiment 1.
Figure 16A:
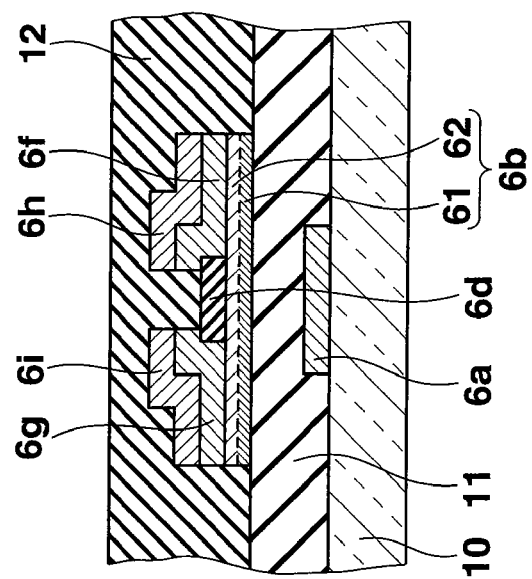
FIG. 16A is an explanatory diagram showing a manufacturing step of a thin film transistor of embodiment 1.

Next, as shown in FIG. 16A and FIG. 16B, the gate metal layer 9a is patterned using photolithography, etching, etc. and the second gate electrode 5a of the switch transistor 5 is formed. The scanning line 2 and the conducting layer 4a are formed with the second gate electrode 5a (see FIG. 4).

Figure 17B:
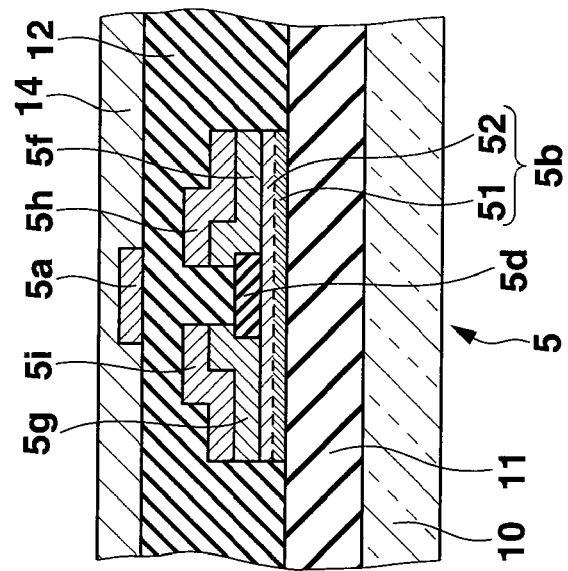
FIG. 17B is an explanatory diagram showing a manufacturing step of a thin film transistor of embodiment 1.
Figure 17A:
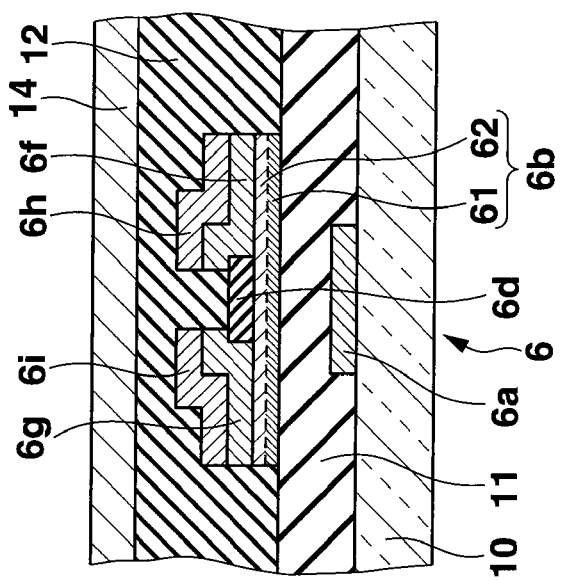
FIG. 17A is an explanatory diagram showing a manufacturing step of a thin film transistor of embodiment 1.

Next, as shown in FIG. 17A and 17B, the passivation film 14 such as silicon nitride covering the second gate electrode 5a is formed on the second insulating film 12.

With this, the driving transistor 6 and the switch transistor 5 are manufactured.

Moreover, an opening section 12a which exposes the center section of the pixel electrode 8a is formed by patterning the passivation film 14 and the second insulating film 12 using photolithography (see FIG. 5).

Next, after accumulating photosensitive resin such as polyimide, a bank 13 in a shape such as a grid like shape which includes an opening section 13a to expose the pixel electrode 8a is formed by exposing light (see FIG. 5).

Next, a liquid body in which material which is to be the hole injecting layer 8b is dissolved or dispersed in a solvent is applied in the opening section 13a of the bank 13, and the liquid body is dried to form the hole injecting layer 8b which is a carrier transport layer. Then, a liquid body in which material which is to be the light emitting layer 8c is dissolved or dispersed in a solvent is applied in the opening section 13a of the bank 13 on the hole injecting layer 8b, and the liquid body is dried to form the light emitting layer 8c (see FIG. 5).

Next, the counter electrode 8d is formed on an entire surface of the bank 13 and the light emitting layer 8c to manufacture the EL element 8 (see FIG. 5) and the EL panel 1 is manufactured.

As described above, when the driving transistor 6 which is the first thin film transistor of the bottom gate structure, and the switch transistor 5 which is the second thin film transistor of the top gate structure are formed, the step to form the first gate electrode 6a of the driving transistor 6 between the substrate 10 and the first insulating film 11 is a different step from the step to form the second gate electrode 5a of the switch transistor 5 between the second insulating film 12 and the passivation film 14, and the other configuration of the thin film transistor can be formed by common steps.

In other words, according to the manufacturing method of manufacturing by common manufacturing steps in the steps other than the step to form the first gate electrode 6a of the driving transistor 6 and the step to form the second gate electrode 5a of the switch transistor 5, the driving transistor 6 and the switch transistor 5 can be formed separately.

According to the manufacturing method of the transistor structure 56 which forms the transistor structure 56 with common manufacturing steps other than the first gate electrode 6a of the driving transistor 6 and the second gate electrode 5a of the switch transistor 5, the number of steps for manufacturing can be reduced and the driving transistor 6 and the switch transistor 5 can be formed separately with fewer steps than conventional methods.

In the second semiconductor film 5b of the switch transistor 5, since the second portion 52 is positioned on the second gate electrode 5a side, the second portion 52 which is the portion in the second semiconductor film 5b including more amorphous silicon is to be the electric current path of the channel, and the switch transistor 5 includes the function corresponding to the thin film transistor including the semiconductor film including amorphous silicon. The switch transistor 5 suitably functions as the thin film transistor which controls the on/off of the driving transistor 6.

In the first semiconductor film 6b of the driving transistor 6, since the first portion 61 is positioned on the first gate electrode 6a side, the first portion 61 which is the portion in the first semiconductor film 6b including more crystalline silicon is to be the electric current path of the channel, and the driving transistor 6 includes the function corresponding to the thin film transistor including the substrate film including crystalline silicon. The driving transistor 6 suitably functions as the thin film transistor to flow electric current in the EL element 8 by control of the switch transistor 5.

As described above, the driving transistor 6 and the switch transistor 5 include different transistor characteristics, and each transistor exhibit each function so that the EL panel 1 can emit light favorably.

When the protective insulating film 6d of the driving transistor 6 and the protective insulating film 5d of the switch transistor 5 is formed, the second silicon layer 92 (second portion 62) including more amorphous silicon covers the first silicon layer 91 (first portion 61) including more crystalline silicon, and therefore the semiconductor layer 9b is not damaged. The first semiconductor film 6b of the driving transistor 6 and the second semiconductor film 5b of the switch transistor 5 can be suitably formed without damage and the driving transistor 6 and the switch transistor 5 can function favorably.

(Embodiment 2)

Next, the EL panel and the transistor structure of embodiment 2 of the present invention are described. The same reference numerals are applied to the components which are similar to embodiment 1 and the description is omitted.

Figure 18:
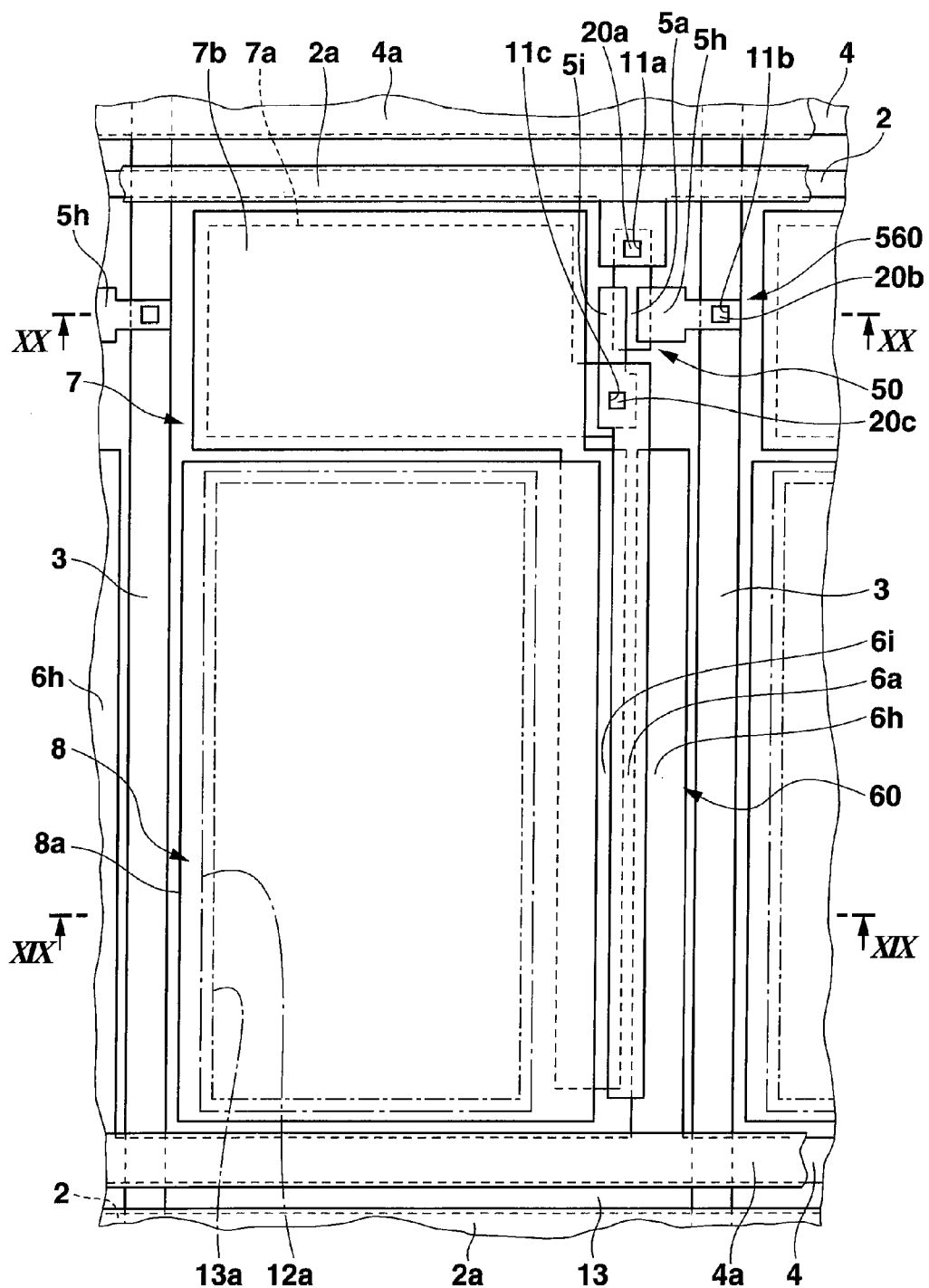
FIG. 18 is a planar view showing one pixel of an EL panel of embodiment 2.
Figure 19:
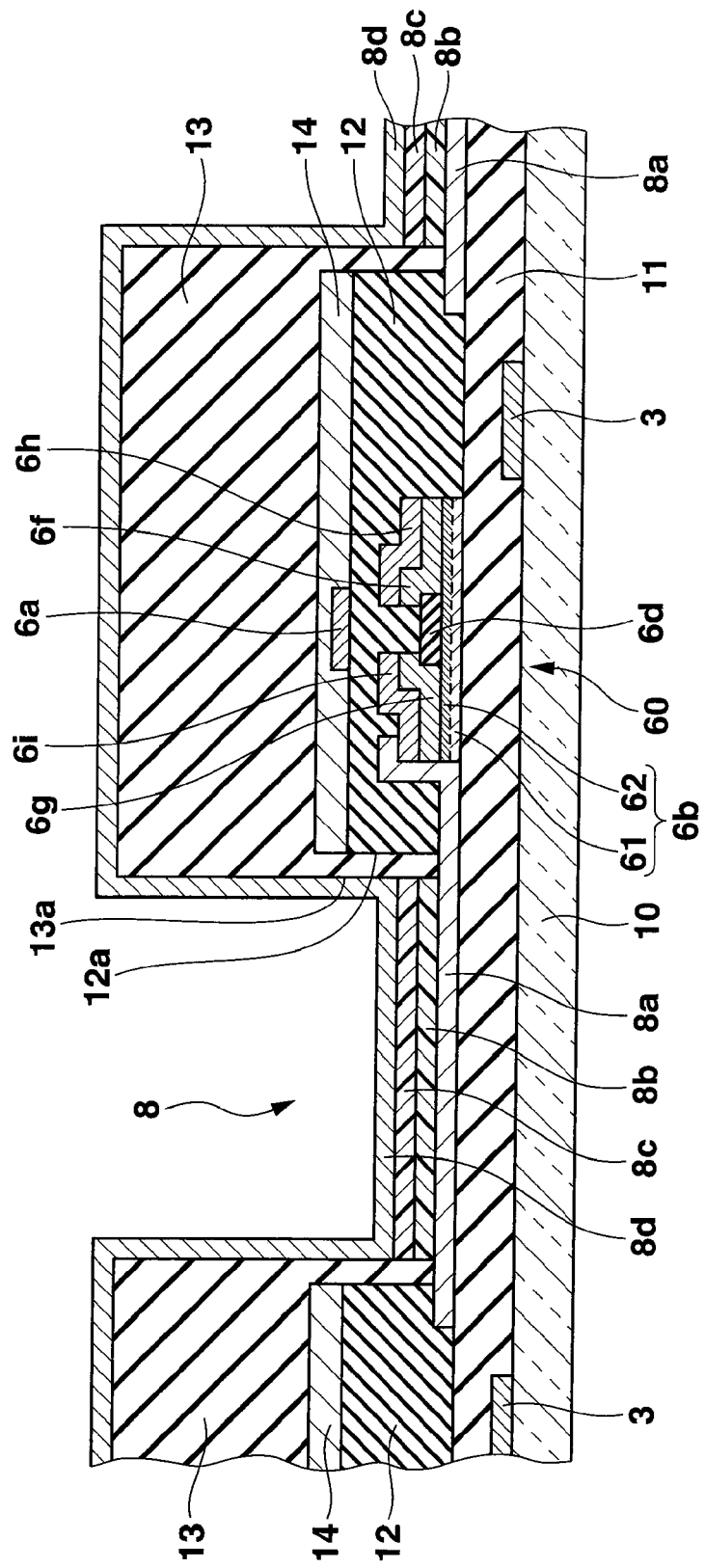
FIG. 19 is a cross sectional view of a plane along arrows XIX-XIX shown in FIG. 18.
Figure 20:
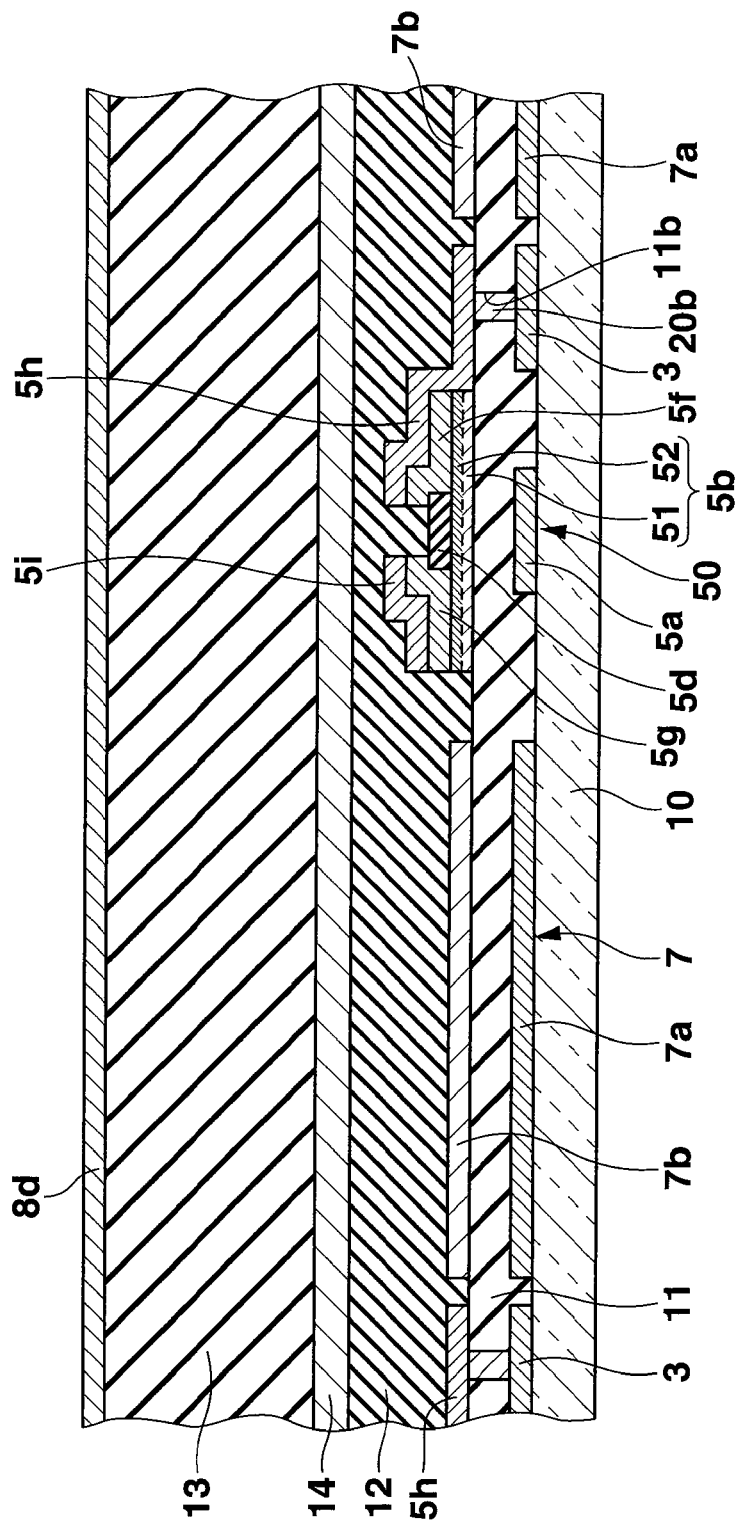
FIG. 20 is a cross sectional view of a plane along arrows XX-XX shown in FIG. 18.

The transistor structure 560 of the EL panel 1 of embodiment 2 is described with reference to FIG. 18 to FIG. 20. Here, FIG. 18 is a planar view corresponding to one pixel P of the EL panel 1, FIG. 19 is a cross sectional view of a plane along arrows XIX-XIX shown in FIG. 18 and FIG. 20 is a cross sectional view of a plane along arrows XX-XX shown in FIG. 18. FIG. 18 mainly shows electrodes and lines.

As shown in FIG. 18, the transistor structure 560 of each pixel P includes the switch transistor 50 and the driving transistor 60. The switch transistor 50 which is a first thin film transistor and the driving transistor 60 which is a second thin film transistor are arranged along the signal line 3, the capacitor 7 is positioned near the switch transistor 50 and the EL element 8 is positioned near the driving transistor 60. Moreover, in each pixel P, the switch transistor 50, the driving transistor 60, the capacitor 7 and the EL element 8 are positioned between the scanning line 2 and the voltage supplying line 4.

As shown in FIG. 18 to FIG. 20, a first gate electrode 5a is provided on the substrate 10, and a first insulating film 11 is formed on an upper surface of the substrate 10 so as to cover the first gate electrode 5a. On the first insulating film 11, a first semiconductor film 5b and a second semiconductor film 6b, a pair of impurity semiconductor films 5f, 5g, 6f and 6g, and drain electrodes 5h and 6h and source electrodes 5i and 6i are each formed on a predetermined position, and a second insulating film 12 is formed so as to cover the drain electrodes 5h and 6h and the source electrodes 5i and 6i. A second gate electrode 6a is provided on the second insulating film 12 and a passivation film 14 is formed on the upper surface of the second insulating film 12 so as to cover the second gate electrode 6a.

Moreover, the signal line 3 is formed between the substrate 10 and the first insulating film 11.

The scanning line 2 is formed on the first insulating film 11. A groove (not shown) is formed along the scanning line 2 on a part of the second insulating film 12 on the scanning line 2, and a conducting layer 2a which covers the scanning line 2 is provided in the groove so that the scanning line 2 and the conducting layer 2a are conducted.

The voltage supplying line 4 is formed on the first insulating film 11. A groove (not shown) is formed along the voltage supplying line 4 on the part of the second insulating film 12 on the voltage supplying line 4, and a conducting layer 4a which covers the voltage supplying line 4 is provided in the groove. By layering the conducting layer 4a so that the conducting layer 4a is in contact with the voltage supplying line 4, there is an aim to lower the resistance of the voltage supplying line 4 and to stabilize the amount of electric current supplied to the EL element 8 through the driving transistor 60.

Moreover, as shown in FIG. 18 and FIG. 20, the switch transistor 50 is a first thin film transistor with a bottom gate structure including an inversely staggered structure. The switch transistor 50 includes a first gate electrode 5a, a first semiconductor film 5b, a protective insulating film 5d, impurity semiconductor films 5f and 5g, drain electrode 5h, source electrode 5i, and the like.

The first gate electrode 5a is formed between the substrate 10 and the first insulating film 11. It is preferable that the first gate electrode 5a is formed from material selected from, for example, a Cr film, an Al film, a Cr/Al laminated film, an AlTi alloy film and an AlTiNd alloy film. The first insulating film 11 with insulating properties is formed on the first gate electrode 5a and the first gate electrode 5a is covered by the first insulating film 11. The first insulating film 11 includes, for example light permeability and includes silicon nitride or silicon oxide. The intrinsic first semiconductor film 5b is formed in a position on the first insulating film 11 corresponding to the first gate electrode 5a. The first semiconductor film 5b faces the first gate electrode 5a with the first insulating film 11 in between.

The first semiconductor film 5b includes, for example, crystalline silicon, especially microcrystalline silicon and includes a first portion 51 positioned on the first insulating film 11 side (first gate electrode 5a side) and a second portion 52 positioned on the opposite surface side. Here, degree of crystallization of silicon of the second portion 52 is formed higher than the first portion 51. In other words, in the second portion 52 of the first semiconductor film 5b, the degree of crystallization of silicon is relatively higher compared to the first portion 51, and the rate of the crystalline silicon portion is higher than the first portion 51. In the first portion 51 of the first semiconductor film 5b, the rate of the amorphous silicon portion is large compared to the second portion 52, and preferably, the first portion 51 of the first semiconductor film 5b is a portion with substantially only amorphous silicon. A channel is formed on the first semiconductor film 5b. Moreover, a protective insulating film 5d with insulating properties is formed on a center section of the first semiconductor film 5b.

It is preferable that the protective insulating film 5d includes, for example, silicon nitride or silicon oxide.

Moreover, on one edge section of the first semiconductor film 5b, an impurity semiconductor film 5f is formed so that a part overlaps with the protective insulating film 5d, and on the other edge section of the first semiconductor film 5b, an impurity semiconductor film 5g is formed so that a part overlaps with the protective insulating film 5d. As described here, the impurity semiconductor films 5f and 5g are formed apart from each other on each edge side of the first semiconductor film 5b. The impurity semiconductor films 5f and 5g are n-type semiconductors including n-type impurity, however, it is not limited to the above, and when the switch transistor 50 is a p-type transistor, a p-type semiconductor can be used.

The drain electrode 5h is formed on the impurity semiconductor film 5f. The source electrode 5i is formed on the impurity semiconductor film 5g. It is preferable that the drain electrode 5h and the source electrode 5i are formed from material selected from, for example, a Cr film, an Al film, a Cr/Al laminated film, an AlTi alloy film, and an AlTiNd alloy film.

On the protective insulating film 5d, the drain electrode 5h and the source electrode 5i, a second insulating film 12 with insulating properties is formed, and the protective insulating film 5d, the drain electrode 5h, the source electrode 5i, etc. are covered by the second insulating film 12. The second insulating film 12 includes, for example, silicon nitride or silicon oxide.

The passivation film 14 is formed on the second insulating film 12. The passivation film includes, for example, silicon nitride or silicon oxide.

The switch transistor 50 is covered by the second insulating film 12 and the passivation film 14.

In the switch transistor 50, the first insulating film 11 functions as a gate insulating film, and a channel (channel portion) is formed in the portion of the first semiconductor film 5b covered by the protective insulating film 5d and acted on by the electric field of the first gate electrode 5a. Specifically, a channel is formed in a first portion 51 of the first semiconductor film 5b which is the first gate electrode 5a side of the first semiconductor film 5b, and the first portion 51 is the electric current path between the source electrode 5i and the drain electrode 5h.

The first portion 51 of the first semiconductor film 5b is a semiconductor layer including more amorphous silicon and the switch transistor 50 which uses the first portion 51 as the electric current path of the channel corresponds to a thin film transistor including a semiconductor film made from amorphous silicon (or a semiconductor film including amorphous silicon as a main component). In other words, the leak current is smaller in the amorphous silicon of the first portion 51 of the switch transistor 50 compared to the crystalline silicon such as microcrystalline silicon and (electric current which flows in the semiconductor layer when on)/(electric current which flows in the semiconductor layer when off) is high. Therefore, the above suitably functions as the switch transistor which controls the on/off of the driving transistor 6.

As shown in FIG. 18 and FIG. 19, the driving transistor 60 is a second thin film transistor with a top gate structure including an inversely staggered structure. The driving transistor 60 includes a second gate electrode 6a, a second semiconductor film 6b, a protective insulating film 6d, impurity semiconductor films 6f and 6g, drain electrode 6h, source electrode 6i and the like.

The first insulating film 11 with insulating properties formed on the upper surface of the substrate 10 includes, for example, light permeability and includes silicon nitride or silicon oxide. An intrinsic second semiconductor film 6b is formed on the first insulating film 11 in a position which is to correspond with the second gate electrode 6a.

The second semiconductor film 6b includes, for example, crystalline silicon, especially microcrystalline silicon and includes a first portion 61 positioned on the first insulating film 11 side and a second portion 62 positioned on the opposite surface side (second gate electrode 6a side). Here, degree of crystallization of silicon of the second portion 62 is formed higher than the first portion 61. In other words, in the second portion 62 of the second semiconductor film 6b, the degree of crystallization of silicon is relatively higher compared to the first portion 61, and the rate of the crystalline silicon portion is higher than the first portion 61. In the first portion 61 of the second semiconductor film 6b, the rate of the amorphous silicon portion is large compared to the second portion 62, and preferably, the first portion 61 of the second semiconductor film 6b is a portion with substantially only amorphous silicon. The first portion 61 of the second semiconductor film 6b and the first portion 51 of the first semiconductor film 5b have the same composition and have the same thickness. The second portion 62 of the second semiconductor film 6b and the second portion 52 of the first semiconductor film 5b have the same composition and have the same thickness. Therefore, as described later, the second semiconductor film 6b and the first semiconductor film 5b can be manufactured collectively with the same process using the semiconductor layer 9 which is a layer with the same material. The second semiconductor film 6b is a channel portion where the channel is formed. Moreover, on a center section of the second semiconductor film 6b, the protective insulating film 6d with insulating properties is formed.

The protective insulating film 6d and the protective insulating film 5d are composed of the same material and have the same thickness, and preferably include, for example, silicon nitride or silicon oxide. Therefore, as described later, the protective insulating film 6d and the protective insulating film 5d can be manufactured collectively with the same process using the protective insulating layer 9d which is a layer with the same material.

Moreover, on one edge section of the second semiconductor film 6b, the impurity semiconductor film 6f is formed so that a part overlaps with the protective insulating film 6d, and on the other edge section of the second semiconductor film 6b, the impurity semiconductor film 6g is formed so that a part overlaps with the protective insulating film 6d. As described here, the impurity semiconductor films 6f and 6g are formed apart on each edge side of the second semiconductor film 6b. The impurity semiconductor films 6f and 6g are n-type semiconductors including n-type impurity, however it is not limited to the above, and when the switch transistor 5 and the driving transistor 6 are p-type transistors, a p-type semiconductor can be used. The impurity semiconductor films 6f and 6g and the impurity semiconductor films 5f and 5g are composed of the same material and have the same thickness. As described later, the impurity semiconductor films 6f and 6g and the impurity semiconductor films 5f and 5g can be manufactured collectively with the same process using the impurity semiconductor layer 9f which is a layer with the same material.

The drain electrode 6h is formed on the impurity semiconductor film 6f. The source electrode 6i is formed on the impurity semiconductor film 6g. It is preferable that the drain electrode 6h and the source electrode 6i are formed from material selected from, for example, a Cr film, an Al film, a Cr/Al laminated film, an AlTi alloy film and an AlTiNd alloy film. The drain electrode 6h, the source electrode 6i, the drain electrode 5h and the source electrode 5i are composed of the same material and have the same thickness. As described later, the drain electrode 6h, the source electrode 6i, the drain electrode 5h and the source electrode 5i can be manufactured collectively with the same process using the conducting film 9h which is a layer with the same material.

A second insulating film 12 with insulating properties is formed on the protective insulating film 6d, the drain electrode 6h and the source electrode 6i, and the protective insulating film 6d, the drain electrode 6h, the source electrode 6i, etc. are covered by the second insulating film 12.

The second gate electrode 6a is formed in a position corresponding to the protective insulating film 6d on the second insulating film 12. It is preferable that the second gate electrode 6a is formed from material selected from, for example, a Cr film, an Al film, a Cr/Al laminated film, an AlTi alloy film and an AlTiNd alloy film. The second gate electrode 6a on the second insulating film 12 is covered by the passivation film 14.

In the driving transistor 60, the second insulating film 12 and the protective insulating film 6d function as a gate insulating film, and a channel (channel portion) is formed in the portion of the second semiconductor film 6b covered by the protective insulating film 6d and acted on by the electric field of the second gate electrode 6a. Specifically, a channel is formed in a second portion 62 of the second semiconductor film 6b which is the second gate electrode 6a side of the second semiconductor film 6b, and the second portion 62 is the electric current path between the source electrode 6i and the drain electrode 6h.

The second portion 62 of the second semiconductor film 6b is a semiconductor layer including more crystalline silicon than the first portion 61. Therefore, the driving transistor 60 which uses the second portion 62 as the electric current path of the channel corresponds to a thin film transistor including a semiconductor film made from crystalline silicon (or a semiconductor film including crystalline silicon as the main component). In other words, the microcrystalline silicon in the second portion 62 of the driving transistor 60 is crystalline silicon with a grain diameter of about 50 to 100 nm. Therefore, the shift of threshold voltage by the driving of the transistor is small compared to the amorphous silicon and the deterioration of the transistor can be suppressed. Moreover, the degree of carrier mobility is high, and therefore suitably functions as a driving transistor which flows electric current in the EL element 8 by control of the switch transistor 50.

In the driving transistor 60 with a top gate structure, the electric current path of the channel in the second portion 62 of the second semiconductor film 6b is not on the interface side between the first portion 61 but is on the interface side between the protective insulating film 6d nearer to the second gate electrode 6a. Since the interface side between the protective insulating film 6d has a higher degree of crystallization of silicon than the interface side between the first portion 61 in the second portion 62 of the second semiconductor film 6b, the portion is suitable for the electric current path of the driving transistor 60.

This is because, since in the beginning of growth of the second portion 62 including crystalline silicon, the crystallization of silicon is not stable, and the degree of crystallization of silicon on the interface side between the first portion 61 in the second portion 62 causes a relatively bad incubation layer, and in the second portion 62 on the interface side between the protective insulating film 6d, a semiconductor film in which the crystallization of silicon is stable can be formed.

The second portion 62 on the interface side between the protective insulating film 6d formed with stable crystallization of silicon is more suitable as an electric current path. Therefore, by forming the top gate structure of the driving transistor 60 with the second portion 62 as the electric current path, the driving transistor 60 functions more suitably as a driving transistor.

The capacitor 7 is connected between the second gate electrode 6a and the source electrode 6i of the driving transistor 60. Specifically, the electrode 7a of the capacitor 7 is connected to the second gate electrode 6a of the driving transistor 6, and the electrode 7b of the capacitor 7 is connected to the source electrode 6i of the driving transistor 60. Then, as shown in FIG. 18 and FIG. 20, one electrode 7a of the capacitor 7 is formed between the substrate 10 and the first insulating film 11, and the other electrode 7b of the capacitor 7 is formed between the first insulating film 11 and the second insulating film 12. The electrode 7a and the electrode 7b face each other with the first insulating film 11, which is a dielectric material, in between.

The signal line 3, the electrode 7a of the capacitor 7, and the first gate electrode 5a of the switch transistor 50, are collectively formed by processing the shape of a conducting film formed on an entire surface of the substrate 10 by photolithography, etching, etc.

The scanning line 2, the voltage supplying line 4, the electrode 7b of the capacitor 7, the drain electrode 5h and the source electrode 5i of the switch transistor 50, and the drain electrode 6h and the source electrode 6i of the driving transistor 60 are collectively formed by processing the shape of a conducting film formed on an entire surface of the first insulating film 11 by photolithography, etching, etc.

The second gate electrode 6a of the driving transistor 60, the conducting layer 4a layered on the voltage supplying line 4 and the conducting layer 2a layered on the scanning line 2 are collectively formed by processing the shape of a conducting film formed on an entire surface of the second insulating film 12 by photolithography, etching, etc.

On the first insulating film 11, a contact hole 11a is formed on a portion where the first gate electrode 5a and the scanning line 2 overlaps, a contact hole 11b is formed on a portion where the drain electrode 5h and the signal line 3 overlaps and a contact hole 11c is formed on a portion where the second gate electrode 6a and the source electrode 5i overlaps. The contact hole 11c is formed in communication with the second insulating film 12. Contact plugs 20a to 20c are implanted in the contact holes 11a to 11c. The first gate electrode 5a of the switch transistor 50 and the scanning line 2 are electrically conducted by the contact plug 20a. The drain electrode 5h of the switch transistor 50 and the signal line 3 are electrically conducted by the contact plug 20b. The source electrode 5i of the switch transistor 50 and the electrode 7a of the capacitor 7 as well as the source electrode 5i of the switch transistor 50 and the second gate electrode 6a of the driving transistor 60 are electrically conducted by the contact plug 20c. The scanning line 2 can be conducted with the first gate electrode 5a by direct contact, the drain electrode 5h can be conducted with the signal line 3 by direct contact and the source electrode 5i can be conducted with the first gate electrode 6a by direct contact without using the contact plugs 20a to 20c.

The drain electrode 6h of the driving transistor 60 is connected as one with the voltage supplying line 4, and the source electrode 6i of the driving transistor 60 is connected as one with the electrode 7b of the capacitor 7.

Similar to the above, the EL element 8 emits light by driving and control of the transistor structure 560 including the switch transistor 50 and the driving transistor 60, and the EL panel 1 including the transistor structure 560 also emits light.

Next, the manufacturing method of the switch transistor 50 and the driving transistor 60 composing the transistor structure 560 in the EL panel 1 of the present invention is described using FIG. 21A and FIG. 21B to FIG. 31A and FIG. 31B showing each process.

Regarding the switch transistor 50 and the driving transistor 60 shown in the diagram explaining each step, a part of the shape and the like is different from the actual embodiment, however, to simplify explanation, each thin film transistor is shown to be the same size and the main section of each thin film transistor is schematically illustrated and explained. FIG. A of each number shows the driving transistor 60 and FIG. B of each number shows the switch transistor 50.

Figure 21B:
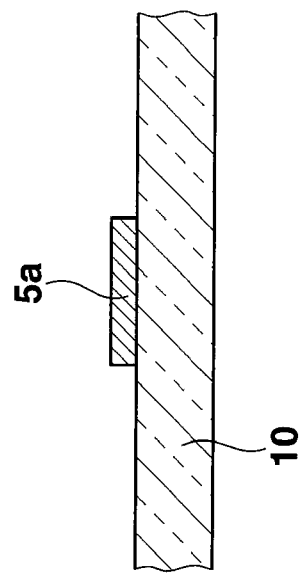
FIG. 21B is an explanatory diagram showing a manufacturing step of a thin film transistor of embodiment 2.
Figure 21A:
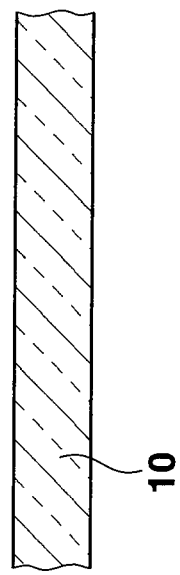
FIG. 21A is an explanatory diagram showing a manufacturing step of a thin film transistor of embodiment 2.

First, as shown in FIG. 21A and FIG. 21B, a gate metal layer including, for example, a Cr film, an Al film, a Cr/Al laminated film, an AlTi alloy film or an AlTiNd alloy film, etc. is accumulated on the substrate 10 by sputtering and patterned by photolithography, etching, etc. to form the first gate electrode 5a of the switch transistor 50. Moreover, the signal line 3 and the electrode 7a of the capacitor 7 are formed on the substrate 10 with the first gate electrode 5a (see FIG. 18 to FIG. 20).

Figure 22B:
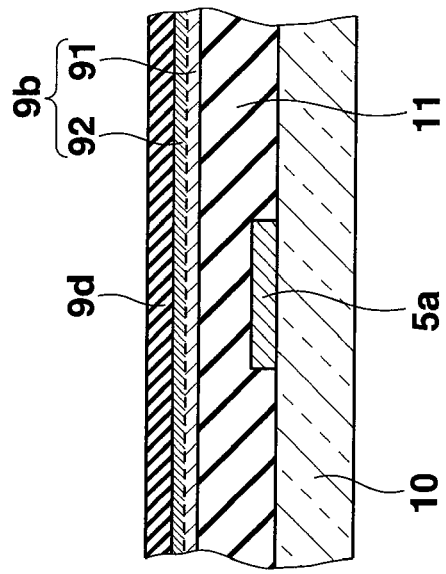
FIG. 22B is an explanatory diagram showing a manufacturing step of a thin film transistor of embodiment 2.
Figure 22A:
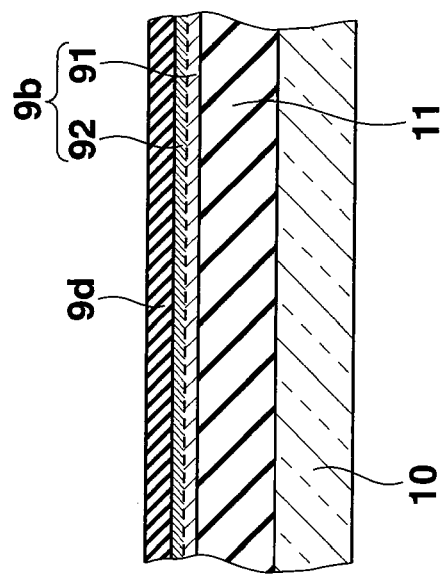
FIG. 22A is an explanatory diagram showing a manufacturing step of a thin film transistor of embodiment 2.

Next, as shown in FIG. 22A and FIG. 22B, the first insulating film 11 such as silicon nitride, etc. is formed by plasma CVD (PE-CVD).

Moreover, as shown in FIG. 22A and FIG. 22B, the semiconductor layer 9b including crystalline silicon is formed on the first insulating film 11 by plasma CVD. When the semiconductor layer 9b which is to be the semiconductor film (5b, 6b) is formed, the first silicon layer 91 with a relatively low degree of crystallization of silicon is formed first, and then a second silicon layer 92 with a relatively high degree of crystallization of silicon is formed.

Specifically, the first silicon layer 91 which is an amorphous silicon thin film is formed under the condition of the rate of the $H_2$ gas compared to $SiH_4$ gas being relatively low, and the plasma power and the pressure being low. Then, the second silicon layer 92 which is a microcrystalline silicon thin film is formed by setting the rate of the $H_2$ gas overwhelmingly larger compared to the $SiH_4$ gas and by making the plasma power and the pressure large to raise the degree of crystallization. In the present embodiment, the second silicon layer 92 is formed under conditions of using argon as a carrier gas, setting the gas flow rate to $SiH_4/H_2=50/10500$ [SCCM], setting power density at 0.134 [W/cm$^2$] and setting the pressure at 300 [Pa].

The degree of crystallization of silicon of the first silicon layer 91 and the second silicon layer 92 in the semiconductor layer 9b (the first portion and the second portion in the semiconductor film) can be determined based on the degree of crystallization calculated by raman spectrophotometry as described above. When the degree of crystallization is 20% or more, it is defined to be a microcrystalline silicon thin film, and when the degree of crystallization is less than 20%, it is defined to be an amorphous silicon thin film (see FIG. 59).

Moreover, as preprocessing of forming the semiconductor layer 9b on the first insulating film 11, it is preferable to perform plasma processing on the surface of the first insulating film 11. When the plasma processing is performed on the first insulating film 11, the surface of the first insulating film 11 is reformed, and the degree of crystallization of the crystalline silicon formed on the first insulating film 11 can be raised.

The plasma processing of the present embodiment can be performed under conditions such as using $H_2$ gas, setting the gas flow rate to 1000 [SCCM], setting the power density to 0.178 [W/cm$^2$] and setting the pressure to 80 [Pa].

Moreover, as shown in FIG. 22A and FIG. 22B, the protective insulating layer 9d such as silicon nitride is formed on the semiconductor layer 9b (second silicon layer 92) by the CVD method, etc.

Next, as shown in FIG. 23A and FIG. 23B, the protective insulating layer 9d is patterned by photolithography, etching, etc. and the protective insulating film 6d of the driving transistor 60 and the protective insulating film 5d of the switch transistor 50, which cover the portion which is to be the channel on the semiconductor layer 9b, are formed.

Figure 24B:
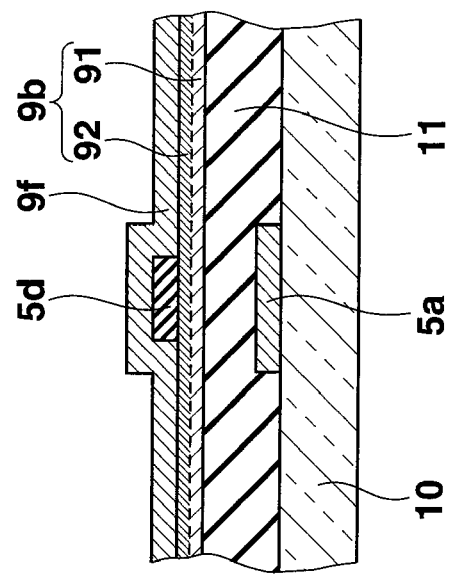
FIG. 24B is an explanatory diagram showing a manufacturing step of a thin film transistor of embodiment 2.
Figure 24A:
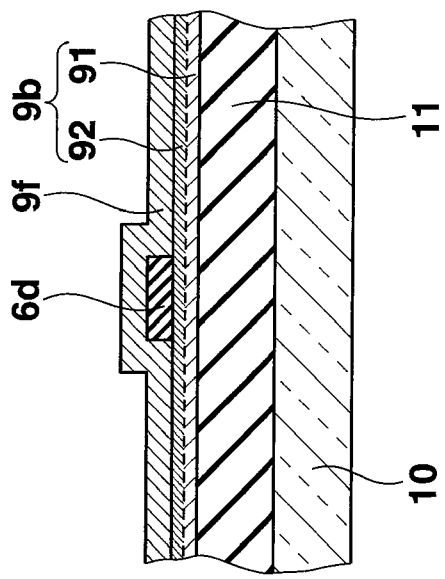
FIG. 24A is an explanatory diagram showing a manufacturing step of a thin film transistor of embodiment 2.

Next, as shown in FIG. 24A and FIG. 24B, the impurity semiconductor layer 9f which is to be the impurity semiconductor film is formed by sputtering or CVD method on the semiconductor layer 9b on which the protective insulating films 6d and 5d are formed.

The material used as the impurity semiconductor layer 9f is different according to whether the switch transistor 50 and the driving transistor 60 are p-type or n-type. In a p-type transistor (p+Si), the layer is formed by forming a film of plasma by mixing an acceptor type impurity such as diborane, etc. in $SiH_4$ gas. In an n-type transistor (n+Si), the layer is formed by forming a film of plasma by mixing a donor type impurity such as arsine, phosphine, etc. in the $SiH_4$ gas.

Next, as shown in FIG. 25A and FIG. 25B, the conducting film 9h which is to be the source electrode and the drain electrode is formed by, for example, sputtering on the impurity semiconductor layer 9f.

Next, as shown in FIG. 26A and FIG. 26B, the conducting film 9h is patterned by photolithography, etching, etc. and the source electrode 6i and the drain electrode 6h of the driving transistor 60, the source electrode 5i and the drain electrode 5h of the switch transistor 50 are formed, and moreover, the scanning line 2, the voltage supplying line 4, and the electrode 7b of the capacitor 7 are also formed. (see FIG. 18, FIG. 19 and FIG. 20).

Figure 27B:
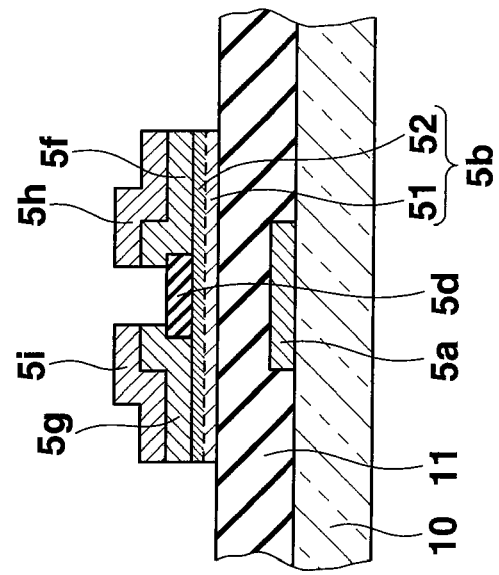
FIG. 27B is an explanatory diagram showing a manufacturing step of a thin film transistor of embodiment 2.
Figure 27A:
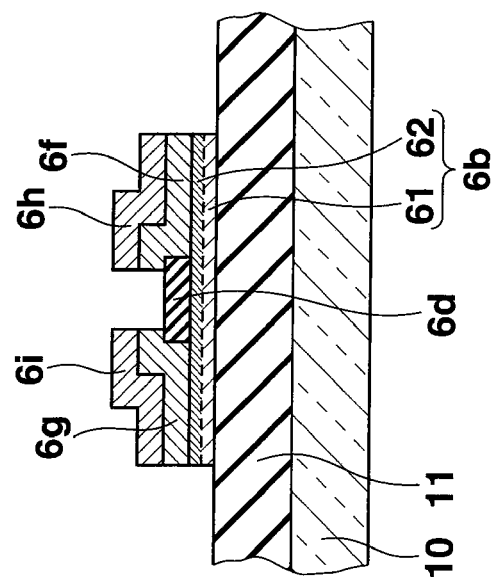
FIG. 27A is an explanatory diagram showing a manufacturing step of a thin film transistor of embodiment 2.

Next, as shown in FIG. 27A and FIG. 27B, the source electrode 6i and the drain electrode 6h and the source electrode 5i and the drain electrode 5h are used as a mask and the impurity semiconductor layer 9f and the semiconductor layer 9b are patterned by dry etching and the impurity semiconductor films 6f and 6g and the second semiconductor film 6b, and the impurity semiconductor films 5f and 5g and the first semiconductor film 5b are formed. The second semiconductor film 6b includes the first portion 61 and the second portion 62 and the first semiconductor film 5b includes the first portion 51 and the second portion 52.

Figure 28A:
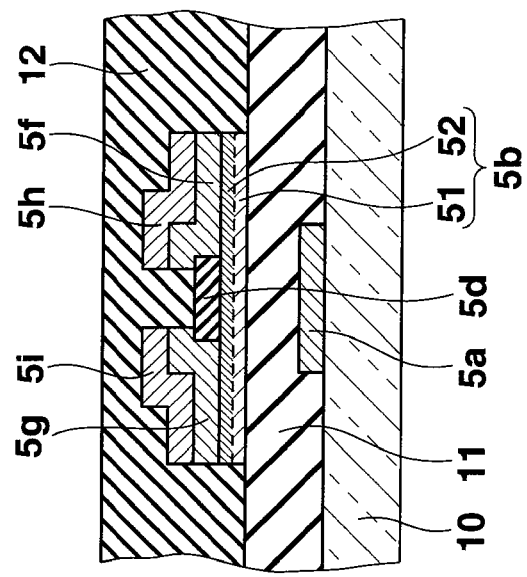
FIG. 28A is an explanatory diagram showing a manufacturing step of a thin film transistor of embodiment 2.
Figure 28B:
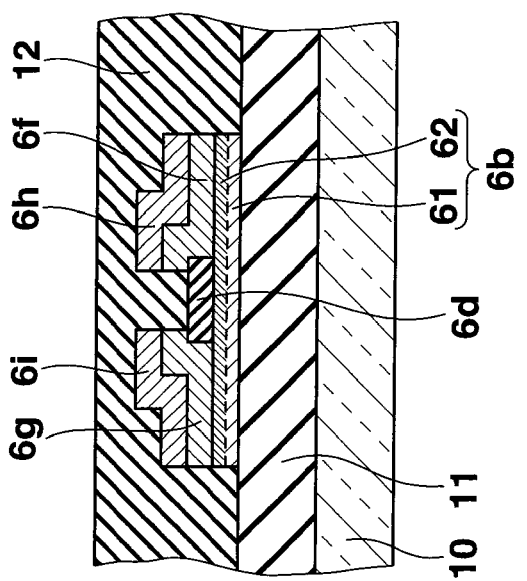
FIG. 28B is an explanatory diagram showing a manufacturing step of a thin film transistor of embodiment 2.

Next, as shown in FIG. 28A and FIG. 28B, the second insulating film 12 which covers the source electrode 6i and the drain electrode 6h of the driving transistor 60 and the source electrode 5i and the drain electrode 5h of the switch transistor 50 is formed.

Before forming the second insulating film 12, the pixel electrode 8a conducted with the source electrode 6i of the driving transistor 60 is formed (see FIG. 19). Alternatively, a contact hole can be formed in the second insulating film 12 after the second insulating film 12 is formed, and the pixel electrode 8a can be formed on the second insulating film 12 and in the contact hole so that the pixel electrode 8a is conductive with the source electrode 6i of the driving transistor 60 through the contact hole.

Figure 29B:
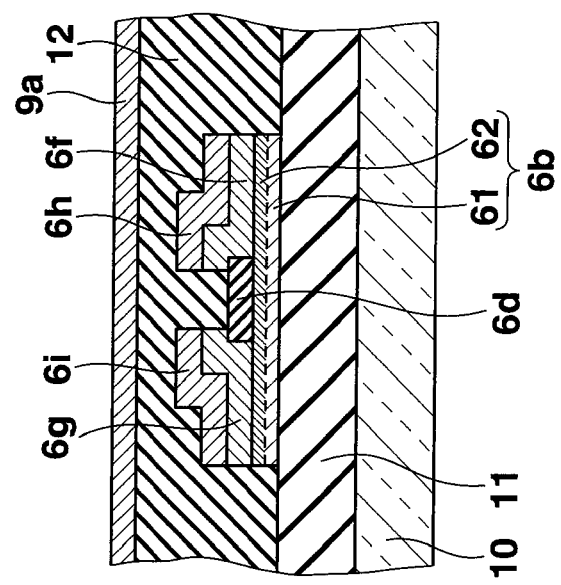
FIG. 29B is an explanatory diagram showing a manufacturing step of a thin film transistor of embodiment 2.
Figure 29A:
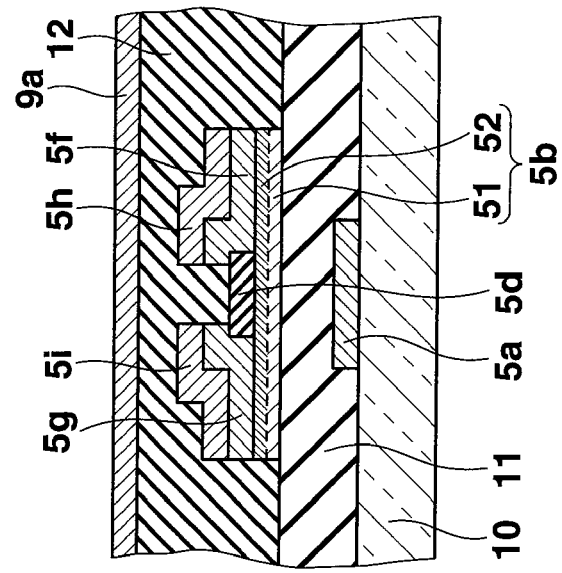
FIG. 29A is an explanatory diagram showing a manufacturing step of a thin film transistor of embodiment 2.

Next, as shown in FIG. 29A and FIG. 29B, a gate metal layer 9a of, for example, a Cr film, an Al film, a Cr/Al laminated film, an AlTi alloy film or an AlTiNd alloy film, etc. is formed by sputtering, etc. on the second insulating film 12.

Next, as shown in FIG. 30A and FIG. 30B, the gate metal layer 9a is patterned using photolithography, etching, etc. and the second gate electrode 6a of the driving transistor 60 is formed. The conducting layers 2a and 4a are formed with the second gate electrode 6a (see FIG. 18).

Next, as shown in FIG. 31A and 31B, the passivation film 14 such as silicon nitride covering the second gate electrode 6a is formed on the second insulating film 12.

With this, the driving transistor 60 and the switch transistor 50 are manufactured.

Moreover, an opening section 12a which exposes the center section of the pixel electrode 8a is formed by patterning the passivation film 14 and the second insulating film 12 using photolithography (see FIG. 19).

Next, after accumulating photosensitive resin such as polyimide, a bank 13 in a shape such as a grid like shape which includes an opening section 13a to expose the pixel electrode 8a is formed by exposing light (see FIG. 19).

Next, a liquid body in which material which is to be the hole injecting layer 8b is dissolved or dispersed in a solvent is applied in the opening section 13a of the bank 13, and the liquid body is dried to form a hole injecting layer 8b which is a carrier transport layer. Then, a liquid body in which material which is to be the light emitting layer 8c is dissolved or dispersed in a solvent is applied in the opening section 13a of the bank 13 on the hole injecting layer 8b, and the liquid body is dried to form the light emitting layer 8c (see FIG. 19).

Next, the counter electrode 8d is formed on an entire surface of the bank 13 and the light emitting layer 8c to manufacture the EL element 8 (see FIG. 19) and the EL panel 1 is manufactured.

As described above, when the switch transistor 5 which is the first thin film transistor of the bottom gate structure, and the driving transistor 6 which is the second thin film transistor of the top gate structure are formed, the step to form the first gate electrode 5a of the switch transistor 50 between the substrate 10 and the first insulating film 11 is a different step from the step to form the second gate electrode 6a of the driving transistor 60 between the second insulating film 12 and the passivation film 14, and the other configuration of the thin film transistor can be formed by common steps.

In other words, according to the manufacturing method of manufacturing by common manufacturing steps in the steps other than the step to form the first gate electrode 5a of the switch transistor 50 and the step to form the second gate electrode 6a of the driving transistor 60, the driving transistor 60 and the switch transistor 50 can be formed separately.

According to the manufacturing method of the transistor structure 560 which forms the transistor structure 560 with common manufacturing steps other than the first gate electrode 5a of the switch transistor 50 and the second gate electrode 6a of the driving transistor 60, the number of steps for manufacturing can be reduced and the driving transistor 60 and the switch transistor 50 can be formed separately with fewer steps than conventional methods.

In the first semiconductor film 5b of the switch transistor 50, since the first portion 51 is positioned on the first gate electrode 5a side, the first portion 51 which is the portion in the first semiconductor film 5b including more amorphous silicon is to be the electric current path of the channel, and the switch transistor 50 includes the function corresponding to the thin film transistor including the semiconductor film including amorphous silicon. The switch transistor 50 suitably functions as the thin film transistor which controls the on/off of the driving transistor 60.

In the second semiconductor film 6b of the driving transistor 60, since the second portion 62 is positioned on the second gate electrode 6a side, the second portion 62 which is the portion in the second semiconductor film 6b including more crystalline silicon is to be the electric current path of the channel, and the driving transistor 60 includes the function corresponding to the thin film transistor including the substrate film including crystalline silicon. The driving transistor 60 suitably functions as the thin film transistor to flow electric current in the EL element 8 by control of the switch transistor 50.

As described above, the driving transistor 60 and the switch transistor 50 include different transistor characteristics, and each transistor exhibit each function so that the EL panel 1 can emit light favorably.

Moreover, the top gate structure of the driving transistor 60 is formed including the electric current path in the second portion 62 on the interface side between the protective insulating film 6*d* where the crystallization of silicon is stable in the second semiconductor film 6*b*. Therefore, the driving transistor 60 favorably functions as the driving transistor.

Moreover, since the driving transistor 60 is formed with a top gate structure, the second gate electrode 6*a* blocks the electric field by the counter electrode 8*d* on the driving transistor 60 and the electric field by the counter electrode 8*d* does not act on the second semiconductor film 6*b* of the driving transistor. Since the second electrode 6*a* blocks the electric field by the counter electrode 8*d*, the voltage change between the source and the drain by the electric field can be prevented, the driving electric current of the driving transistor 60 reducing can be prevented and the function of the driving transistor 60 as the driving transistor can be maintained.

(Embodiment 3)

FIG. 1 is a planar view showing an arrangement structure of a plurality of pixels P in an EL panel 1 which is a light emitting apparatus. FIG. 2 is a planar view showing a schematic structure of the EL panel 1.

As shown in FIG. 1 and FIG. 2, a plurality of pixels P are arranged in a predetermined pattern in a matrix form on the EL panel 1. The plurality of pixels P include a red pixel P which emits light of R (red), green pixel P which emits light of G (green) and blue pixel P which emits light of B (blue).

On the EL panel 1, a plurality of scanning lines 2 are arranged along a row direction so as to be substantially parallel to each other, and a plurality of signal lines 3 are arranged along a column direction so as to be substantially parallel to each other and to be substantially orthogonal to the scanning lines 2 from a planar view. Voltage supplying lines 4 are provided along the scanning lines 2 in between adjacent scanning lines 2. The portion surrounded by two adjacent scanning lines 2 and two adjacent signal lines 3 correspond to pixel P.

Bank 13, which is a partition wall, is provided so as to cover above scanning lines 2, signal lines 3 and voltage supplying lines 4 on the EL panel 1. Bank 13 is provided in, for example, a grid like shape, and a plurality of opening sections 13*a* surrounded by the bank 13 in a substantial rectangular shape are formed for each pixel P. A predetermined carrier transporting layer (later described hole injecting layer 8*b* and light emitting layer 8*c*) is provided in the opening section 13*a* of the bank 13 and this is to be a light emitting portion of the pixel P. The carrier transporting layer is a layer which transports a hole or an electron by applying voltage. The bank 13 is not limited to the above, and instead of providing an opening section 13*a* for each pixel P, the bank 13 can cover the signal line 3 and extend along a column direction and include an opening section in a stripe shape which collectively exposes a center section of each later described pixel electrode 8*a* of the plurality of pixels P aligned in a column direction.

FIG. 3 is a circuit diagram showing an example of a circuit corresponding to one pixel of the EL panel 1 which is driven by an active matrix driving method.

As shown in FIG. 3, the EL panel 1 is provided with the scanning line 2, the signal line 3 which intersects with scanning line 2 and voltage supplying line 4 along the scanning line 2. Each pixel P of the EL panel 1 is provided with a switch transistor 5 which is a second thin film transistor, a driving transistor 6 which is a first thin film transistor, a capacitor 7, and an EL element 8 which is a light emitting element. The switch transistor 5 and the driving transistor 6 function as driving elements which allow the EL element 8 to emit light.

In each pixel P, a gate of the switch transistor 5 is connected to the scanning line 2, either one of a drain or a source of the switch transistor 5 is connected to the signal line 3, the other of either of the drain or the source of the switch transistor 5 is connected to one of an electrode of the capacitor 7 and a gate of the driving transistor 6. Either one of a drain or a source of the driving transistor 6 is connected to the voltage supplying line 4 and the other of either of the drain or the source of the driving transistor 6 is connected to the other electrode of the capacitor 7 and an anode of the EL element 8. All cathodes of the EL element 8 of the pixel P are maintained at a constant voltage Vcom (for example, grounded).

Moreover, each scanning line 2 is connected to a scanning driver in a periphery of the EL panel 1, each voltage supplying line 4 is connected to a voltage source which outputs a constant voltage or a voltage driver which suitably outputs a voltage signal and each signal line 3 is connected to a data driver, and the EL panel 1 is driven by an active matrix driving method using these drivers. The constant voltage from the voltage source or the voltage signal from the voltage driver is supplied to the voltage supplying line 4.

Figure 32:
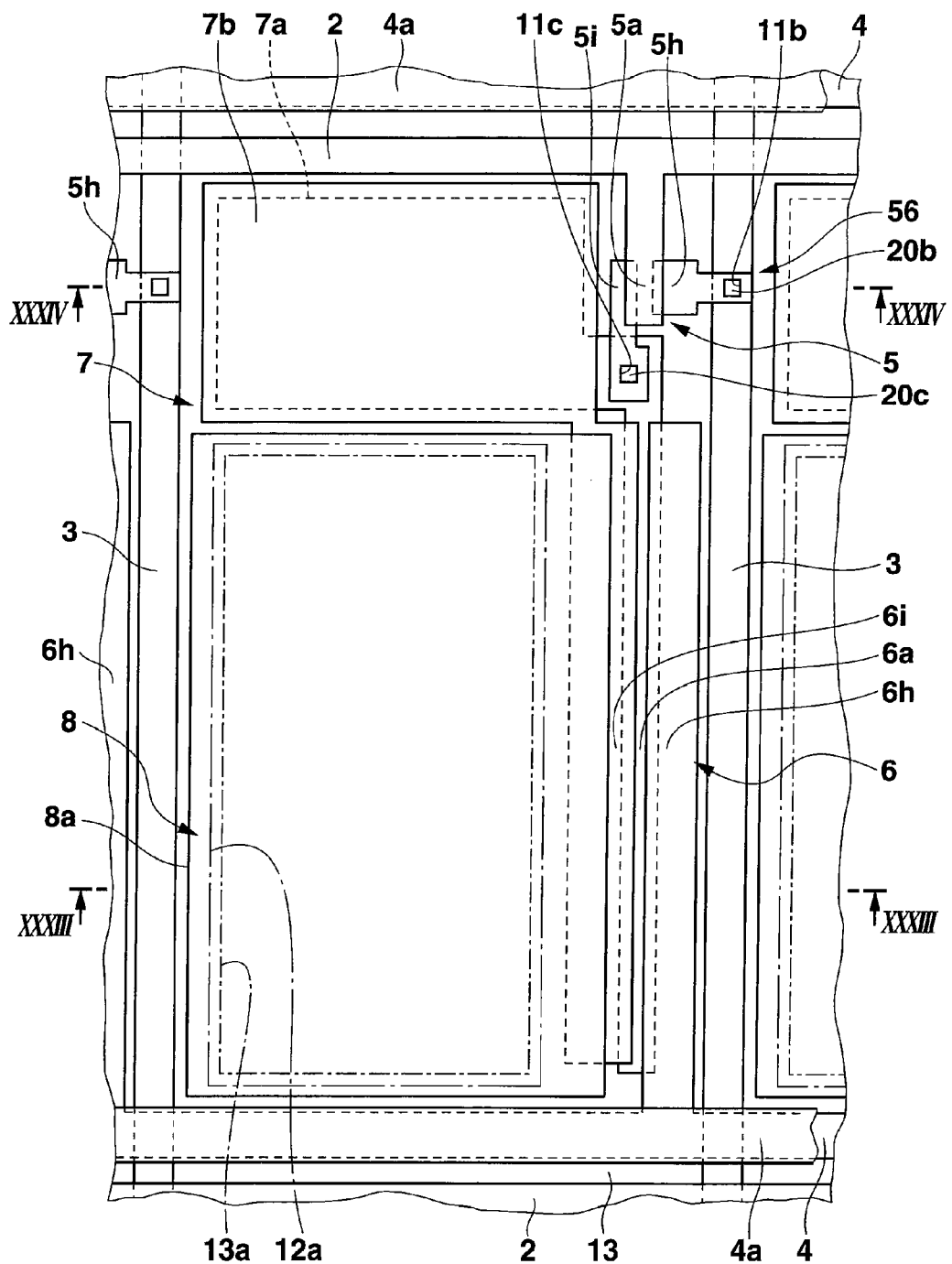
FIG. 32 is a planar view showing one pixel of an EL panel of embodiment 3.
Figure 33:
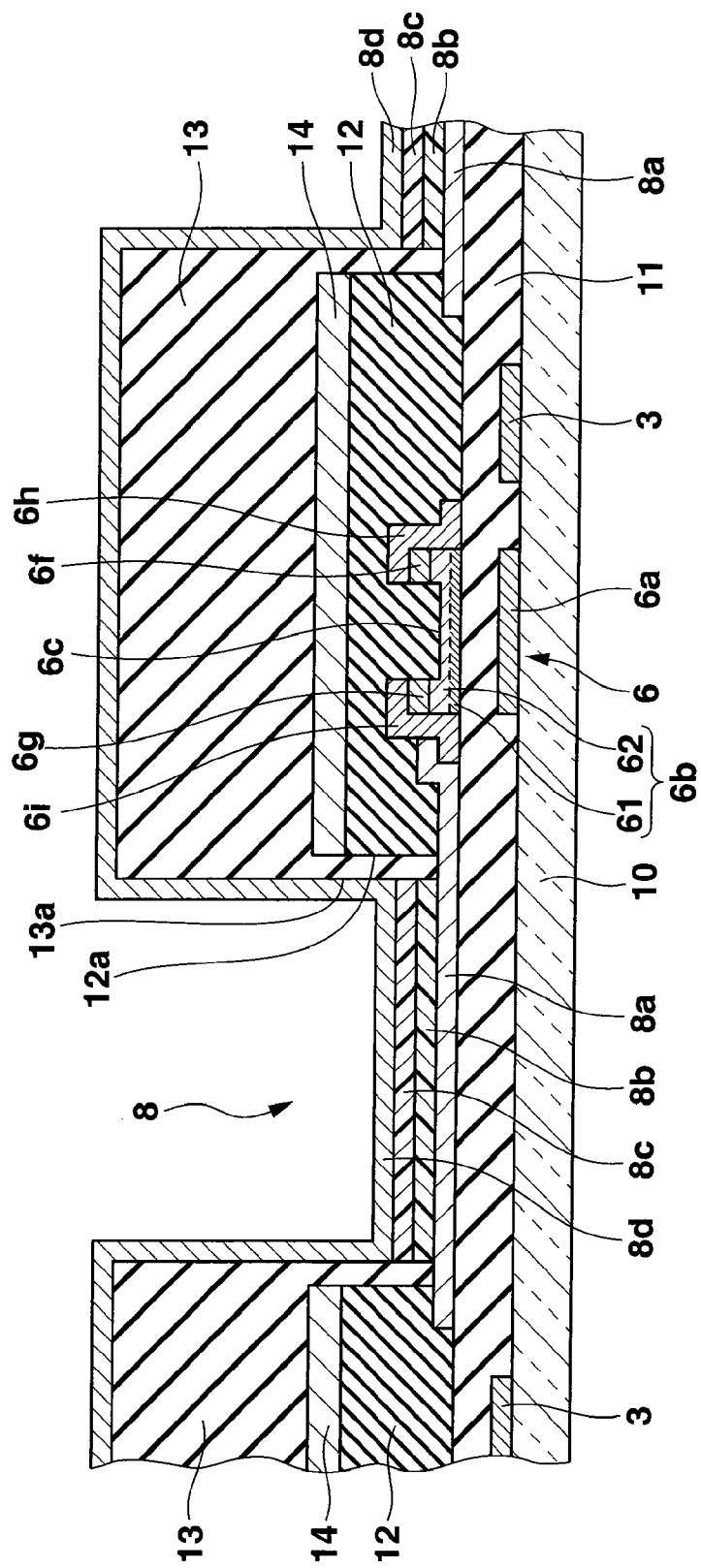
FIG. 33 is a cross sectional view of a plane along arrows XXXIII-XXXIII shown in FIG. 32.
Figure 34:
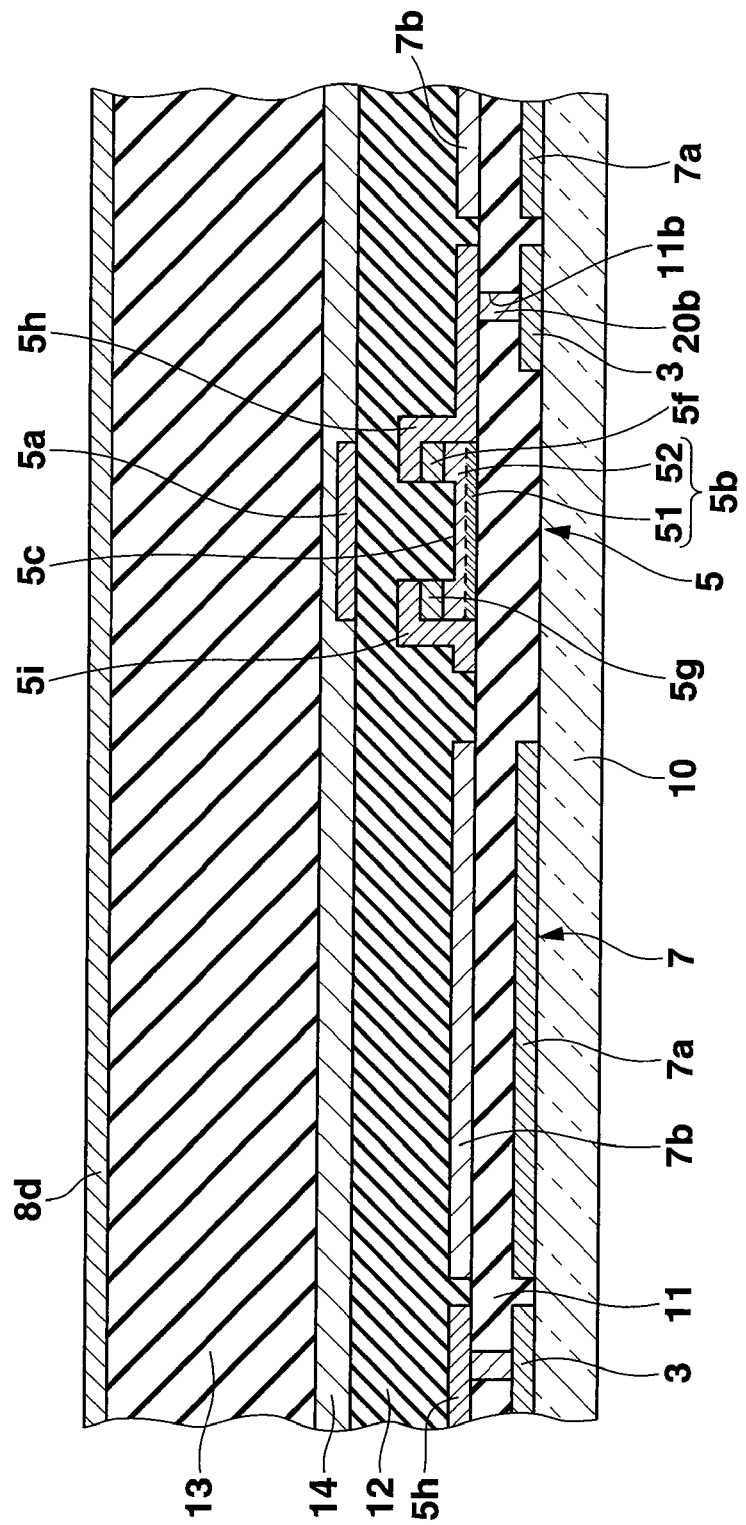
FIG. 34 is a cross sectional view of a plane along arrows XXXIV-XXXIV shown in FIG. 32.

Next, the circuit configuration of the EL panel 1 and the pixel P is described using FIG. 32 to FIG. 34. Here, FIG. 32 is a planar view corresponding to one pixel P of the EL panel 1, FIG. 33 is a cross sectional view of a plane along arrows XXXIII-XXXIII shown in FIG. 32 and FIG. 34 is a cross sectional view of a plane along arrows XXXIV-XXXIV shown in FIG. 32. FIG. 32 mainly shows electrodes and lines.

As shown in FIG. 32, the transistor structure 56 of each pixel P includes the switch transistor 5 and the driving transistor 6. The switch transistor 5 and the driving transistor 6 are arranged along the signal line 3, the capacitor 7 is positioned near the switch transistor 5 and the EL element 8 is positioned near the driving transistor 6. Moreover, in each pixel P, the switch transistor 5, the driving transistor 6, the capacitor 7 and the EL element 8 are positioned between the scanning line 2 and the voltage supplying line 4.

As shown in FIG. 32 to FIG. 34, a first gate electrode 6*a* is provided on the substrate 10, and a first insulating film 11 is formed on an upper surface of the substrate 10 so as to cover the first gate electrode 6*a*. On the first insulating film 11, a second semiconductor film 5*b* and a first semiconductor film 6*b*, a pair of impurity semiconductor films 5*f*, 5*g*, 6*f* and 6*g*, and drain electrodes 5*h* and 6*h* and source electrodes 5*i* and 6*i* are each formed, and a second insulating film 12 is formed so as to cover the drain electrodes 5*h* and 6*h* and the source electrodes 5*i* and 6*i*. A second gate electrode 5*a* is provided on the second insulating film 12 and a passivation film 14 is formed on the upper surface of the second insulating film 12 so as to cover the second gate electrode 5*a*.

The drain electrode 6*h* and the source electrode 6*i* of the driving transistor 6 are connected to an edge section of the first semiconductor film 6*b* through a pair of impurity semiconductor films 6*f* and 6*g* each provided on each of a pair of edge sections with a depressed section 6*c* of the first semiconductor film 6b in between. The drain electrode 5h and the source electrode 5i of the switch transistor 5 are connected to an edge section of the second semiconductor film 5b through a pair of impurity semiconductor films 5f and 5g each provided on each of a pair of edge sections with a depressed section 5c of the second semiconductor film 5b in between.

Moreover, the signal line 3 is formed between the substrate 10 and the first insulating film 11.

The scanning line 2 is formed between the second insulating film 12 and the passivation film 14.

The voltage supplying line 4 is formed on the first insulating film 11. A groove (not shown) is formed along the voltage supplying line 4 on the part of the second insulating film 12 on the voltage supplying line 4, and a conducting layer 4a which covers the voltage supplying line 4 is provided in the groove. By layering the conducting layer 4a so that the conducting layer 4a is in contact with the voltage supplying line 4, there is an aim to lower the resistance of the voltage supplying line 4 and to stabilize the amount of electric current supplied to the EL element 8 through the driving transistor 6.

Moreover, as shown in FIG. 32 and FIG. 34, the switch transistor 5 is a second thin film transistor with a top gate structure of a channel etching type including an inversely staggered structure. The switch transistor 5 includes a second gate electrode 5a, a second semiconductor film 5b, impurity semiconductor films 5f, 5g, a second drain electrode 5h, a second source electrode 5i, and the like.

The first insulating film 11 with insulating properties formed on the upper surface of the substrate 10 includes, for example, light permeability and includes silicon nitride or silicon oxide. An intrinsic second semiconductor film 5b is formed on the first insulating film 11 in a position which is to correspond with the second gate electrode 5a.

The second semiconductor film 5b includes, for example, crystalline silicon, especially microcrystalline silicon and includes a first portion 51 positioned on the first insulating film 11 side and a second portion 52 positioned on the opposite surface side and on the second insulating film 12 side. Here, degree of crystallization of silicon of the first portion 51 is formed higher than the second portion 52. In other words, in the first portion 51 of the second semiconductor film 5b, the degree of crystallization of silicon is relatively higher compared to the second portion 52, and the rate of the crystalline silicon portion is higher than the second portion 52. In the second portion 52 of the second semiconductor film 5b, the rate of the amorphous silicon portion is large compared to the first portion 51, and preferably, the second portion 52 of the second semiconductor film 5b is a portion with substantially only amorphous silicon.

The depressed section 5c is formed on an upper surface of the second semiconductor film 5b on a substantially center side including at least a part of a portion corresponding to the second gate electrode 5a. The depressed section 5c is formed in the second portion 52 of the second semiconductor film 5b and does not reach the first portion 51. A part corresponding to the depressed section 5c on the second semiconductor film 5b is to be the channel portion where a channel is formed.

Both edge sections of the second semiconductor film 5b with the depressed section 5c in between are one step higher than the depressed section 5c. On one edge section of the second semiconductor film 5b, an impurity semiconductor film 5f is formed, and on the other edge section of the second semiconductor film 5b, an impurity semiconductor film 5g is formed. The impurity semiconductor films 5f and 5g are formed apart from each other on each edge side of the second semiconductor film 5b. The impurity semiconductor films 5f and 5g are n-type semiconductors including n-type impurity, however, it is not limited to the above, and when the switch transistor 5 is a p-type transistor, a p-type semiconductor can be used.

The drain electrode 5h is formed on the impurity semiconductor film 5f. The source electrode 5i is formed on the impurity semiconductor film 5g. It is preferable that the drain electrode 5h and the source electrode 5i are formed from material selected from, for example, a Cr film, an Al film, a Cr/Al laminated film, an AlTi alloy film, and an AlTiNd alloy film.

On the drain electrode 5h and the source electrode 5i, a second insulating film 12 with insulating properties is formed, and the drain electrode 5h and the source electrode 5i, etc. are covered by the second insulating film 12. The second insulating film 12 includes, for example, silicon nitride or silicon oxide.

The second gate electrode 5a is formed on the second insulating film 12 in a position corresponding to the depressed section 5c of the second semiconductor film 5b. The second gate electrode 5a is formed from, for example, a Cr film, an Al film, a Cr/Al laminated film, an AlTi alloy film or an AlTiNd alloy film. The second gate electrode 5a on the second insulating film 12 is covered by the passivation film 14. The passivation film 14 includes, for example, silicon nitride or silicon oxide.

The switch transistor 5 is covered by the first insulating film 11, the second insulating film 12 and the passivation film 14.

In the switch transistor 5, the second insulating film 12 functions as a gate insulating film, and the depressed section 5c part which is the portion one step lower than the second semiconductor film 5b and acted on by the electric field of the second gate electrode 5a is to be the channel portion in which the channel is formed. Specifically, a channel is formed in a second portion 52 of the second semiconductor film 5b which is the second gate electrode 5a side of the second semiconductor film 5b, and the second portion 52 is the electric current path between the source electrode 5i and the drain electrode 5h.

The second portion 52 of the second semiconductor film 5b is a semiconductor layer including more amorphous silicon and the switch transistor 5 which uses the second portion 52 as the electric current path of the channel corresponds to a thin film transistor including a semiconductor film made from amorphous silicon (or a semiconductor film including amorphous silicon as a main component). In other words, the leak current is smaller in the amorphous silicon of the second portion 52 of the switch transistor 5 compared to the crystalline silicon such as microcrystalline silicon and the on/off ratio of the electric current which flows in the semiconductor layer, in other words, (electric current which flows in the semiconductor layer when on)/(electric current which flows in the semiconductor layer when off) is high. Therefore, the above suitably functions as the switch transistor which controls the on/off of the driving transistor 6.

As shown in FIG. 32 and FIG. 33, the driving transistor 6 is a first thin film transistor with a bottom gate structure of a channel etching type including an inversely staggered structure. The driving transistor 6 includes a first gate electrode 6a, a first semiconductor film 6b, impurity semiconductor films 6f and 6g, first drain electrode 6h, first source electrode 6i and the like.

The first gate electrode 6a is formed between the substrate 10 and the first insulating film 11. It is preferable that the first gate electrode 6a is formed from material selected from, for example, a Cr film, an Al film, a Cr/Al laminated film, an AlTi alloy film and an AlTiNd alloy film. The first insulating film 11 with insulating properties is formed on the first gate electrode 6a and the first gate electrode 6a is covered by the first insulating film 11. The intrinsic first semiconductor film 6b is formed in a position on the first insulating film 11 corresponding to the first gate electrode 6a. The first semiconductor film 6b faces the first gate electrode 6a with the first insulating film 11 in between.

The first semiconductor film 6b includes, for example, crystalline silicon, specifically, microcrystalline silicon and includes a first portion 61 positioned on the first insulating film 11 side and a second portion 62 positioned on the opposite surface side and on the second insulating film 12 side. Here, degree of crystallization of silicon of the first portion 61 is formed higher compared to the second portion 62. In other words, in the first portion 61 of the first semiconductor film 6b, degree of crystallization of silicon is relatively higher compared to the second portion 62, and the rate of the crystalline silicon portion is higher compared to the second portion 62. In the second portion 62 of the first semiconductor film 6b, the rate of the portion of the amorphous silicon is higher compared to the first portion 61, and preferably the second portion 62 of the first semiconductor film 6b is a portion with substantially only amorphous silicon. The first portion 61 of the first semiconductor film 6b and the first portion 51 of the second semiconductor film 5b have the same composition and have the same thickness. The second portion 62 of the first semiconductor film 6b and the second portion 52 of the second semiconductor film 5b have the same composition and have the same thickness. Therefore, as described later, the first semiconductor film 6b and the second semiconductor film 5b can be manufactured collectively with the same process using the semiconductor layer 9 which is a layer with the same material.

The depressed section 6c is formed on an upper surface of the first semiconductor film 6b on a substantially center side including at least a part of a portion corresponding to the first gate electrode 6a. The depressed section 6c is formed in the second portion 62 of the first semiconductor film 6b and does not reach the first portion 61. A part corresponding to the depressed section 6c on the first semiconductor film 6b is to be the channel portion where a channel is formed.

Both edge sections of the first semiconductor film 6b with the depressed section 6c in between are one step higher than the depressed section 6c. On one edge section of the first semiconductor film 6b, the impurity semiconductor film 6f is formed, and on the other edge section of the first semiconductor film 6b, the impurity semiconductor film 6g is formed.

The impurity semiconductor films 6f and 6g are formed apart on each edge side of the first semiconductor film 6b. The impurity semiconductor films 6f and 6g are n-type semiconductors, however it is not limited to the above, and when the driving transistor 6 is a p-type transistor, a p-type semiconductor can be used. The impurity semiconductor films 6f and 6g and the impurity semiconductor films 5f and 5g are composed of the same material and have the same thickness. As described later, the impurity semiconductor films 6f and 6g and the impurity semiconductor films 5f and 5g can be manufactured collectively with the same process using the impurity semiconductor layer 9f which is a layer with the same material.

The drain electrode 6h is formed on the impurity semiconductor film 6f. The source electrode 6i is formed on the impurity semiconductor film 6g. It is preferable that the drain electrode 6h and the source electrode 6i are formed from material selected from, for example, a Cr film, an Al film, a Cr/Al laminated film, an AlTi alloy film and an AlTiNd alloy film. The drain electrode 6h, the source electrode 6i, the drain electrode 5h and the source electrode 5i are composed of the same material and have the same thickness. As described later, the drain electrode 6h, the source electrode 6i, the drain electrode 5h and the source electrode 5i can be manufactured collectively with the same process using the conducting film 9h which is a layer with the same material.

A second insulating film 12 with insulating properties is formed on the drain electrode 6h and the source electrode 6i, and the drain electrode 6h and the source electrode 6i, etc. are covered by the second insulating film 12. The passivation film 14 is formed on the second insulating film 12.

The driving transistor 6 is covered by the first insulating film 11, the second insulating film 12 and the passivation film 14.

In the driving transistor 6, the first insulating film 11 functions as a gate insulating film, and a channel (channel portion) is formed in a depressed section 6c part which is a portion one step lower than the first semiconductor film 6b and acted on by the electric field of the first gate electrode 6a. Specifically, a channel is formed in a first portion 61 of the first semiconductor film 6b which is the first gate electrode 6a side of the first semiconductor film 6b, and the first portion 61 is the electric current path between the source electrode 6i and the drain electrode 6h.

The first portion 61 of the first semiconductor film 6b is a semiconductor layer including more crystalline silicon than the second portion 62. Therefore, the driving transistor 6 which uses the first portion 61 as the electric current path of the channel corresponds to a thin film transistor including a semiconductor film made from crystalline silicon (or a semiconductor film including crystalline silicon as the main component). In other words, the microcrystalline silicon in the first portion 61 of the driving transistor 6 is crystalline silicon with a grain diameter of about 50 to 100 nm. Therefore, the shift of threshold voltage by the driving of the transistor is small compared to the amorphous silicon and the deterioration of the transistor can be suppressed. Moreover, the degree of carrier mobility is high, and therefore suitably functions as a driving transistor which flows electric current in the EL element 8 by control of the switch transistor 5.

The capacitor 7 is connected between the first gate electrode 6a and the source electrode 6i of the driving transistor 6. Specifically, the electrode 7a of the capacitor 7 is connected to the first gate electrode 6a of the driving transistor 6, and the electrode 7b of the capacitor 7 is connected to the source electrode 6i of the driving transistor 6. Then, as shown in FIG. 32 and FIG. 34, one electrode 7a of the capacitor 7 is formed between the substrate 10 and the first insulating film 11, and the other electrode 7b of the capacitor 7 is formed between the first insulating film 11 and the second insulating film 12. The electrode 7a and the electrode 7b face each other with the first insulating film 11, which is a dielectric material, in between.

The signal line 3, the electrode 7a of the capacitor 7, and the first gate electrode 6a of the driving transistor 6, are collectively formed by processing the shape of a conducting film formed on an entire surface of the substrate 10 by photolithography, etching, etc.

The voltage supplying line 4, the electrode 7b of the capacitor 7, the drain electrode 5h and the source electrode 5i of the switch transistor 5, and the drain electrode 6h and the source electrode 6i of the driving transistor 6 are collectively formed by processing the shape of a conducting film formed on an entire surface of the first insulating film 11 by photolithography, etching, etc.

The scanning line 2 and the second gate electrode 5a of the switch transistor 5 are collectively formed by processing the shape of a conducting film formed on an entire surface of the second insulating film 12 by photolithography, etching, etc. The conducting layer 4a layered on the voltage supplying line 4 is formed with the scanning line 2 and the second gate electrode 5a.

On the first insulating film 11, a contact hole 11b is formed on a portion where the drain electrode 5h and the signal line 3 overlaps, a contact hole 11c is formed on a portion where the first gate electrode 6a and the source electrode 5i overlaps, and contact plugs 20b and 20c are implanted in the contact holes 11b and 11c. The drain electrode 5h of the switch transistor 5 and the signal line 3 are electrically conducted by the contact plug 20b. The source electrode 5i of the switch transistor 5 and the electrode 7a of the capacitor 7 as well as the source electrode 5i of the switch transistor 5 and the first gate electrode 6a of the driving transistor 6 are electrically conducted by the contact plug 20c. The drain electrode 5h can be in contact with the signal line 3 and the source electrode 5i can be in contact with the first gate electrode 6a without using the contact plugs 20b and 20c.

The first gate electrode 6a of the driving transistor 6 is connected as one with the electrode 7a of the capacitor 7, the drain electrode 6h of the driving transistor 6 is connected as one with the voltage supplying line 4, and the source electrode 6i of the driving transistor 6 is connected as one with the electrode 7b of the capacitor 7.

The pixel electrode 8a is provided on the substrate 10 with the first insulating film 11 in between, and a separate pixel electrode 8a is formed for each pixel P. According to a bottom emission structure which emits light of the EL element 8 from the pixel electrode 8a side, the pixel electrode 8a is a transparent electrode, and it is preferable that the pixel electrode 8a is formed from material selected from for example, tin doped indium oxide (ITO), zinc doped indium oxide, indium oxide ($In_2O_3$), tin oxide ($SnO_2$), zinc oxide (ZnO) and cadmium-tin oxide (CTO). In a top emission structure which emits light of the EL element 8 from a counter electrode 8d side, it is preferable that the pixel electrode 8a is a laminated structure including a light reflecting layer as a lower layer which is a single or alloy layer of aluminum, etc. with high light reflecting properties, and the above described transparent electrode as the upper layer. A part of the pixel electrode 8a overlaps with the source electrode 6i of the driving transistor 6, and the pixel electrode 8a and the source electrode 6i are connected to each other.

Then, as shown in FIG. 32 and FIG. 33, the second insulating film 12 and the passivation film 14 are formed so as to cover the scanning line 2, the signal line 3, the voltage supplying line 4, the switch transistor 5, the driving transistor 6, the periphery of the pixel electrode 8a, the electrode 7b of the capacitor 7 and the first insulating film 11. In other words, the opening section 12a is formed in the second insulating film 12 and the passivation film 14 so as to expose the center section of each pixel electrode 8a. Therefore, the second insulating film 12 and the passivation film 14 are formed in a grid like shape from a planar view.

As shown in FIG. 32 and FIG. 33, the EL element 8 includes the pixel electrode 8a as the first electrode which is to be the anode, the hole injecting layer 8b which is a compound film formed on the pixel electrode 8a, the light emitting layer 8c which is a compound film formed on the hole injecting layer 8b, and the counter electrode 8d as the second electrode formed on the light emitting layer 8c. The counter electrode 8d is a single electrode common to all pixels P and is formed continuously on all pixels P.

The hole injecting layer 8b is a layer including, for example PEDOT (polyethylenedioxythiophene) which is a conductive polymer and PSS (polystyrene sulfonate) which is a dopant and is a carrier injecting layer to inject a hole from the pixel electrode 8a to the light emitting layer 8c.

The light emitting layer 8c includes material which emits light of either R (red), G (green) or B (blue) in each pixel P, and is a layer including light emitting material of polyfluorene series or polyphenylene vinylene series and emits light by recombination between an electron supplied from the counter electrode 8d and a hole injected from the hole injecting layer 8b. Therefore, among the pixel P which emits light of R (red), the pixel P which emits light of G (green) and the pixel P which emits light of B (blue), the light emitting material of the light emitting layer 8c are different from each other. The pixels P which are R (red), G (green) and B (blue) are aligned in a stripe pattern in which, for example, the same color pixel is aligned in the vertical direction. This alignment pattern is not limited to a stripe pattern and can be a delta sequence. When the alignment pattern is a stripe pattern, the opening section 13a of the bank 13 is provided in a grid like shape along the alignment pattern of each pixel P or in a stripe shape along a column direction so that a plurality of the center sections of the pixel electrode 8a of the pixel P are collectively exposed.

The counter electrode 8d is formed from material with a lower work function than the pixel electrode 8a, and when the counter electrode 8d is employed as the cathode, the counter electrode 8d is formed for example as a laminated body including a lower layer of a single body or alloy including at least one type of indium, magnesium, calcium, lithium, barium, or rare earth metal and an upper layer in order to reduce sheet resistance. In a top emission structure which emits light of the EL element 8 from the counter electrode 8d side, the upper layer is a transparent electrode and it is preferable that the upper layer is formed from material selected from, for example, tin doped indium oxide (ITO), zinc doped indium oxide, indium oxide ($In_2O_3$), tin oxide ($SnO_2$), zinc oxide (ZnO), and cadmium-tin oxide (CTO). In a bottom emission structure which emits light of the EL element 8 from the pixel electrode 8a side, it is preferable that the upper layer is a single or alloy layer of aluminum, etc. with high light reflecting properties.

The counter electrode 8d is an electrode common to all pixels P and covers the later described bank 13 with a compound film such as the light emitting layer 8c.

The light emitting layer 8c which is to be the light emitting part is divided with respect to each pixel P by the second insulating film 12 and the bank 13.

Then, in the opening section 13a, the hole injecting layer 8b and the light emitting layer 8c as the carrier transporting layers are layered on the pixel electrode 8a. The hole injecting layer 8b can be formed continuously to spread on a plurality of pixels P. In this case, it is preferable to use germanium oxide with hole injecting properties.

Specifically, when the hole injecting layer 8b or the light emitting layer 8c is formed in a predetermined portion surrounded by the bank 13 of the pixel P by a wet type method, the bank 13 functions as a partition wall to prevent the liquid body in which material which is to be the hole injecting layer 8b or the light emitting layer 8c is dissolved or dispersed in a solvent from flowing into the adjacent pixel P through the bank 13.

For example, as shown in FIG. 33, since the opening edge of the opening section 13a of the bank 13 provided on the second insulating film 12 and the passivation film 14 is positioned on the inner side of the opening edge of the opening section 12a of the second insulating film 12, the bank 13 covers the entire second insulating film 12 and the passivation film 14. With the configuration of the second insulating film 12 being wider than the bank 13, the opening section 13a is wider than the opening section 12a, and the passivation film 14 and the side face of the opening edge of the opening section 12a of the second insulating film 12 can be exposed from the opening section 13a of the bank 13.

The liquid body including the material which is to be the hole injecting layer 8b is applied on each pixel electrode 8a surrounded by each opening section 13a, and the substrate 10 is heated as a whole, to dry the liquid body to form the compound film. This compound film is to be the hole injecting layer 8b which is the first carrier transporting layer.

The liquid body including the material which is to be the light emitting layer 8c is applied on each hole injecting layer 8b surrounded by each opening section 13a, and the substrate 10 is heated as a whole, to dry the liquid body to form the compound film. This compound film is to be the light emitting layer 8c which is the second carrier transporting layer.

The counter electrode 8d is provided so as to cover the light emitting layer 8c and the bank 13.

In the EL panel 1, in a bottom emission structure, the pixel electrode 8a, the substrate 10 and the first insulating film 11 are transparent, and the light emitted from the light emitting layer 8c transmits the pixel electrode 8a, the first insulating film 11 and the substrate 10 and exits. Therefore, the rear surface of the substrate 10 is to be the display surface.

The structure can be a top emission structure in which instead of the substrate 10 side, the opposite side is to be the display surface. In this case, as described above, the counter electrode 8d is to be the transparent electrode, the pixel electrode 8a is to be the reflecting electrode and the light emitted from the light emitting layer 8c transmits the counter electrode 8d and exits.

This EL panel 1 is driven and emits light as described in the following.

In a state where a predetermined level of voltage is applied to all voltage supplying lines 4, voltage is sequentially applied to the scanning line 2 by the scanning driver, and such scanning lines 2 are sequentially selected. The switch transistor 5 of each pixel P corresponding to the selected scanning line 2 is turned on.

When the data driver applies a voltage of a level according to the tone to all signal lines 3 when each scanning line 2 is selected, since the switch transistor 5 of each pixel P corresponding to the selected scanning line 2 is turned on, the voltage of the signal line 3 is applied to the gate electrode 6a of the driving transistor 6.

According to the voltage of the level corresponding to the predetermined tone applied on the gate electrode 6a of the driving transistor 6, the potential difference between the gate electrode 6a and the source electrode 6i of the driving transistor 6 is determined, the amount of the drain-source electric current in the driving transistor 6 is determined, and the EL element 8 emits light of a brightness according to the drain-source electric current of the EL element 8. Then, when the selection of the scanning line 2 is released, the switch transistor 5 is turned off, the electronic charge based on the voltage applied to the gate electrode 6a of the driving transistor 6 is stored in the capacitor 7 and the potential difference between the gate electrode 6a and the source electrode 6i of the driving transistor 6 is maintained. Therefore, the driving transistor 6 flows the drain-source electric current with the same electric current value as the time of selection, and the brightness of the EL element 8 is maintained.

In other words, the switch transistor 5 switches the voltage applied to the gate electrode 6a of the driving transistor 6 to the voltage of the predetermined tone level applied to the signal line 3, the driving transistor 6 flows the drain-source electric current (driving electric current) of the electric current value according to the level of the voltage applied to the gate electrode 6a from the voltage supplying line 4 to the EL element 8, and the EL element 8 emits light at a predetermined tone according to the electric current value (electric current density).

As described above, the EL element 8 emits light by driving and control of the transistor structure 56 including the switch transistor 5 and the driving transistor 6, and the EL panel 1 emits light.

Next, the manufacturing method of the switch transistor 5 and the driving transistor 6 composing the transistor structure 56 in the EL panel 1 of the present invention is described using FIG. 7A and FIG. 7B, and FIG. 35A and FIG. 35B to FIG. 43A and FIG. 43B showing each process.

Regarding the switch transistor 5 and the driving transistor 6 shown in the diagram explaining each step, a part of the shape and the like is different from the actual embodiment, however, to simplify explanation, each thin film transistor is shown to be the same size and the main section of each thin film transistor is schematically illustrated and explained. FIG. A of each number shows the driving transistor 6 and FIG. B of each number shows the switch transistor 5.

First, as shown in FIG. 7A and FIG. 7B, a gate metal layer including, for example, a Cr film, an Al film, a Cr/Al laminated film, an AlTi alloy film or an AlTiNd alloy film, etc. is accumulated on the substrate 10 by sputtering and patterned by photolithography, etching, etc. to form the first gate electrode 6a of the driving transistor 6. Moreover, the signal line 3 and the electrode 7a of the capacitor 7 are formed on the substrate 10 with the first gate electrode 6a (see FIG. 33 and FIG. 34).

Next, as shown in FIG. 35A and FIG. 35B, the first insulating film 11 such as silicon nitride, etc. is formed by plasma CVD (PE-CVD).

Moreover, as shown in FIG. 35A and FIG. 35B, the semiconductor layer 9b including crystalline silicon is formed on the first insulating film 11 by plasma CVD. When the semiconductor layer 9b which is to be the semiconductor film (5b, 6b) is formed, the first silicon layer 91 with a relatively high degree of crystallization of silicon is formed first, and then a second silicon layer 92 with a relatively low degree of crystallization of silicon is formed. Preferably, the second silicon layer 92 is substantially only amorphous silicon.

Specifically, the first silicon layer 91 is formed after plasma degradation of $SiH_4$ gas and $H_2$ gas, and by setting the rate of the $H_2$ gas overwhelmingly larger compared to the $SiH_4$ gas and by making the plasma power and the pressure large to raise the degree of crystallization, the first silicon layer 91 which is a microcrystalline silicon thin film can be formed. In the present embodiment, the first silicon layer 91 is formed under conditions of using argon as a carrier gas, setting the gas flow rate to $SiH_4/H_2=50/10500$ [SCCM], setting power density at 0.134 [W/cm$^2$] and setting the pressure at 300 [Pa]. Then, the rate of the $H_2$ gas compared to $SiH_4$ gas is decreased, and the plasma power and the pressure is decreased to form the second silicon layer 92 which is an amorphous silicon thin film.

The surface of the first silicon layer 91 which is the microcrystalline silicon thin film tends to be uneven. However, since the second silicon layer 92 which is the amorphous silicon thin film is layered on the first silicon layer 91, the unevenness of the surface of the first silicon layer 91 is covered and moderated by the second silicon layer 92.

Instead of forming the first silicon layer 91 by plasma CVD, the first silicon layer 91 can be formed by a method of emitting laser light to the amorphous silicon thin film to be reformed to the microcrystalline silicon thin film. In this case, after forming the amorphous silicon thin film on the first insulating film 11, the substrate is taken out of the chamber of the CVD apparatus and laser light emitting processing is performed to form the first silicon layer 91, and then the substrate is put in the chamber of the CVD apparatus again to layer the second silicon layer 92 on the first silicon layer 91.

The degree of crystallization of silicon of the first silicon layer 91 and the second silicon layer 92 in the semiconductor layer 9b (the first portion and the second portion in the semiconductor film) can be determined based on the degree of crystallization calculated by, for example, raman spectrophotometry. For example, amorphous silicon provides a spectrum including a broad peak at around 480 cm$^{-1}$. The very minute crystalline silicon of the grain boundary or with a crystal diameter of 5 nm or less provides a spectrum including a broad peak at around 500 cm$^{-1}$. The crystallized silicon provides a spectrum including a relatively sharp peak at around 520 cm$^{-1}$. The spectrum of the silicon thin film of the first silicon layer 91 and the second silicon layer 92 which is the object of measurement can be represented by combining, for example, as shown in FIG. 59, each component spectrum, in other words, each spectrum of amorphous silicon, very minute crystalline silicon of the grain boundary or with a crystal diameter of 5 nm or less, and crystallized silicon, at a certain ratio. By obtaining the certain ratio by well known methods of analysis, the degree of crystallization d (%) can be obtained. The degree of crystallization d (%) can be calculated by the following formula 1 when the intensity of the component spectrum of the amorphous silicon is $I_{a-Si}$, the intensity of the component spectrum of the very minute crystalline silicon of the grain boundary or with a crystal diameter of 5 nm or less is $I_{uc-Si}$ and the intensity of the component spectrum of the crystallized silicon is $I_{c-Si}$, included in a spectrum of a silicon thin film.

$$d(\%)=(I_{c-Si}+I_{uc-Si})/(I_{c-Si}+I_{uc-Si}+I_{a-Si})\times 100 \qquad (1)$$

The higher the degree of crystallization d (%) is, the more crystallized silicon is included in the silicon thin film. When the degree of crystallization is 20% or more, it is defined to be a microcrystalline silicon thin film, and when the degree of crystallization is less than 20%, it is defined to be an amorphous silicon thin film.

Moreover, as preprocessing of forming the semiconductor layer 9b on the first insulating film 11, it is preferable to perform plasma processing on the surface of the first insulating film 11. When the plasma processing is performed on the first insulating film 11, the surface of the first insulating film 11 is reformed, and the degree of crystallization of the crystalline silicon formed on the first insulating film 11 can be raised.

The plasma processing of the present embodiment can be performed under conditions such as using N$_2$O gas, setting the gas flow rate to 2000 [SCCM], setting the power density to 0.356 [W/cm$^2$] and setting the pressure to 80 [Pa]. In the plasma processing, N$_2$O gas is used, however, instead of N$_2$O gas, oxygen gas or hydrogen gas can be used under suitable conditions.

Next, as shown in FIG. 35A and FIG. 35B, the impurity semiconductor layer 9f which is to be the impurity semiconductor film is formed by sputtering or CVD method on the semiconductor layer 9b (second silicon layer 92).

The material used as the impurity semiconductor layer 9f is different according to whether the thin film transistor is a p-type or n-type. In a p-type transistor (p+Si), the layer is formed by forming a film of plasma by mixing an acceptor type impurity such as diborane, etc. in SiH$_4$ gas. In an n-type transistor (n+Si), the layer is formed by forming a film of plasma by mixing a donor type impurity such as arsine, phosphine, etc. in the SiH$_4$ gas.

Figure 36A:
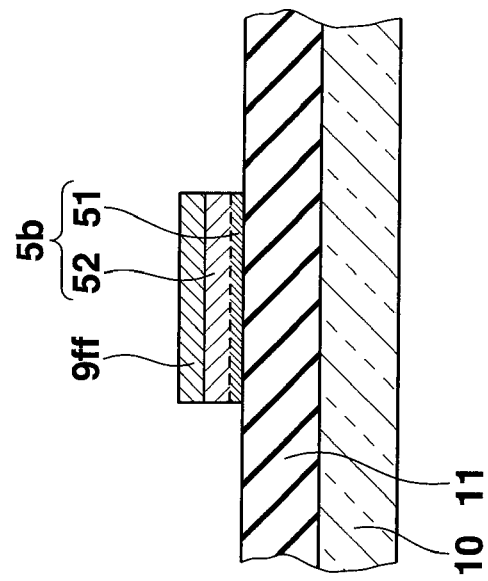
FIG. 36A is an explanatory diagram showing a manufacturing step of a thin film transistor of embodiment 3.
Figure 36B:
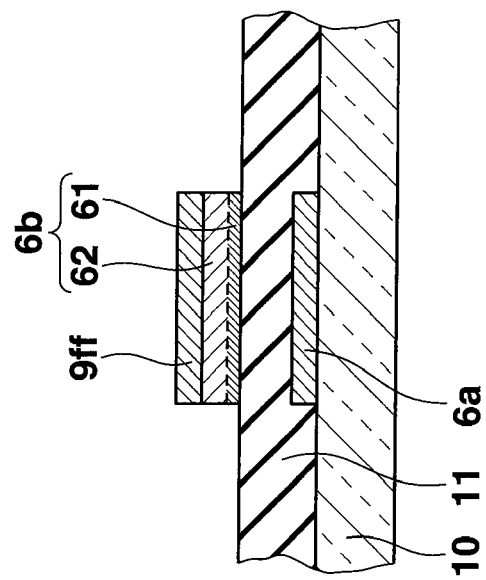
FIG. 36B is an explanatory diagram showing a manufacturing step of a thin film transistor of embodiment 3.

Next, as shown in FIG. 36A and 36B, the semiconductor layer 9b and the impurity semiconductor layer 9f are patterned by photolithography, etching, etc. to form the first semiconductor film 6b including the first portion 61 and the second portion 62 and the impurity semiconductor layer section 9ff provided on the first semiconductor film 6b and the second semiconductor film 5b including the first portion 51 and the second portion 52 and the impurity semiconductor layer section 9ff provided on the second semiconductor film 5b.

Figure 37B:
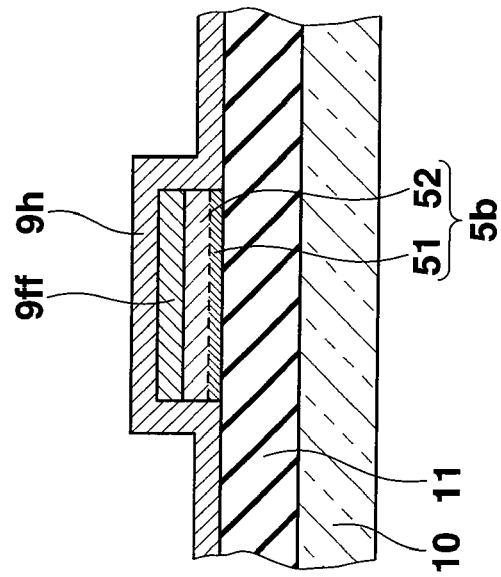
FIG. 37B is an explanatory diagram showing a manufacturing step of a thin film transistor of embodiment 3.
Figure 37A:
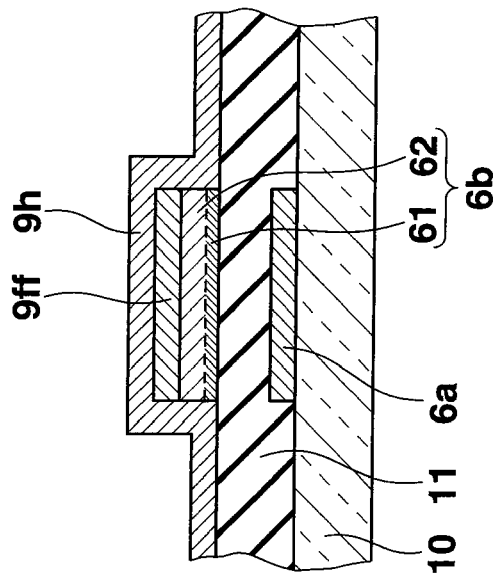
FIG. 37A is an explanatory diagram showing a manufacturing step of a thin film transistor of embodiment 3.

Next, as shown in FIG. 37A and 37B, the conducting film 9h which is to be the source electrode and the drain electrode is formed by, for example, sputtering on the first insulating film 11 so as to cover the impurity semiconductor layer section 9ff.

Figure 38B:
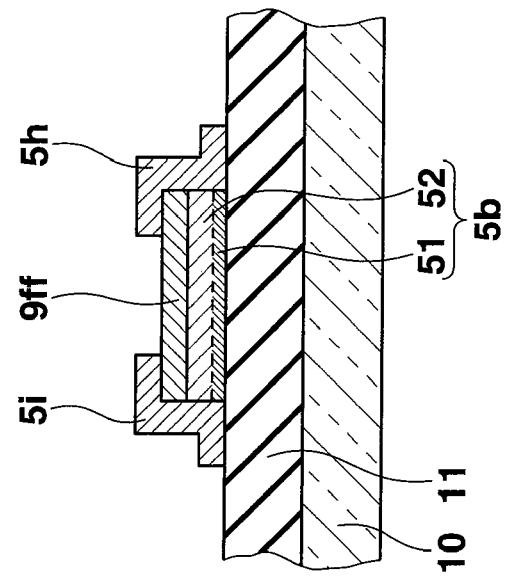
FIG. 38B is an explanatory diagram showing a manufacturing step of a thin film transistor of embodiment 3.
Figure 38A:
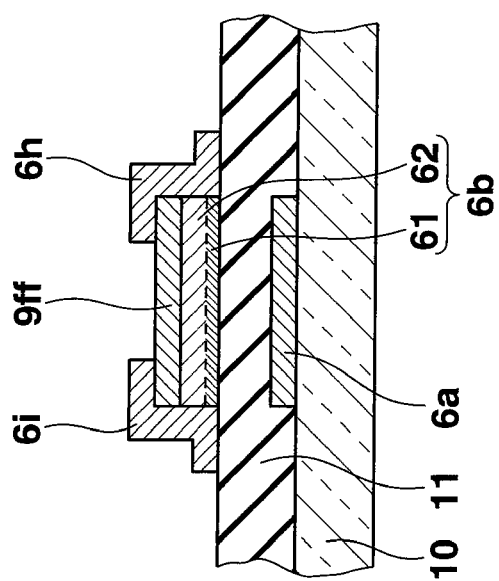
FIG. 38A is an explanatory diagram showing a manufacturing step of a thin film transistor of embodiment 3.

Next, as shown in FIG. 38A and FIG. 38B, the conducting film 9h is patterned by photolithography, etching, etc. and the source electrode 6i and the drain electrode 6h of the driving transistor 6, the source electrode 5i and the drain electrode 5h of the switch transistor 5 are formed. Moreover, the voltage supplying line 4 and the electrode 7b of the capacitor 7 are also formed with the source electrode and the drain electrode. (see FIG. 33 and FIG. 34).

Next, as shown in FIG. 39A and FIG. 39B, the drain electrode 6h and the source electrode 6i are used as a mask and the impurity semiconductor layer section 9ff is patterned by dry etching to form a pair of impurity semiconductor films 6f and 6g. The upper surface of the first semiconductor film 6b is also etched to form the depressed section 6c in the second portion 62 on the upper surface side of the first semiconductor film 6b. Under an etching condition where the depressed section 6c does not reach the first portion 61 of the first semiconductor film 6b, a pair of impurity semiconductor films 6f and 6g is formed together with the depressed section 6c.

Similarly, the drain electrode 5h and the source electrode 5i are used as a mask and the impurity semiconductor layer section 9ff is patterned by dry etching to form a pair of impurity semiconductor films 5f and 5g. The upper surface of the second semiconductor film 5b is also etched to form the depressed section 5c in the second portion 52 on the upper surface side of the second semiconductor film 5b. Under an etching condition where the depressed section 5c does not reach the first portion 51 of the second semiconductor film 5b, a pair of impurity semiconductor films 5f and 5g is formed together with the depressed section 5c.

Next, as shown in FIG. 40A and FIG. 40B, the second insulating film 12 which covers the source electrode 6i and the drain electrode 6h of the driving transistor 6 and the source electrode 5i and the drain electrode 5h of the switch transistor 5 is formed.

Before forming the second insulating film 12, the pixel electrode 8a conducted with the source electrode 6i of the driving transistor 6 is formed (see FIG. 33). Alternatively, a groove to expose the voltage supplying line 4 can be formed in the second insulating film 12.

Figure 41B:
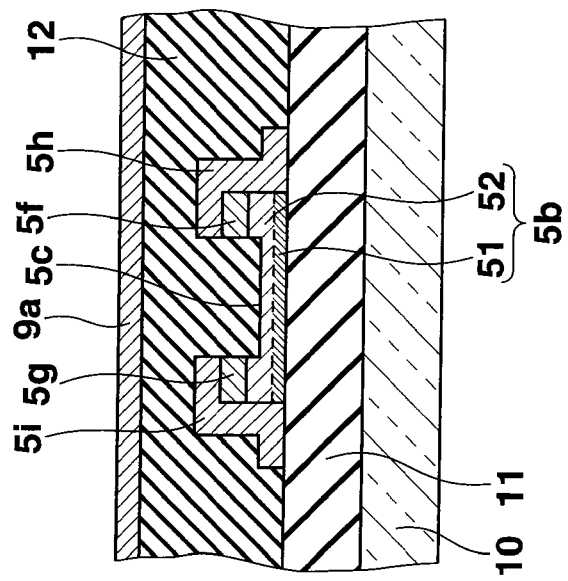
FIG. 41B is an explanatory diagram showing a manufacturing step of a thin film transistor of embodiment 3.
Figure 41A:
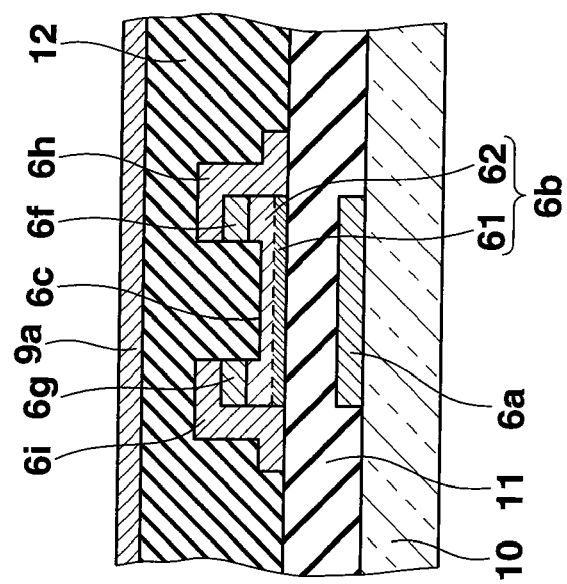
FIG. 41A is an explanatory diagram showing a manufacturing step of a thin film transistor of embodiment 3.

Next, as shown in FIG. 41A and FIG. 41B, a gate metal layer 9a of, for example, a Cr film, an Al film, a Cr/Al laminated film, an AlTi alloy film or an AlTiNd alloy film, etc. is formed by sputtering, etc. on the second insulating film 12.

Next, as shown in FIG. 42A and FIG. 42B, the gate metal layer 9a is patterned using photolithography, etching, etc. and the second gate electrode 5a of the switch transistor 5 is formed. The scanning line 2 and the conducting layer 4a are formed with the second gate electrode 5a (see FIG. 32).

Next, as shown in FIG. 43A and 43B, the passivation film 14 covering the second gate electrode 5a is formed on the second insulating film 12.

With this, the driving transistor 6 and the switch transistor 5 are manufactured.

Moreover, an opening section 12a which exposes the center section of the pixel electrode 8a is formed by patterning the passivation film 14 and the second insulating film 12 using photolithography (see FIG. 33).

Next, after accumulating photosensitive resin such as polyimide, a bank 13 in a shape such as a grid like shape which includes an opening section 13a to expose the pixel electrode 8a is formed by exposing light (see FIG. 33).

Next, a liquid body in which material which is to be the hole injecting layer 8b is dissolved or dispersed in a solvent is applied in the opening section 13a of the bank 13, and the liquid body is dried to form a hole injecting layer 8b which is a carrier transport layer. Then, a liquid body in which material which is to be the light emitting layer 8c is dissolved or dispersed in a solvent is applied in the opening section 13a of the bank 13 on the hole injecting layer 8b, and the liquid body is dried to form the light emitting layer 8c (see FIG. 33).

Next, the counter electrode 8d is formed on an entire surface of the bank 13 and the light emitting layer 8c to manufacture the EL element 8 (see FIG. 33) and the EL panel 1 is manufactured.

As described above, when the driving transistor 6 which is the first thin film transistor of the bottom gate structure, and the switch transistor 5 which is the second thin film transistor of the top gate structure are formed, the step to form the first gate electrode 6a of the driving transistor 6 between the substrate 10 and the first insulating film 11 is a different step from the step to form the second gate electrode 5a of the switch transistor 5 between the second insulating film 12 and the passivation film 14, and the other configuration of the thin film transistor can be formed by common steps.

In other words, according to the manufacturing method of manufacturing by common manufacturing steps in the steps other than the step to form the first gate electrode 6a of the driving transistor 6 and the step to form the second gate electrode 5a of the switch transistor 5, the driving transistor 6 and the switch transistor 5 can be formed separately.

According to the manufacturing method of the transistor structure 56 which forms the transistor structure 56 with common manufacturing steps other than the first gate electrode 6a of the driving transistor 6 and the second gate electrode 5a of the switch transistor 5, the number of steps for manufacturing can be reduced and the driving transistor 6 and the switch transistor 5 can be formed separately with fewer steps than conventional methods.

In the second semiconductor film 5b of the switch transistor 5, since the second portion 52 is positioned on the second gate electrode 5a side, the second portion 52 which is the portion in the second semiconductor film 5b including more amorphous silicon is to be the electric current path of the channel, and the switch transistor 5 includes the function corresponding to the thin film transistor including the semiconductor film including amorphous silicon. The switch transistor 5 suitably functions as the thin film transistor which controls the on/off of the driving transistor 6.

In the first semiconductor film 6b of the driving transistor 6, since the first portion 61 is positioned on the first gate electrode 6a side, the first portion 61 which is the portion in the first semiconductor film 6b including more crystalline silicon is to be the electric current path of the channel, and the driving transistor 6 includes the function corresponding to the thin film transistor including the substrate film including crystalline silicon. The driving transistor 6 suitably functions as the thin film transistor to flow electric current in the EL element 8 by control of the switch transistor 5.

As described above, the driving transistor 6 and the switch transistor 5 include different transistor characteristics, and each transistor exhibit each function so that the EL panel 1 can emit light favorably.

The switch transistor 5 and the driving transistor 6 are thin film transistors of the channel etching type including the inversely staggered structure, and the transistors include a structure which does not include a channel protecting film to protect the channels of the second semiconductor film 5b and the first semiconductor film 6b. Therefore, compared to the thin film transistor which is a type including the channel protecting film, the step to form the channel protecting film can be omitted. Consequently, the number of steps of manufacturing is reduced and the manufacturing cost can be reduced.

Since the switch transistor 5 is a top gate structure, and is a structure in which the source electrode 5i and the drain electrode 5h are below the second gate electrode 5a, the electric field from the second gate electrode 5a may be cut by the source electrode 5i and the drain electrode 5h. However, since the switch transistor 5 of embodiment 3 is a thin film transistor of the channel etching type, the electric current path between the source electrode 5i and the drain electrode 5h is the second portion 52 corresponding to the depressed section 5c of the second semiconductor film 5b and is on the interface side between the second insulating film 12 of the second portion 52 and does not flow below the source electrode 5i and the drain electrode 5h. In other words, the electric field from the second gate electrode 5a is cut by the source electrode 5i and the drain electrode 5h and the channel does not occur below the source electrode 5i and the drain electrode 5h. Even if the channel does not occur below the source electrode 5i and the drain electrode 5h, the electric current path between the source electrode 5i and the drain electrode 5h is stable at the depressed section 5c part of the second semiconductor film 5b.

Therefore, the switch transistor 5 functions suitably and the on/off switching of the driving transistor 6 can be favorably performed.

(Embodiment 4)

Next, the EL panel and the transistor structure of embodiment 4 of the present invention are described. The same reference numerals are applied to the components which are similar to embodiment 3 and the description is omitted.

Figure 44:
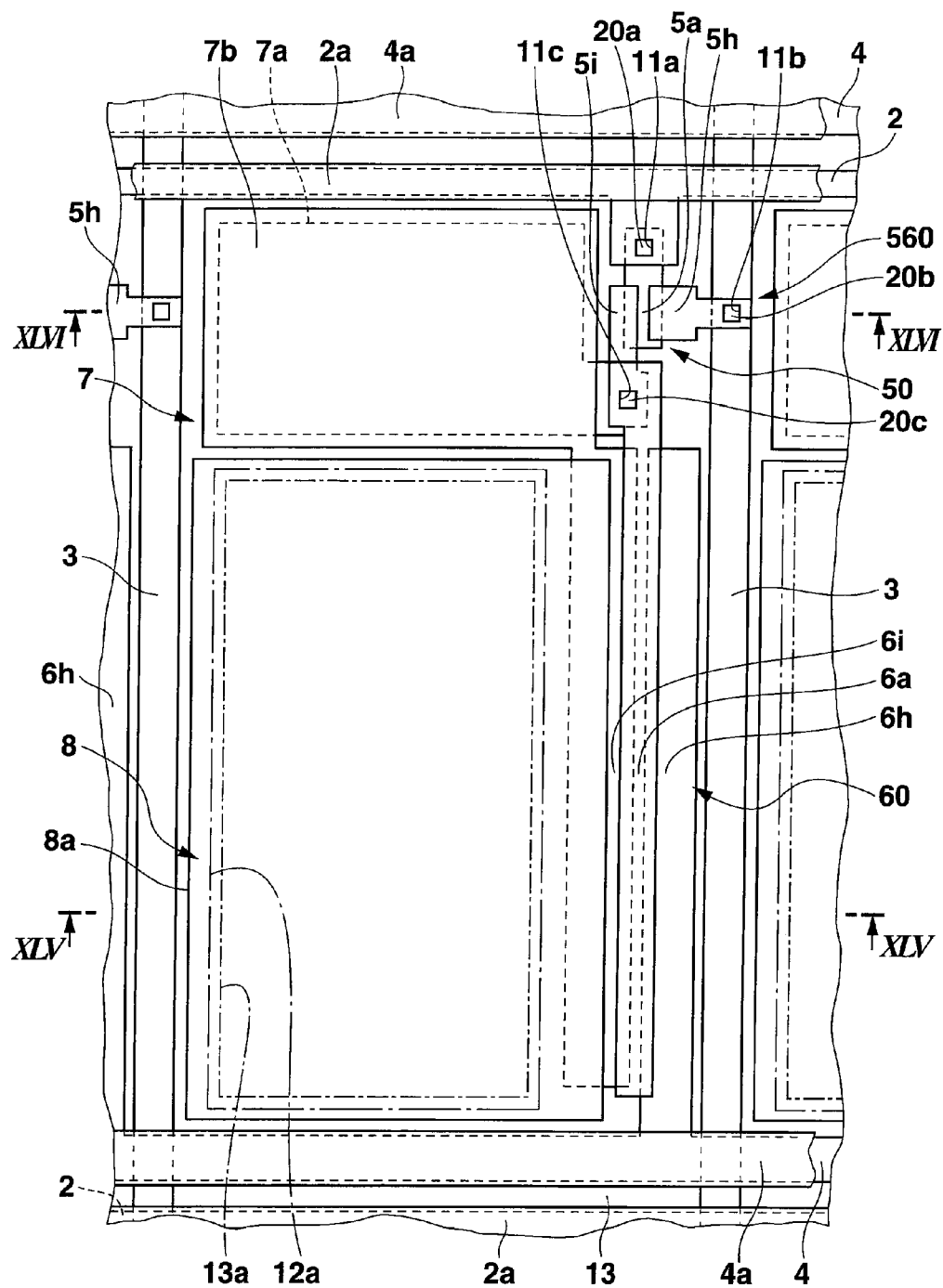
FIG. 44 is a planar view showing one pixel of an EL panel of embodiment 4.
Figure 45:
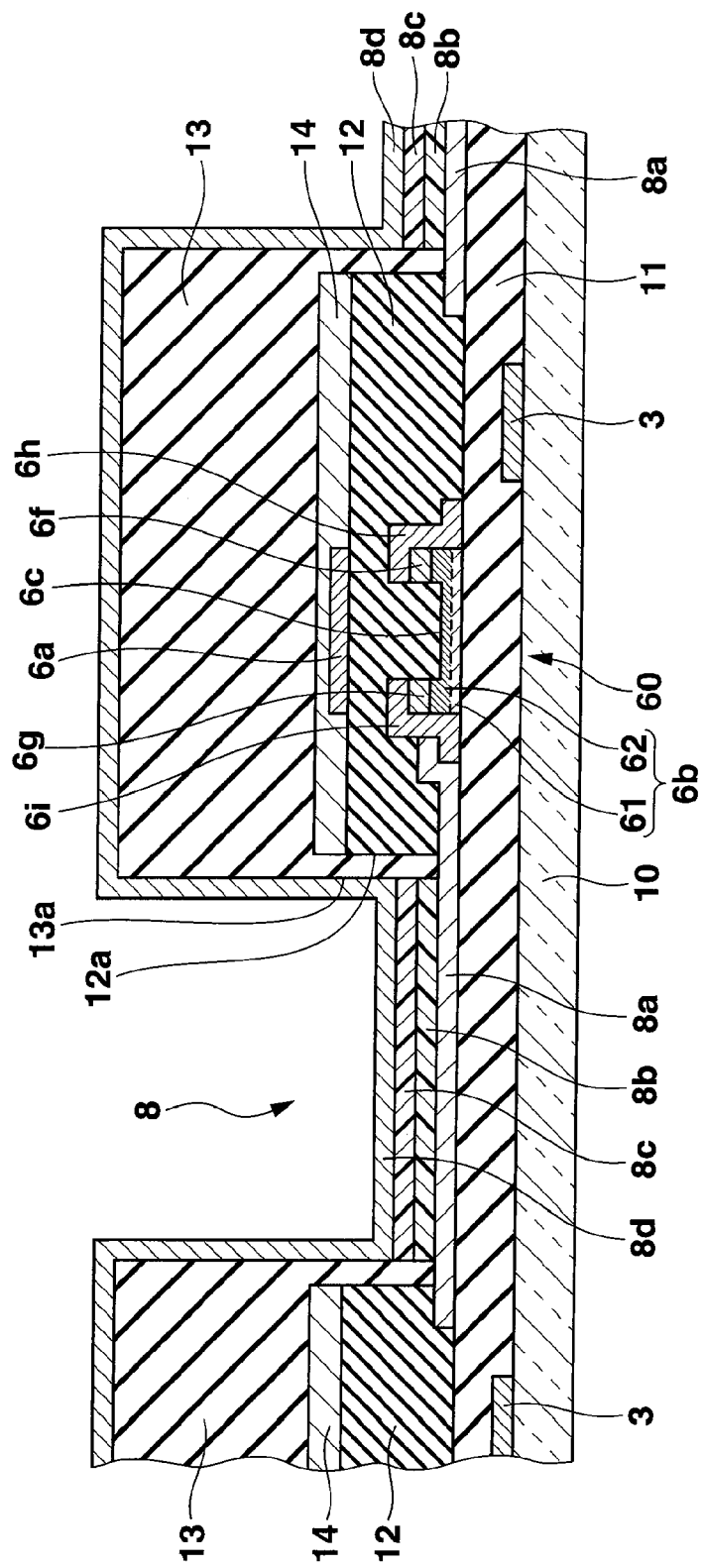
FIG. 45 is a cross sectional view of a plane along arrows XLV-XLV shown in FIG. 44.
Figure 46:
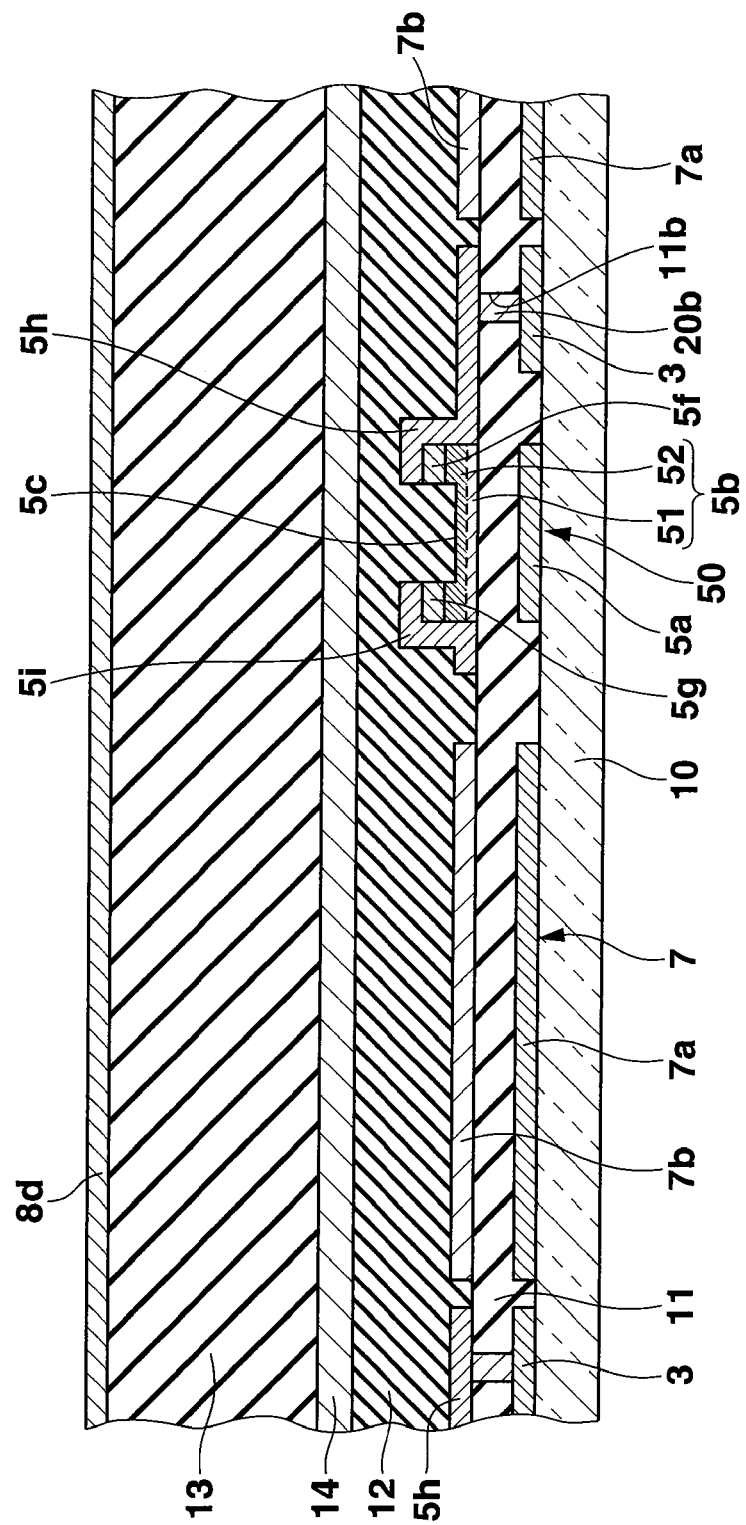
FIG. 46 is a cross sectional view of a plane along arrows XLVI-XLVI shown in FIG. 44.

The transistor structure 560 of the EL panel 1 of embodiment 4 is described with reference to FIG. 44 to FIG. 46. Here, FIG. 44 is a planar view corresponding to one pixel P of the EL panel 1, FIG. 45 is a cross sectional view of a plane along arrows XLV-XLV shown in FIG. 44 and FIG. 46 is a cross sectional view of a plane along arrows XLVI-XLVI shown in FIG. 44. FIG. 44 mainly shows electrodes and lines.

As shown in FIG. 44, the transistor structure 560 of each pixel P includes the switch transistor 50 and the driving transistor 60. The switch transistor 50 which is a first thin film transistor and the driving transistor 60 which is a second thin film transistor are arranged along the signal line 3, the capacitor 7 is positioned near the switch transistor 50 and the EL element 8 is positioned near the driving transistor 60. Moreover, in each pixel P, the switch transistor 50, the driving transistor 60, the capacitor 7 and the EL element 8 are positioned between the scanning line 2 and the voltage supplying line 4.

As shown in FIG. 44 to FIG. 46, a first gate electrode 5a is provided on the substrate 10, and a first insulating film 11 is formed on an upper surface of the substrate 10 so as to cover the first gate electrode 5a. On the first insulating film 11, a first semiconductor film 5b and a second semiconductor film 6b, a pair of impurity semiconductor films 5f, 5g, 6f and 6g, and drain electrodes 5h and 6h and source electrodes 5i and 6i are each formed, and a second insulating film 12 is formed so as to cover the drain electrodes 5h and 6h and the source electrodes 5i and 6i. A second gate electrode 6a is provided on the second insulating film 12 and a passivation film 14 is formed on the upper surface of the second insulating film 12 so as to cover the second gate electrode 6a.

The drain electrode 6h and the source electrode 6i of the driving transistor 60 are connected to an edge section of the second semiconductor film 6b through a pair of impurity semiconductor films 6f and 6g each provided on each of a pair of edge sections with a depressed section 6c of the second semiconductor film 6b in between. The drain electrode 5h and the source electrode 5i of the switch transistor 50 are connected to an edge section of the first semiconductor film 5b through a pair of impurity semiconductor films 5f and 5g each provided on each of a pair of edge sections with a depressed section 5c of the first semiconductor film 5b in between.

Moreover, the signal line 3 is formed between the substrate 10 and the first insulating film 11.

The scanning line 2 is formed on the first insulating film 11. A groove (not shown) is formed along the scanning line 2 on a part of the second insulating film 12 on the scanning line 2, and a conducting layer 2a which covers the scanning line 2 is provided in the groove.

The voltage supplying line 4 is formed on the first insulating film 11. A groove (not shown) is formed along the voltage supplying line 4 on the part of the second insulating film 12 on the voltage supplying line 4, and a conducting layer 4a which covers the voltage supplying line 4 is provided in the groove. By layering the conducting layer 4a so that the conducting layer 4a is in contact with the voltage supplying line 4, there is an aim to lower the resistance of the voltage supplying line 4 and to stabilize the amount of electric current supplied to the EL element 8 through the driving transistor 60.

Moreover, as shown in FIG. 44 and FIG. 46, the switch transistor 50 is a first thin film transistor with a bottom gate structure of a channel etching type including an inversely staggered structure. The switch transistor 50 includes a first gate electrode 5a, a first semiconductor film 5b, impurity semiconductor films 5f and 5g, first drain electrode 5h, first source electrode 5i, and the like.

The first gate electrode 5a is formed between the substrate 10 and the first insulating film 11. It is preferable that the first gate electrode 5a is formed from material selected from, for example, a Cr film, an Al film, a Cr/Al laminated film, an AlTi alloy film and an AlTiNd alloy film. The first insulating film 11 with insulating properties is formed on the first gate electrode 5a and the first gate electrode 5a is covered by the first insulating film 11. The first insulating film 11 includes, for example light permeability and includes silicon nitride or silicon oxide. The intrinsic first semiconductor film 5b is formed in a position on the first insulating film 11 corresponding to the first gate electrode 5a. The first semiconductor film 5b faces the first gate electrode 5a with the first insulating film 11 in between.

The first semiconductor film 5b includes, for example, crystalline silicon, especially microcrystalline silicon and includes a first portion 51 positioned on the first insulating film 11 side and a second portion 52 positioned on the opposite surface side and on the second insulating film 12 side. Here, degree of crystallization of silicon of the second portion 52 is formed higher than the first portion 51. In other words, in the second portion 52 of the first semiconductor film 5b, the degree of crystallization of silicon is relatively higher compared to the first portion 51, and the rate of the crystalline silicon portion is higher than the first portion 51. In the first portion 51 of the first semiconductor film 5b, the rate of the amorphous silicon portion is large compared to the second portion 52, and preferably, the first portion 51 of the first semiconductor film 5b is a portion with substantially only amorphous silicon.

The depressed section 5c is formed on an upper surface of the first semiconductor film 5b on a substantially center side including at least a part of a portion corresponding to the first gate electrode 5a. The depressed section 5c is formed in the second portion 52 of the first semiconductor film 5b and does not reach the first portion 51. A part corresponding to the depressed section 5c on the first semiconductor film 5b is to be the channel portion where a channel is formed.

Both edge sections of the first semiconductor film 5b with the depressed section 5c in between are one step higher than the depressed section 5c. On one edge section of the first semiconductor film 5b, an impurity semiconductor film 5f is formed, and on the other edge section of the first semiconductor film 5b, an impurity semiconductor film 5g is formed. The impurity semiconductor films 5f and 5g are formed apart from each other on each edge side of the first semiconductor film 5b. The impurity semiconductor films 5f and 5g are n-type semiconductors including n-type impurity, however, it is not limited to the above, and when the switch transistor 50 is a p-type transistor, a p-type semiconductor can be used.

The drain electrode 5h is formed on the impurity semiconductor film 5f. The source electrode 5i is formed on the impurity semiconductor film 5g. It is preferable that the drain electrode 5h and the source electrode 5i are formed from material selected from, for example, a Cr film, an Al film, a Cr/Al laminated film, an AlTi alloy film, and an AlTiNd alloy film.

On the drain electrode 5h and the source electrode 5i, a second insulating film 12 with insulating properties is formed, and the drain electrode 5h and the source electrode 5i, etc. are covered by the second insulating film 12. The second insulating film 12 includes, for example, silicon nitride or silicon oxide.

The passivation film 14 is formed on the second insulating film 12. The passivation film includes, for example, silicon nitride or silicon oxide.

The switch transistor 50 is covered by the first insulating film 11, the second insulating film 12 and the passivation film 14.

In the switch transistor 50, the first insulating film 11 functions as a gate insulating film, and the depressed section 5c part which is the portion one step lower than the first semiconductor film 5b and acted on by the electric field of the first gate electrode 5a is to be the channel portion in which the channel is formed. Specifically, a channel is formed in a first portion 51 of the first semiconductor film 5b which is the first gate electrode 5a side of the first semiconductor film 5b, and the first portion 51 is the electric current path between the source electrode 5i and the drain electrode 5h.

The first portion 51 of the first semiconductor film 5b is a semiconductor layer including more amorphous silicon and the switch transistor 50 which uses the first portion 51 as the electric current path of the channel corresponds to a thin film transistor including a semiconductor film made from amorphous silicon (or a semiconductor film including amorphous silicon as a main component). In other words, the leak current is smaller in the amorphous silicon of the first portion 51 of the switch transistor 50 compared to the crystalline silicon such as microcrystalline silicon and the on/off ratio of the electric current which flows in the semiconductor layer, in other words, (electric current which flows in the semiconductor layer when on)/(electric current which flows in the semiconductor layer when off) is high. Therefore, the above suitably functions as the switch transistor which controls the on/off of the driving transistor 6.

As shown in FIG. 44 and FIG. 45, the driving transistor 60 is a second thin film transistor with a top gate structure of a channel etching type including an inversely staggered structure. The driving transistor 60 includes a second gate electrode 6a, a second semiconductor film 6b, impurity semiconductor films 6f and 6g, second drain electrode 6h, source electrode 6i and the like.

The first insulating film 11 with insulating properties formed on the upper surface of the substrate 10 includes, for example, light permeability and includes silicon nitride or silicon oxide. An intrinsic second semiconductor film 6b is formed on the first insulating film 11 in a position which is to correspond with the second gate electrode 6a.

The second semiconductor film 6b includes, for example, crystalline silicon, especially microcrystalline silicon and includes a first portion 61 positioned on the first insulating film 11 side and a second portion 62 positioned on the opposite surface side and on the second insulating film 12 side. Here, degree of crystallization of silicon of the second portion 62 is formed higher than the first portion 61. In other words, in the second portion 62 of the second semiconductor film 6b, the degree of crystallization of silicon is relatively higher compared to the first portion 61, and the rate of the crystalline silicon portion is higher than the first portion 61. In the first portion 61 of the second semiconductor film 6b, the rate of the amorphous silicon portion is large compared to the second portion 62, and preferably, the first portion 61 of the second semiconductor film 6b is a portion with substantially only amorphous silicon. The first portion 61 of the second semiconductor film 6b and the first portion 51 of the first semiconductor film 5b have the same composition and have the same thickness. The second portion 62 of the second semiconductor film 6b and the second portion 52 of the first semiconductor film 5b have the same composition and have the same thickness. Therefore, as described later, the second semiconductor film 6b and the first semiconductor film 5b can be manufactured collectively with the same process using the semiconductor layer 9 which is a layer with the same material.

The depressed section 6c is formed on an upper surface of the second semiconductor film 6b on a substantially center side including at least a part of a portion corresponding to the second gate electrode 6a. The depressed section 6c is formed in the second portion 62 of the second semiconductor film 6b and does not reach the first portion 61. A part corresponding to the depressed section 6c on the second semiconductor film 6b is to be the channel portion where a channel is formed.

Both edge sections of the second semiconductor film 6b with the depressed section 6c in between are one step higher than the depressed section 6c. On one edge section of the second semiconductor film 6b, the impurity semiconductor film 6f is formed, and on the other edge section of the second semiconductor film 6b, the impurity semiconductor film 6g is formed. The impurity semiconductor films 6f and 6g are formed apart on each edge side of the second semiconductor film 6b. The impurity semiconductor films 6f and 6g are n-type semiconductors including n-type impurity, however it is not limited to the above, and when the driving transistor 60 is a p-type transistor, a p-type semiconductor can be used. The impurity semiconductor films 6f and 6g and the impurity semiconductor films 5f and 5g are composed of the same material and have the same thickness. As described later, the impurity semiconductor films 6f and 6g and the impurity semiconductor films 5f and 5g can be manufactured collectively with the same process using the impurity semiconductor layer 9f which is a layer with the same material.

The drain electrode 6h is formed on the impurity semiconductor film 6f. The source electrode 6i is formed on the impurity semiconductor film 6g. It is preferable that the drain electrode 6h and the source electrode 6i are formed from material selected from, for example, a Cr film, an Al film, a Cr/Al laminated film, an AlTi alloy film and an AlTiNd alloy film. The drain electrode 5h, the source electrode 5i, the drain electrode 6h and the source electrode 6i are composed of the same material and have the same thickness. As described later, the drain electrode 5h, the source electrode 5i, the drain electrode 6h and the source electrode 6i can be manufactured collectively with the same process using the conducting film 9h which is a layer with the same material.

A second insulating film 12 with insulating properties is formed on the drain electrode 6h and the source electrode 6i, and the drain electrode 6h and the source electrode 6i, etc. are covered by the second insulating film 12.

The second gate electrode 6a is formed in a position corresponding to the depressed section 6c of the second semiconductor film 6b on the second insulating film 12. It is preferable that the second gate electrode 6a is formed from material selected from, for example, a Cr film, an Al film, a Cr/Al laminated film, an AlTi alloy film and an AlTiNd alloy film. The second gate electrode 6a on the second insulating film 12 is covered by the passivation film 14.

The driving transistor 60 is covered by the first insulating film 11, the second insulating film 12 and the passivation film 14.

In the driving transistor 60, the second insulating film 12 functions as a gate insulating film, and a channel (channel portion) is formed in a depressed section 6c part which is a portion one step lower than the second semiconductor film 6b and acted on by the electric field of the second gate electrode 6a. Specifically, a channel is formed in a second portion 62 of the second semiconductor film 6b which is the second gate electrode 6a side of the second semiconductor film 6b, and the second portion 62 is the electric current path between the source electrode 6i and the drain electrode 6h.

The second portion 62 of the second semiconductor film 6b is a semiconductor layer including more crystalline silicon than the first portion 61. Therefore, the driving transistor 60 which uses the second portion 62 as the electric current path of the channel corresponds to a thin film transistor including a semiconductor film made from crystalline silicon (or a semiconductor film including crystalline silicon as the main component). In other words, the microcrystalline silicon in the second portion 62 of the driving transistor 60 is crystalline silicon with a grain diameter of about 50 to 100 nm. Therefore, the shift of threshold voltage by the driving of the transistor is small compared to the amorphous silicon and the deterioration of the transistor can be suppressed. Moreover, the degree of carrier mobility is high, and therefore suitably functions as a driving transistor which flows electric current in the EL element 8 by control of the switch transistor 50.

In the driving transistor 60 with a top gate structure, the electric current path of the channel in the second portion 62 of the second semiconductor film 6b is not on the interface side between the first portion 61 but is on the interface side between the second insulating film 12 nearer to the second gate electrode 6a. Since the interface side between the second insulating film 12 has a higher degree of crystallization of silicon than the interface side between the first portion 61 in the second portion 62 of the second semiconductor film 6b, the portion is suitable for the electric current path of the driving transistor 60.

This is because, since in the beginning of growth of the second portion 62 including crystalline silicon, the crystallization of silicon is not stable, and the degree of crystallization of silicon on the interface side between the first portion 61 in the second portion 62 causes a relatively bad incubation layer, and in the second portion 62 on the interface side between the second insulating film 12, a semiconductor film in which the crystallization of silicon is stable can be formed.

The second portion 62 on the interface side between the second insulating film 12 formed with stable crystallization of silicon is more suitable as an electric current path. Therefore, by forming the top gate structure of the driving transistor 60 with the second portion 62 as the electric current path, the driving transistor 60 functions more suitably as a driving transistor.

The capacitor 7 is connected between the second gate electrode 6a and the source electrode 6i of the driving transistor 60. Specifically, the electrode 7a of the capacitor 7 is connected to the second gate electrode 6a of the driving transistor 6, and the electrode 7b of the capacitor 7 is connected to the source electrode 6i of the driving transistor 60. Then, as shown in FIG. 44 and FIG. 46, one electrode 7a of the capacitor 7 is formed between the substrate 10 and the first insulating film 11, and the other electrode 7b of the capacitor 7 is formed between the first insulating film 11 and the second insulating film 12. The electrode 7a and the electrode 7b face each other with the first insulating film 11, which is a dielectric material, in between.

The signal line 3, the electrode 7a of the capacitor 7, and the first gate electrode 5a of the switch transistor 50, are collectively formed by processing the shape of a conducting film formed on an entire surface of the substrate 10 by photolithography, etching, etc.

The scanning line 2, the voltage supplying line 4, the electrode 7b of the capacitor 7, the drain electrode 5h and the source electrode 5i of the switch transistor 50, and the drain electrode 6h and the source electrode 6i of the driving transistor 60 are collectively formed by processing the shape of a conducting film formed on an entire surface of the first insulating film 11 by photolithography, etching, etc.

The second gate electrode 6a of the driving transistor 60 is collectively formed by processing the shape of a conducting film formed on an entire surface of the second insulating film 12 by photolithography, etching, etc. The conducting layer 4a layered on the voltage supplying line 4 and the conducting layer 2a layered on the scanning line 2 are formed together with the second gate electrode 6a.

On the first insulating film 11, a contact hole 11a is formed on a portion where the first gate electrode 5a and the scanning line 2 overlaps, a contact hole 11b is formed on a portion where the drain electrode 5h and the signal line 3 overlaps and a contact hole 11c is formed on a portion where the second gate electrode 6a and the source electrode 5i overlaps. The contact hole 11c is formed in communication with the second insulating film 12. Contact plugs 20a to 20c are implanted in the contact holes 11a to 11c. The first gate electrode 5a of the switch transistor 50 and the scanning line 2 are electrically conducted by the contact plug 20a. The drain electrode 5h of the switch transistor 50 and the signal line 3 are electrically conducted by the contact plug 20b. The source electrode 5i of the switch transistor 50 and the electrode 7a of the capacitor 7 as well as the source electrode 5i of the switch transistor 50 and the second gate electrode 6a of the driving transistor 60 are electrically conducted by the contact plug 20c. The scanning line 2 can be in direct contact with the first gate electrode 5a, the drain electrode 5h can be in contact with the signal line 3 and the source electrode 5i can be in contact with the second gate electrode 6a without using the contact plugs 20a to 20c.

The drain electrode 6h of the driving transistor 60 is connected as one with the voltage supplying line 4, and the source electrode 6i of the driving transistor 60 is connected as one with the electrode 7b of the capacitor 7.

Similar to the above, the EL element 8 emits light by driving and control of the transistor structure 560 including the switch transistor 50 and the driving transistor 60, and the EL panel 1 including the transistor structure 560 also emits light.

Next, the manufacturing method of the switch transistor 50 and the driving transistor 60 composing the transistor structure 560 in the EL panel 1 of the present invention is described using FIG. 21A and FIG. 21B and FIG. 47A and FIG. 47B to FIG. 55A and FIG. 55B showing each process.

Regarding the switch transistor 50 and the driving transistor 60 shown in the diagram explaining each step, a part of the shape and the like is different from the actual embodiment, however, to simplify explanation, each thin film transistor is shown to be the same size and the main section of each thin film transistor is schematically illustrated and explained. FIG. A of each number shows the driving transistor 60 and FIG. B of each number shows the switch transistor 50.

First, as shown in FIG. 21A and FIG. 21B, a gate metal layer including, for example, a Cr film, an Al film, a Cr/Al laminated film, an AlTi alloy film or an AlTiNd alloy film, etc. is accumulated on the substrate 10 by sputtering and patterned by photolithography, etching, etc. to form the first gate electrode 5a of the switch transistor 50. Moreover, the signal line 3 and the electrode 7a of the capacitor 7 are formed on the substrate 10 with the first gate electrode 5a (see FIG. 44 to FIG. 46).

Figure 47B:
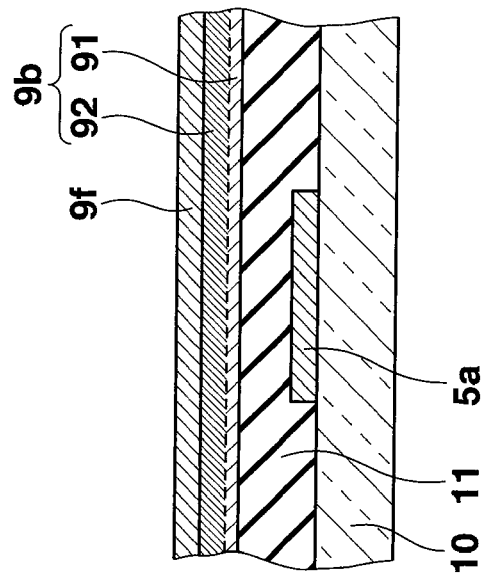
FIG. 47B is an explanatory diagram showing a manufacturing step of a thin film transistor of embodiment 4.
Figure 47A:
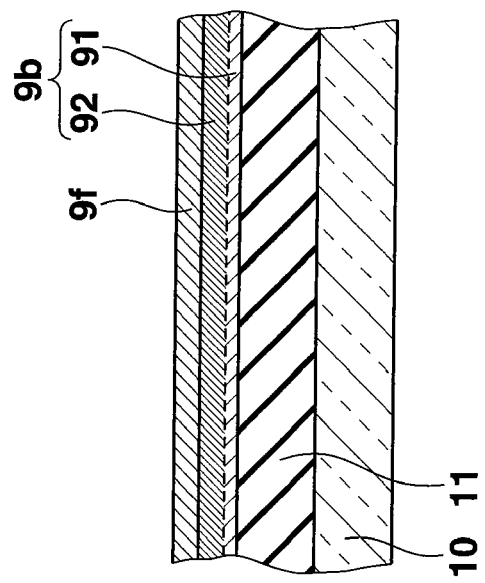
FIG. 47A is an explanatory diagram showing a manufacturing step of a thin film transistor of embodiment 4.

Next, as shown in FIG. 47A and FIG. 47B, the first insulating film 11 such as silicon nitride, etc. is formed by plasma CVD (PE-CVD).

Moreover, as shown in FIG. 47A and FIG. 47B, the semiconductor layer 9b including crystalline silicon is formed on the first insulating film 11 by plasma CVD. When the semiconductor layer 9b which is to be the semiconductor film (5b, 6b) is formed, the first silicon layer 91 with a relatively low degree of crystallization of silicon is formed first, and then a second silicon layer 92 with a relatively high degree of crystallization of silicon is formed. It is preferable that the first silicon layer 91 is substantially only amorphous silicon.

Specifically, the first silicon layer 91 which is an amorphous silicon thin film is formed under the condition of the rate of the $H_2$ gas compared to $SiH_4$ gas being low, and the plasma power and the pressure being low. Then, the second silicon layer 92 which is a microcrystalline silicon thin film is formed by setting the rate of the $H_2$ gas overwhelmingly larger compared to the $SiH_4$ gas and by making the plasma power and the pressure large to raise the degree of crystallization. In the present embodiment, the second silicon layer 92 is formed under conditions of using argon as a carrier gas, setting the gas flow rate to $SiH_4/H_2=50/10500$ [SCCM], setting power density at 0.134 [W/cm$^2$] and setting the pressure at 300 [Pa].

The degree of crystallization of silicon of the first silicon layer 91 and the second silicon layer 92 in the semiconductor layer 9b (the first portion and the second portion in the semiconductor film) can be determined based on the degree of crystallization calculated by raman spectrophotometry as described above in embodiment 3. When the degree of crystallization is 20% or more, it is defined to be a microcrystalline silicon thin film, and when the degree of crystallization is less than 20%, it is defined to be an amorphous silicon thin film (see FIG. 59).

Moreover, as preprocessing of forming the semiconductor layer 9b on the first insulating film 11, it is preferable to perform plasma processing on the surface of the first insulating film 11. When the plasma processing is performed on the first insulating film 11, the surface of the first insulating film 11 is reformed, and the degree of crystallization of the crystalline silicon formed on the first insulating film 11 can be raised.

The plasma processing of the present embodiment can be performed under conditions such as using $H_2$ gas, setting the gas flow rate to 1000 [SCCM], setting the power density to 0.178 [W/cm$^2$] and setting the pressure to 80 [Pa].

Next, as shown in FIG. 47A and FIG. 47B, the impurity semiconductor layer 9f which is to be the impurity semiconductor film is formed by sputtering or CVD method on the semiconductor layer 9b (second silicon layer 92).

The material used as the impurity semiconductor layer 9f is different according to whether the thin film transistor is a p-type or n-type. In a p-type transistor (p+Si), the layer is formed by forming a film of plasma by mixing an acceptor type impurity such as diborane, etc. in SiH$_4$ gas. In an n-type transistor (n+Si), the layer is formed by forming a film of plasma by mixing a donor type impurity such as arsine, phosphine, etc. in the SiH$_4$ gas.

Figure 48A:
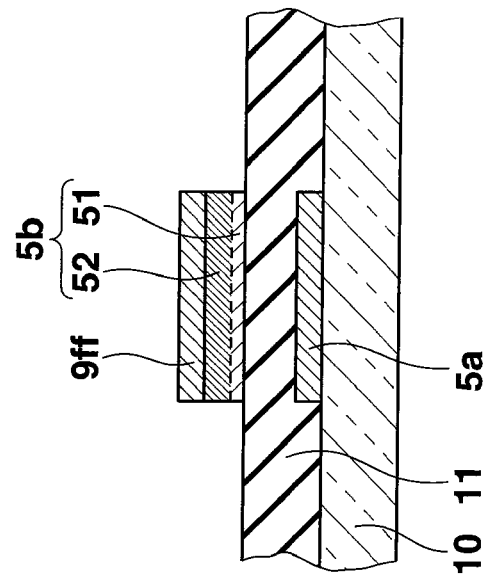
FIG. 48A is an explanatory diagram showing a manufacturing step of a thin film transistor of embodiment 4.
Figure 48B:
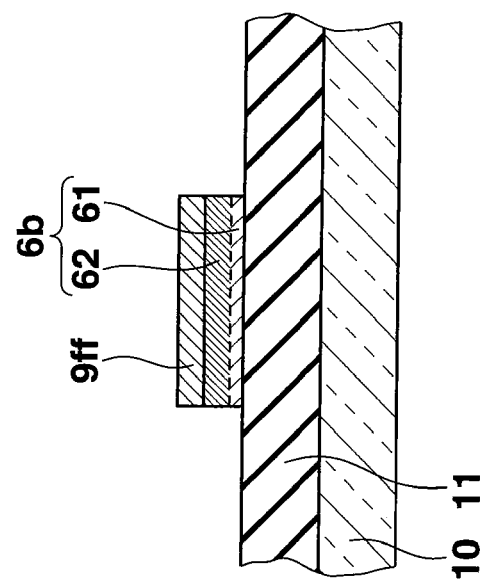
FIG. 48B is an explanatory diagram showing a manufacturing step of a thin film transistor of embodiment 4.

Next, as shown in FIG. 48A and 48B, the semiconductor layer 9b and the impurity semiconductor layer 9f are patterned by photolithography, etching, etc. to form the second semiconductor film 6b including the first portion 61 and the second portion 62 and the impurity semiconductor layer section 9ff provided on the second semiconductor film 6b and the first semiconductor film 5b including the first portion 51 and the second portion 52 and the impurity semiconductor layer section 9ff provided on the first semiconductor film 5b.

Figure 49B:
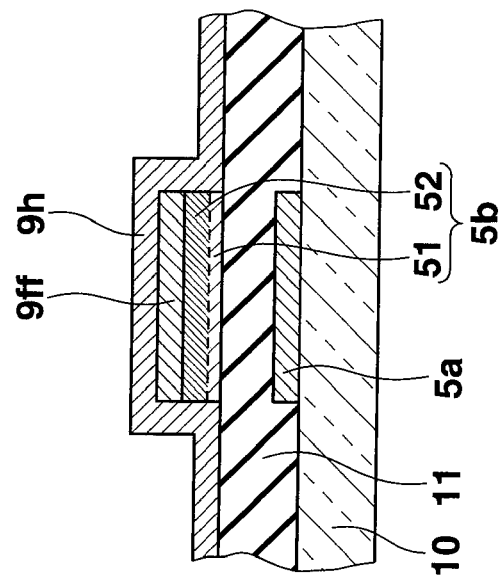
FIG. 49B is an explanatory diagram showing a manufacturing step of a thin film transistor of embodiment 4.
Figure 49A:
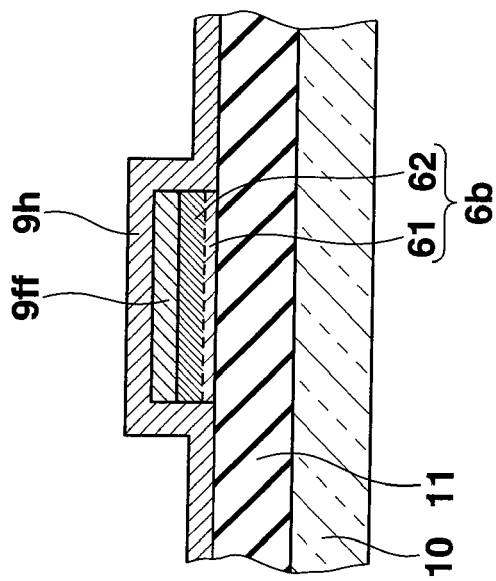
FIG. 49A is an explanatory diagram showing a manufacturing step of a thin film transistor of embodiment 4.

Next, as shown in FIG. 49A and FIG. 49B, the conducting film 9h which is to be the source electrode and the drain electrode is formed by, for example, sputtering on the first insulating film 11 so as to cover the impurity semiconductor layer section 9ff.

Figure 50B:
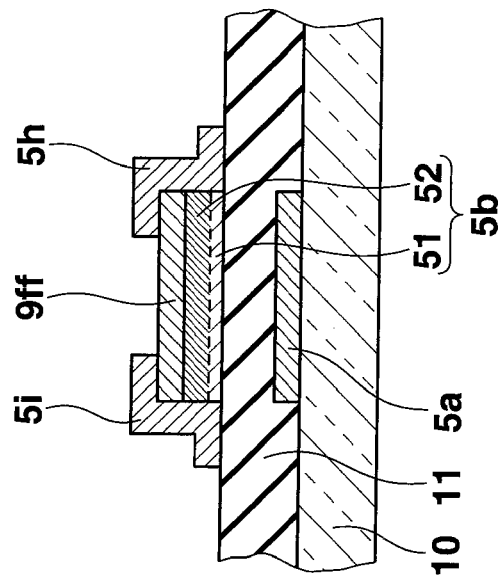
FIG. 50B is an explanatory diagram showing a manufacturing step of a thin film transistor of embodiment 4.
Figure 50A:
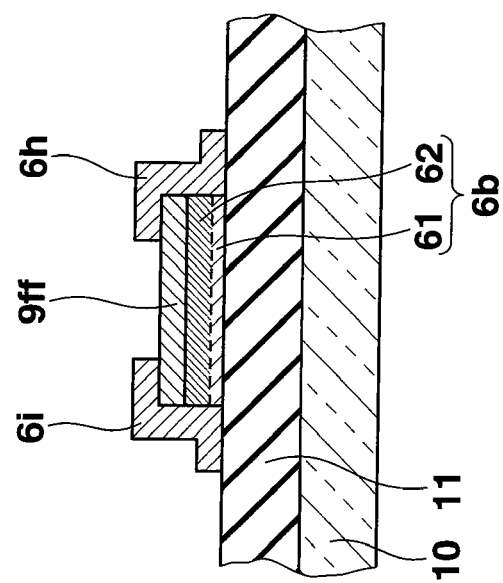
FIG. 50A is an explanatory diagram showing a manufacturing step of a thin film transistor of embodiment 4.

Next, as shown in FIG. 50A and FIG. 50B, the conducting film 9h is patterned by photolithography, etching, etc. and the source electrode 6i and the drain electrode 6h of the driving transistor 60, the source electrode 5i and the drain electrode 5h of the switch transistor 50 are formed. Moreover, the scanning line 2, the voltage supplying line 4, and the electrode 7b of the capacitor 7 are also formed with the source electrode and the drain electrode. (see FIG. 44 to FIG. 46).

Figure 51B:
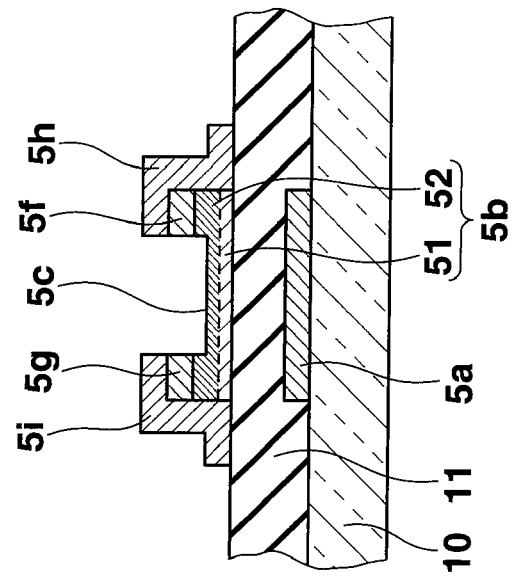
FIG. 51B is an explanatory diagram showing a manufacturing step of a thin film transistor of embodiment 4.
Figure 51A:
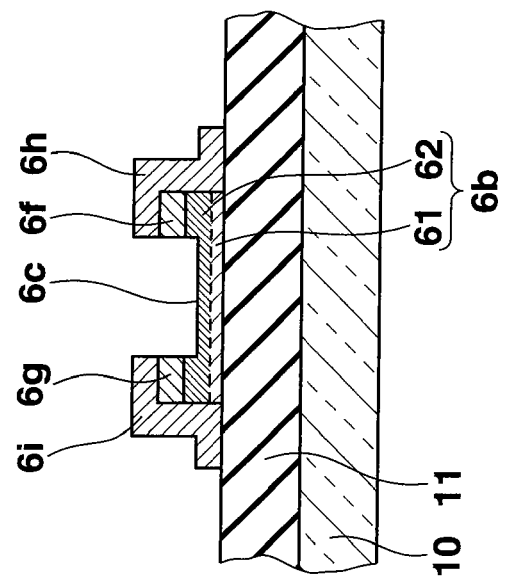
FIG. 51A is an explanatory diagram showing a manufacturing step of a thin film transistor of embodiment 4.

Next, as shown in FIG. 51A and FIG. 51B, the drain electrode 6h and the source electrode 6i are used as a mask and the impurity semiconductor layer section 9ff is patterned by dry etching to form a pair of impurity semiconductor films 6f and 6g. The upper surface of the second semiconductor film 6b is also etched to form the depressed section 6c in the second portion 62 on the upper surface side of the second semiconductor film 6b. Under an etching condition where the depressed section 6c does not reach the first portion 61 of the second semiconductor film 6b, a pair of impurity semiconductor films 6f and 6g is formed together with the depressed section 6c.

Similarly, the drain electrode 5h and the source electrode 5i are used as a mask and the impurity semiconductor layer section 9ff is patterned by dry etching to form a pair of impurity semiconductor films 5f and 5g. The upper surface of the first semiconductor film 5b is also etched to form the depressed section 5c in the second portion 52 on the upper surface side of the first semiconductor film 5b. Under an etching condition where the depressed section 5c does not reach the first portion 51 of the first semiconductor film 5b, a pair of impurity semiconductor films 5f and 5g is formed together with the depressed section 5c.

Specifically, in performing dry etching on the impurity semiconductor layer section 9ff when the depressed section 6c is formed in the second semiconductor film 6b of the driving transistor 60 with a top gate structure, it is preferable to perform etching so as not to exceed half of the thickness of the second portion 62 from the upper surface of the second portion 62 of the second semiconductor film 6b. Even more preferably, the etching is performed to form a depressed section 6c with a depth of one third of the thickness of the second portion 62.

This is because, when etching is performed exceeding half of the thickness of the second portion 62 from the upper surface of the second portion 62 of the second semiconductor film 6b, the depressed section 6c may reach the incubation layer of the second portion 62 or the incubation layer may be included in the electric current path in the second portion 62, and a problem occurs which prevents the rise of the on electric current of the transistor.

Therefore, in order to use the part (upper surface side of the second portion 62) with stable crystallization of silicon in the second portion 62 as the electric current path, it is preferable to not etch the second portion 62 of the second insulating film 6b too deep, and to stop the depth of the depressed section 6c at about half of the thickness of the second portion 62.

Figure 52B:
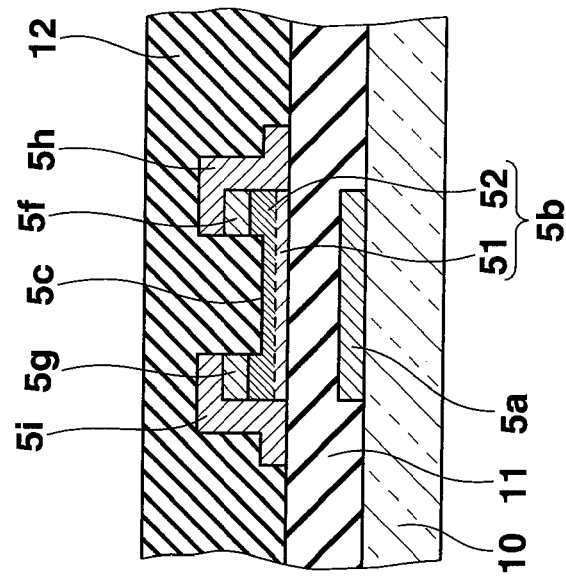
FIG. 52B is an explanatory diagram showing a manufacturing step of a thin film transistor of embodiment 4.
Figure 52A:
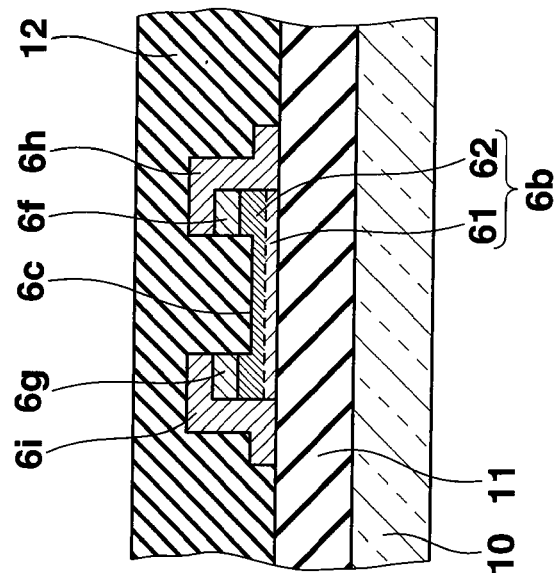
FIG. 52A is an explanatory diagram showing a manufacturing step of a thin film transistor of embodiment 4.

Next, as shown in FIG. 52A and FIG. 52B, the second insulating film 12 which covers the source electrode 6i and the drain electrode 6h of the driving transistor 60 and the source electrode 5i and the drain electrode 5h of the switch transistor 50 is formed.

Before forming the second insulating film 12, the pixel electrode 8a conducted with the source electrode 6i of the driving transistor 60 is formed (see FIG. 45).

Alternatively, a groove to expose the scanning line 2 and the voltage supplying line 4 can be formed in the second insulating film 12.

Next, as shown in FIG. 53A and FIG. 53B, a gate metal layer 9a of, for example, a Cr film, an Al film, a Cr/Al laminated film, an AlTi alloy film or an AlTiNd alloy film, etc. is formed by sputtering, etc. on the second insulating film 12.

Figure 54A:
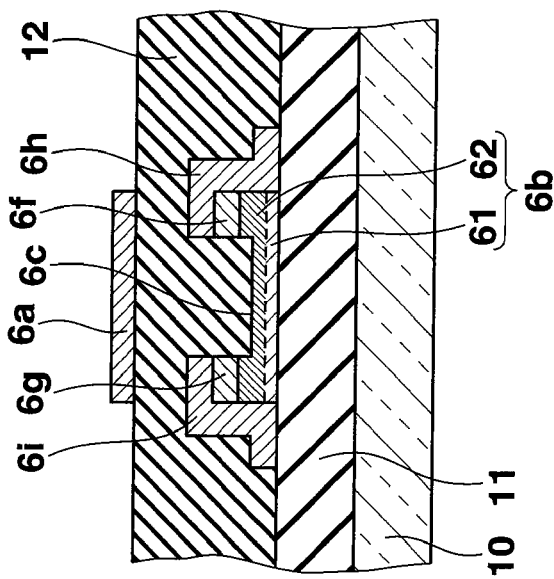
FIG. 54A is an explanatory diagram showing a manufacturing step of a thin film transistor of embodiment 4.
Figure 54B:
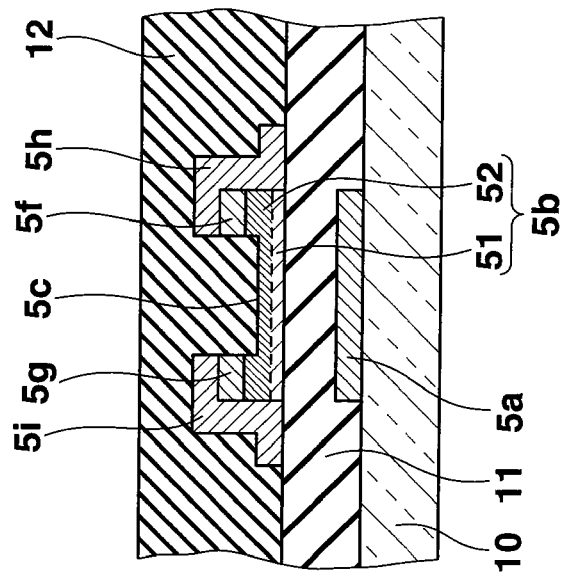
FIG. 54B is an explanatory diagram showing a manufacturing step of a thin film transistor of embodiment 4.

Next, as shown in FIG. 54A and FIG. 54B, the gate metal layer 9a is patterned using photolithography, etching, etc. and the second gate electrode 6a of the driving transistor 60 is formed. The conducting layers 2a and 4a are formed with the second gate electrode 6a (see FIG. 44).

Next, as shown in FIG. 55A and 55B, the passivation film 14 covering the second gate electrode 6a is formed on the second insulating film 12.

With this, the driving transistor 60 and the switch transistor 50 are manufactured.

Moreover, an opening section 12a which exposes the center section of the pixel electrode 8a is formed by patterning the passivation film 14 and the second insulating film 12 using photolithography (see FIG. 45).

Next, after accumulating photosensitive resin such as polyimide, a bank 13 in a shape such as a grid like shape which includes an opening section 13a to expose the pixel electrode 8a is formed by exposing light (see FIG. 45).

Next, a liquid body in which material which is to be the hole injecting layer 8b or the light emitting layer 8c is dissolved or dispersed in a solvent is applied in the opening section 13a of the bank 13, and the liquid body is dried to successively form the hole injecting layer 8b and the light emitting layer 8c which are carrier transport layers (see FIG. 45).

Next, the counter electrode 8d is formed on an entire surface of the bank 13 and the light emitting layer 8c to manufacture the EL element 8 (see FIG. 45) and the EL panel 1 is manufactured.

As described above, when the switch transistor 50 which is the first thin film transistor of the bottom gate structure, and the driving transistor 60 which is the second thin film transistor of the top gate structure are formed, the step to form the first gate electrode 5a of the switch transistor 50 between the substrate 10 and the first insulating film 11 is a different step from the step to form the second gate electrode 6a of the driving transistor 60 between the second insulating film 12 and the passivation film 14, and the other configuration of the thin film transistor can be formed by common steps.

In other words, according to the manufacturing method of manufacturing by common manufacturing steps in the steps other than the step to form the first gate electrode 5a of the switch transistor 50 and the step to form the second gate electrode 6a of the driving transistor 60, the driving transistor 60 and the switch transistor 50 can be formed separately.

According to the manufacturing method of the transistor structure 560 which forms the transistor structure 560 with common manufacturing steps other than the first gate electrode 5a of the switch transistor 50 and the second gate electrode 6a of the driving transistor 60, the number of steps for manufacturing can be reduced and the driving transistor 60 and the switch transistor 50 can be formed separately with fewer steps than conventional methods.

In the first semiconductor film 5b of the switch transistor 50, since the first portion 51 is positioned on the first gate electrode 5a side, the first portion 51 which is the portion in the first semiconductor film 5b including more amorphous silicon is to be the electric current path of the channel, and the switch transistor 50 includes the function corresponding to the thin film transistor including the semiconductor film including amorphous silicon. The switch transistor 50 suitably functions as the thin film transistor which controls the on/off of the driving transistor 60.

In the second semiconductor film 6b of the driving transistor 60, since the second portion 62 is positioned on the second gate electrode 6a side, the second portion 62 which is the portion in the second semiconductor film 6b including more crystalline silicon is to be the electric current path of the channel, and the driving transistor 60 includes the function corresponding to the thin film transistor including the substrate film including crystalline silicon. The driving transistor 60 suitably functions as the thin film transistor to flow electric current in the EL element 8 by control of the switch transistor 50.

As described above, the driving transistor 60 and the switch transistor 50 include different transistor characteristics, and each transistor exhibit each function so that the EL panel 1 can emit light favorably.

The switch transistor 50 and the driving transistor 60 are thin film transistors of the channel etching type including the inversely staggered structure, and the transistors include a structure which does not include a channel protecting film to protect the channels of the first semiconductor film 5b and the second semiconductor film 6b. Therefore, compared to the thin film transistor which is a type including the channel protecting film, the step to form the channel protecting film can be omitted. Consequently, the number of steps of manufacturing is reduced and the manufacturing cost can be reduced.

Since the driving transistor 60 is a top gate structure, and is a structure in which the source electrode 6i and the drain electrode 6h are below the second gate electrode 6a, the electric field from the second gate electrode 6a may be cut by the source electrode 6i and the drain electrode 6h. However, since the driving transistor 60 of embodiment 4 is a thin film transistor of the channel etching type, the electric current path between the source electrode 6i and the drain electrode 6h is the second portion 62 corresponding to the depressed section 6c of the second semiconductor film 6b and is on the interface side between the second insulating film 12 of the second portion 62 and does not flow below the source electrode 6i and the drain electrode 6h. In other words, the electric field from the second gate electrode 6a is cut by the source electrode 6i and the drain electrode 6h and the channel does not occur below the source electrode 6i and the drain electrode 6h. Even if the channel does not occur below the source electrode 6i and the drain electrode 6h, the electric current path between the source electrode 6i and the drain electrode 6h is stable at the depressed section 6c part of the second semiconductor film 6b and the on electric current does not decrease.

Therefore, the driving electric current of the driving transistor 60 is stable and the driving transistor 60 functions suitably. Therefore, the light emission of the EL element 8 can be driven favorably.

Moreover, when the light emission of the EL element 8 is driven, the electric field by the counter electrode 8d which is an electrode common to all pixels may act on the driving transistor 60. However, since the driving transistor 60 is formed with a top gate structure, the second gate electrode 6a blocks the electric field. Since the second electrode 6a blocks the electric field by the counter electrode 8d, the voltage change between the source and the drain by the electric field can be prevented, the driving electric current of the driving transistor 60 reducing can be prevented and the function of the driving transistor 60 as the driving transistor can be maintained.

The EL panel 1 formed and manufactured as described above is used as a display panel in various electronic devices.

Figure 56:
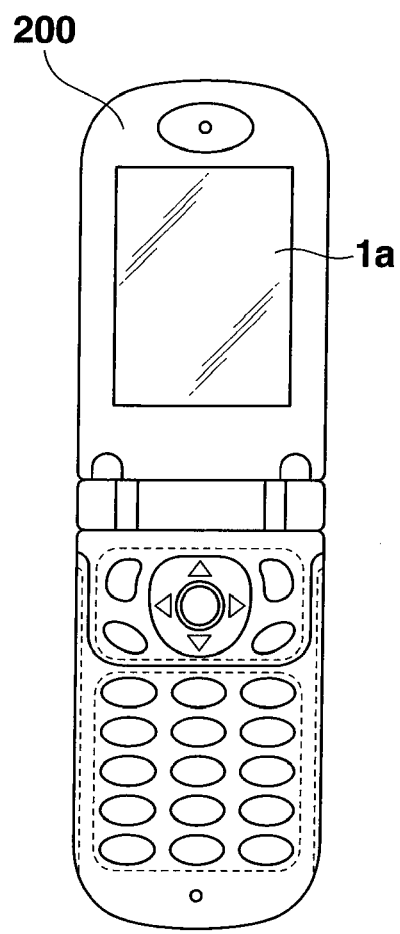
FIG. 56 is a front view showing an example of a cellular phone employing an EL panel as a display panel.
Figure 57A:
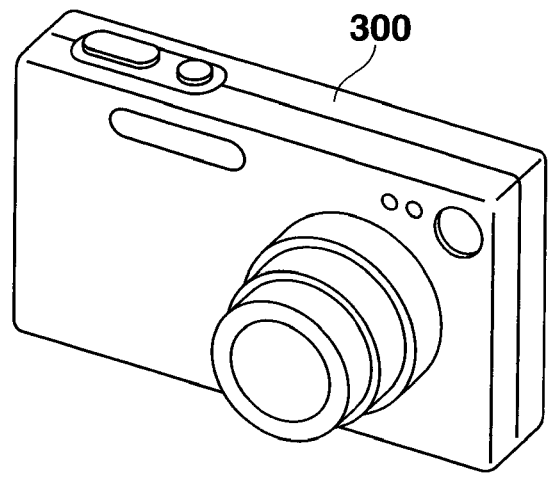
FIG. 57A is a front perspective view showing an example of a digital camera employing an EL panel as a display panel.
Figure 57B:
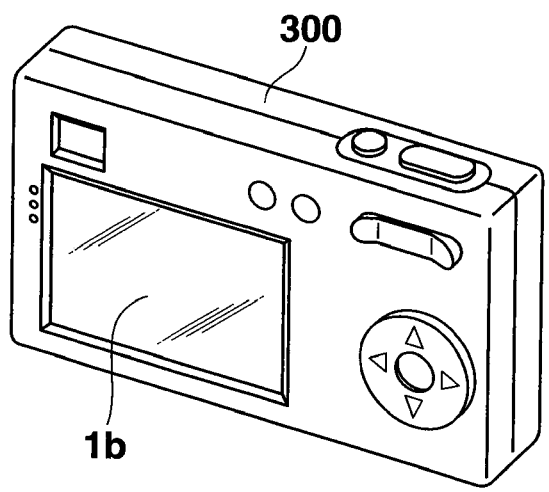
FIG. 57B is a rear perspective view showing an example of a digital camera employing an EL panel as a display panel.
Figure 58:
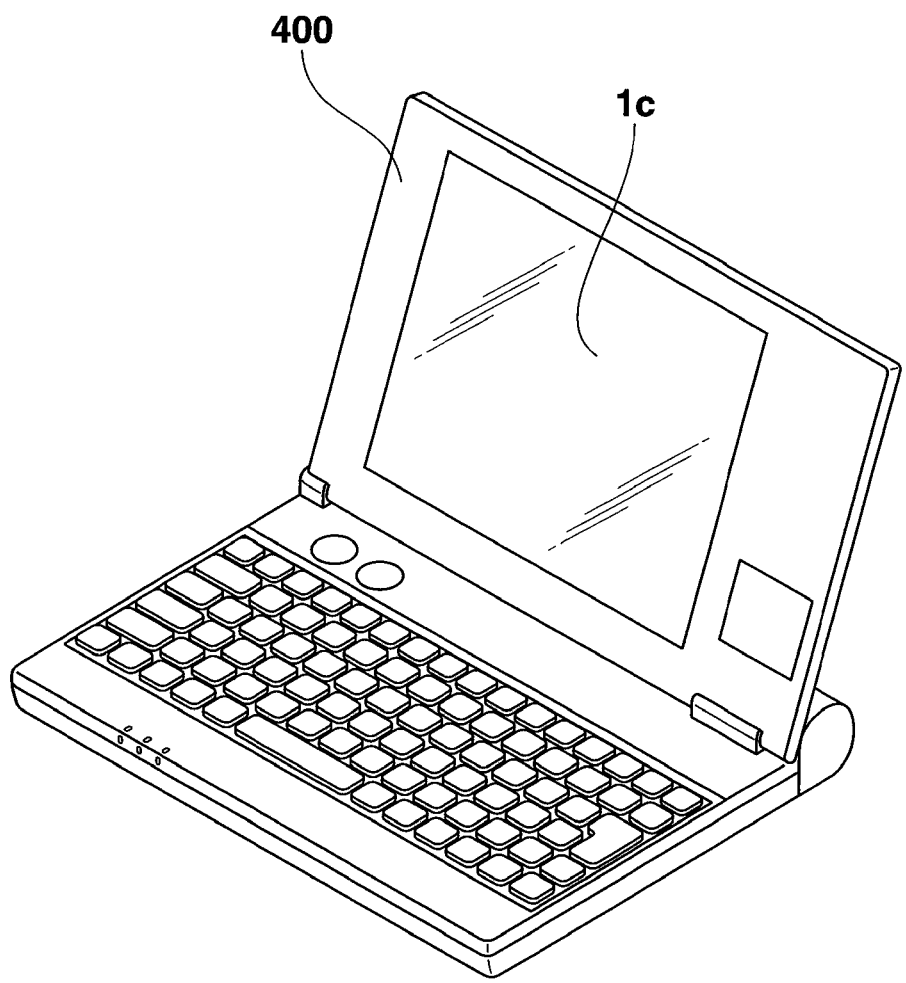
FIG. 58 is a perspective view showing an example of a personal computer employing an EL panel as a display panel.

For example, the EL panel 1 can be used in a display panel 1a of a cellular phone 200 shown in FIG. 56, a display panel 1b of a digital camera 300 shown in FIG. 57A and FIG. 57B and a display panel 1c of a personal computer 400 shown in FIG. 58.

The embodiment of the present invention is not limited to the above and suitable modifications can be made within the scope of the present invention.

Figure 60:
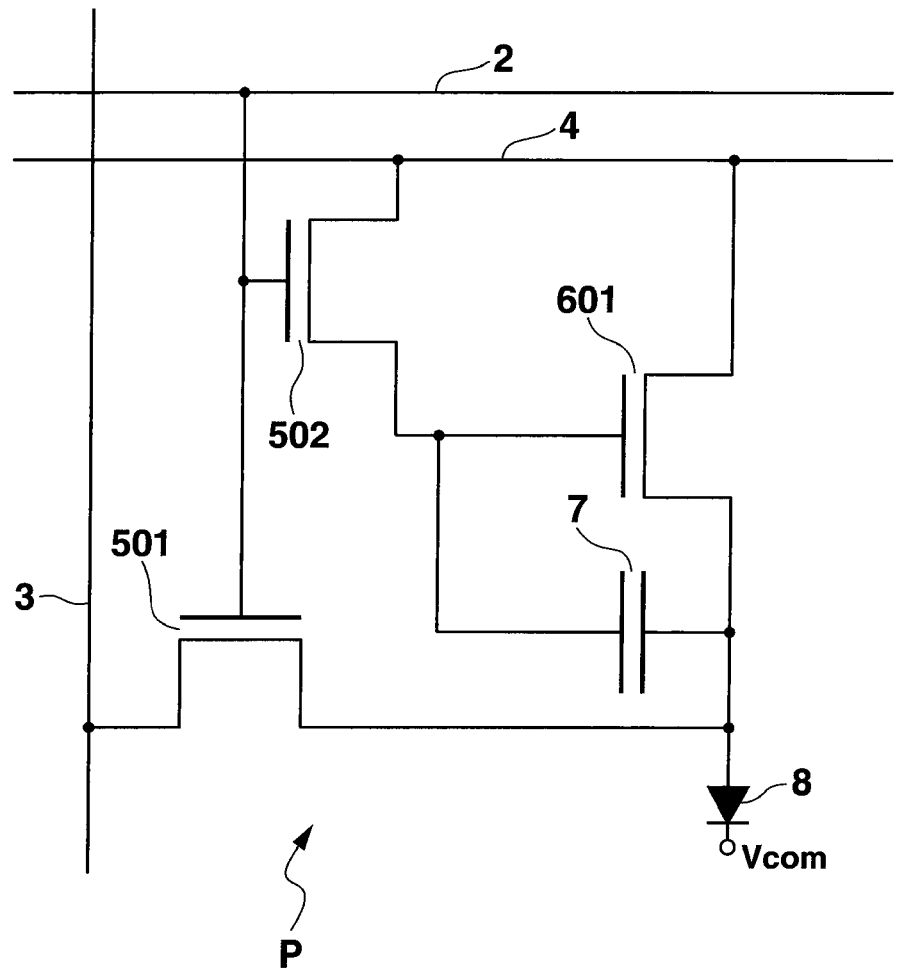
FIG. 60 is a circuit diagram showing another circuit corresponding to one pixel of an EL panel.

In the embodiments described above, each pixel includes two transistors which are the switch transistor and the driving transistor, however, the embodiment is not limited to this, and for example can be a transistor structure as shown in FIG. 60. In this case, the switch transistor 501 and the switch transistor 502 can be the same structure as the above described switch transistor 5 or the switch transistor 50 and the driving transistor 601 can be the same structure as the above described driving transistor 6 or the driving transistor 60.

The entire disclosure of Japanese Patent Application No. 2010-156331 and Japanese Patent Application No. 2010-156338 filed on Jul. 9, 2010 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A transistor structure comprising:
a first thin film transistor including:
   a first gate electrode;
   a first insulating film which covers the first gate electrode; and
   a first semiconductor film which is formed on the first insulating film in a position corresponding to the first gate electrode; and
a second thin film transistor including:
   a second semiconductor film which is formed on the first insulating film;
   a second insulating film which covers the second semiconductor film; and
   a second gate electrode which is formed in a position corresponding to a channel portion of the second semiconductor film on the second insulating film,
wherein the first semiconductor film and the second semiconductor film each include a first portion on a side of the first insulating film and a second portion on an opposite surface side, and either one of the first portion and the second portion has a higher degree of crystallization of silicon compared to the other of the first portion and the second portion.

2. The transistor structure according to claim 1, wherein in the first semiconductor film and the second semiconductor film, each of the other of the first portion and the second portion has a higher rate of an amorphous silicon portion compared to each of said one of the first portion and the second portion.

3. The transistor structure according to claim 1, wherein:
the first portion of the channel portion in the first semiconductor film of the first thin film transistor is an electric current path of the first semiconductor film; and
the second portion of the channel portion in the second semiconductor film of the second thin film transistor is an electric current path of the second semiconductor film.

4. The transistor structure according to claim 1, further comprising:
a voltage supplying line which is connected to at least one of the first thin film transistor and the second thin film transistor; and
a conducting layer which is formed on the voltage supplying line from a same material as the second gate electrode.

5. The transistor structure according to claim 1, wherein:
the first thin film transistor further includes a source electrode and a drain electrode each provided between the first semiconductor film and the second insulating film; and
the second thin film transistor further includes a source electrode and a drain electrode each provided between the second semiconductor film and the second insulating film.

6. A light emitting apparatus comprising:
a first thin film transistor including:
   a first gate electrode;
   a first insulating film which covers the first gate electrode; and
   a first semiconductor film which is formed on the first insulating film in a position corresponding to the first gate electrode;
a second thin film transistor including:
   a second semiconductor film which is formed on the first insulating film;
   a second insulating film which covers the second semiconductor film; and
   a second gate electrode which is formed in a position corresponding to a channel portion of the second semiconductor film on the second insulating film; and
a light emitting element which emits light according to control by the first thin film transistor and the second thin film transistor,
wherein the first semiconductor film and the second semiconductor film each include a first portion on a side of the first insulating film and a second portion on an opposite surface side, and either one of the first portion and the second portion has a higher degree of crystallization of silicon compared to the other of the first portion and the second portion.

7. The light emitting apparatus according to claim 6, wherein in the first semiconductor film and the second semiconductor film, each of the other of the first portion and the second portion has a higher rate of an amorphous silicon portion compared to each of said one of the first portion and the second portion.

8. The light emitting apparatus according to claim 6, wherein:
the first portion of the channel portion in the first semiconductor film of the first thin film transistor is an electric current path of the first semiconductor film; and
the second portion of the channel portion in the second semiconductor film of the second thin film transistor is an electric current path of the second semiconductor film.

9. The light emitting apparatus according to claim 6, wherein among the first thin film transistor and the second thin film transistor, a transistor in which said one of the first portion and the second portion with a relatively higher degree of crystallization is positioned on a side of the gate electrode and the other of the first portion and the second portion with a relatively lower degree of crystallization is positioned on a side opposite from the gate electrode is a driving transistor to flow electric current to the light emitting element.

10. The light emitting apparatus according to claim 6, wherein among the first thin film transistor and the second thin film transistor, a transistor in which said one of the first portion and the second portion with a relatively higher degree of crystallization is positioned on a side opposite from the gate electrode and the other of the first portion and the second portion with a relatively lower degree of crystallization is positioned on a side of the gate electrode is a switch transistor.

11. The light emitting apparatus according to claim 6, further comprising:
a voltage supplying line which is connected to at least one of the first thin film transistor and the second thin film transistor; and
a conducting layer which is formed on the voltage supplying line from a same material as the second gate electrode.

12. The light emitting apparatus according to claim 6, wherein:
the first thin film transistor further includes a source electrode and a drain electrode each provided between the first semiconductor film and the second insulating film; and
the second thin film transistor further includes a source electrode and a drain electrode each provided between the second semiconductor film and the second insulating film.

13. A transistor structure comprising:
a first thin film transistor including:
  a first gate electrode;
  a first insulating film which covers the first gate electrode; and
  a first semiconductor film which is formed on the first insulating film and which includes a depressed section corresponding to at least a part of the first gate electrode; and
a second thin film transistor including:
  a second semiconductor film which is provided on the first insulating film;
  a second insulating film which covers the second semiconductor film; and
  a second gate electrode which is provided above an upper section of the second semiconductor film through the second insulating film,
wherein the second semiconductor film includes a depressed section corresponding to at least a part of the second gate electrode,
wherein the first semiconductor film and the second semiconductor film each include a first portion on a side of the first insulating film and a second portion on an opposite surface side formed with the depressed section, and either one of the first portion and the second portion has a higher degree of crystallization of silicon compared to the other of the first portion and the second portion.

14. The transistor structure according to claim 13, wherein in each of the first semiconductor film and the second semiconductor film, a rate of an amorphous silicon portion of the other of the first portion and the second portion is higher than a rate of an amorphous silicon portion in said one of the first portion or the second portion.

15. The transistor structure according to claim 13, wherein:
the first thin film transistor includes a first source electrode and a first drain electrode each electrically connected to at least a portion other than the depressed section of the first semiconductor film through an impurity semiconductor film respectively; and
the second thin film transistor includes a second source electrode and a second drain electrode each electrically connected to at least a portion other than the depressed section of the second semiconductor film through an impurity semiconductor film respectively.

16. The transistor structure according to claim 13, wherein:
in the first thin film transistor, the first portion in the first semiconductor film is an electric current path between the first source electrode and the first drain electrode; and
in the second thin film transistor, the second portion in the second semiconductor film is an electric current path between the second source electrode and the second drain electrode.

17. A light emitting apparatus comprising:
a first thin film transistor including:
  a first gate electrode;
  a first insulating film which covers the first gate electrode; and
  a first semiconductor film which is formed on the first insulating film and which includes a depressed section corresponding to at least a part of the first gate electrode; and
a second thin film transistor including:
  a second semiconductor film which is provided on the first insulating film;
  a second insulating film which covers the second semiconductor film; and
  a second gate electrode which is provided above an upper section of the second semiconductor film through the second insulating film, wherein the second semiconductor film includes a depressed section corresponding to at least a part of the second gate electrode; and
a light emitting element which emits light according to control by the first thin film transistor and the second thin film transistor,
wherein the first semiconductor film and the second semiconductor film each include a first portion on a side of the first insulating film and a second portion on an opposite surface side formed with the depressed section, and either one of the first portion and the second portion has a higher degree of crystallization of silicon compared to the other of the first portion and the second portion.

18. The light emitting apparatus according to claim 17, wherein in each of the first semiconductor film and the second semiconductor film, a rate of an amorphous silicon portion of the other of the first portion and the second portion is higher than a rate of an amorphous silicon portion in said one of the first portion and the second portion.

19. The light emitting apparatus according to claim 17, wherein:
the first thin film transistor includes a first source electrode and a first drain electrode each electrically connected to at least a portion other than the depressed section of the first semiconductor film through an impurity semiconductor film respectively; and
the second thin film transistor includes a second source electrode and a second drain electrode each electrically connected to at least a portion other than the depressed section of the second semiconductor film through an impurity semiconductor film respectively.

20. The light emitting apparatus according to claim 17, wherein:
in the first thin film transistor, the first portion in the first semiconductor film is an electric current path between the first source electrode and the first drain electrode; and
in the second thin film transistor, the second portion in the second semiconductor film is an electric current path between the second source electrode and the second drain electrode.

21. The light emitting apparatus according to claim 17, wherein:
the degree of crystallization of silicon of the first portion is formed higher than the second portion;
the second thin film transistor is a switch transistor which controls transmission of a signal to the first thin film transistor; and
the first thin film transistor is a driving transistor which flows an electric current to the light emitting element according to control by the second thin film transistor.

22. The light emitting apparatus according to claim 17, wherein:
the degree of crystallization of silicon of the second portion is formed higher than the first portion;
the first thin film transistor is a switch transistor which controls transmission of a signal to the second thin film transistor; and
the second thin film transistor is a driving transistor which flows an electric current to the light emitting element according to control by the first thin film transistor.

* * * * *